United States Patent
Sumita et al.

(10) Patent No.: US 7,138,851 B2
(45) Date of Patent: Nov. 21, 2006

(54) SEMICONDUCTOR INTEGRATED CIRCUIT APPARATUS

(75) Inventors: Masaya Sumita, Hyougo (JP); Shirou Sakiyama, Kyoto (JP); Masayoshi Kinoshita, Oosaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 10/689,554

(22) Filed: Oct. 21, 2003

(65) Prior Publication Data

US 2004/0135621 A1    Jul. 15, 2004

(30) Foreign Application Priority Data

Oct. 21, 2002 (JP) ............... P. 2002-306138
Oct. 20, 2003 (JP) ............... P. 2003-358891

(51) Int. Cl.
H03K 3/01 (2006.01)

(52) U.S. Cl. ..................... 327/534; 327/332

(58) Field of Classification Search ............ 327/18, 327/309, 315, 318, 331, 332, 534
See application file for complete search history.

(56) References Cited

U.S. PATENT DOCUMENTS

| 5,682,118 A * | 10/1997 | Kaenel et al. ............ 327/534 |
| 6,366,156 B1 | 4/2002 | Narendra et al. |
| 6,518,827 B1 * | 2/2003 | Fifield et al. ............ 327/534 |
| 6,556,068 B1 | 4/2003 | Forbes et al. |
| 6,753,719 B1 * | 6/2004 | Bhagavatheeswaran et al. . 327/534 |

FOREIGN PATENT DOCUMENTS

| JP | 3-184265 | 8/1991 |
| JP | 3105512 | 9/2000 |

* cited by examiner

*Primary Examiner*—Kenneth B. Wells
(74) *Attorney, Agent, or Firm*—McDermott Will & Emery LLP

(57) ABSTRACT

Providing semiconductor integrated circuit apparatus capable of controlling the substrate voltage of a MOSFET so that the drain current for an arbitrary gate voltage value in a subthreshold region or a saturated region will be free from temperature dependence and process variation dependence, thereby enhancing the stable operation.

17 Claims, 33 Drawing Sheets

SEMICONDUCTOR INTEGRATED CIRCUIT APPARATUS

BACKGROUND OF THE INVENTION

1. Field of the Invention

The present invention relates to semiconductor integrated circuit apparatus, and in particular to semiconductor integrated circuit apparatus which is capable of controlling a substrate voltage under the low source voltage driving of a miniaturized MOSFET.

2. Description of the Related Art

In recent years, with the advancement of a miniaturization process concerning the fabrication of semiconductor integrated circuit apparatus, the channel length of a MOSFET has come to be fabricated on the order of 0.1 μm or lower. With such process miniaturization, a low voltage of 1 V or less has come to be used as a source voltage and the following reports have been made.

It is reported that, in the environment of a source voltage of 1 V or less, the threshold value and the voltage value of MOSFET are not scaled and the operation speed of a CMOS circuit is inverted in state of low temperatures and high temperatures (refer to Kouichi Kanda and three others, "Design Impact of Positive Temperature Dependence on Drain Current in Sub-1V CMOS VLSIs", October 2001, IEEE Journal of Solid-State Circuits, vol.36, No.10, p.1559–1564).

It is reported that, for an SRAM as an example of semiconductor integrated circuit apparatus, miniaturization lowers the noise margin thus impairing the stabilized read/write operation from/to the memory cell (refer to Takakuni Douseki and one other Static-Noise Margin Analysis for a Scaled-Down CMOS Memory Cell, Journal of IEICE vol. J75-C-2 No.7, pp.350–361, July 1992. (In Japanese)).

As a technique to lower the minimum operating voltage under the low source voltage, there is a method for controlling a balance between the source-drain currents of p-type and n-type MOSFETs by way of a substrate bias (refer to Goichi Ono and one other, "Threshold-voltage balance for Minimum Supply Operation", 2002 IEEE, 2002 Symposium on VLSI Circuit Digest of Technical Papers).

In the aforementioned method (described in Goichi Ono and one other, "Threshold-voltage balance for Minimum Supply Operation"), the delay of an predetermined critical path and a clock cycle is compared, the substrate bias of p-type and n-type MOSFETs is controlled, and the input and output of an inverter comprising a p-type MOSFET and an n-type MOSFET is shorted. With this method, the voltage value of the inverter is compared with the arbitrarily set voltage value of a voltage monitor and correction to offset process variations in the MOSFET so as to stabilize operation with a predetermined voltage.

However, the related art technologies as disclosed in Goichi Ono and one other, "Threshold-voltage balance for Minimum Supply Operation", 2002 IEEE, 2002 Symposium on VLSI Circuit Digest of Technical Papers do not consider the fact that, in the environment of a source voltage of 1 V or less, the operation speed of a CMOS circuit is inverted at low temperatures and high temperatures described in Kouichi Kanda and three others, "Design Impact of Positive Temperature Dependence on Drain Current in Sub-1V CMOS VLSIs", October 2001, IEEE Journal of Solid-State Circuits, vol.36, No.10, p.1559–1564 and thus cannot control the substrate voltage of MOSFET to avoid temperature dependence.

The related art low voltage technology (refer to FIG. 9 P/N Vt matching scheme in Goichi Ono and one other, "Threshold-voltage balance for Minimum Supply Operation", 2002 IEEE, 2002 Symposium on VLSI Circuit Digest of Technical Papers) regulates the Ids of an n-type MOSFET based on a p-type MOSFET, so that it cannot set a sub-threshold leakage current or a saturation current to an optimum value.

In other words, according to this method, in semiconductor integrated circuit apparatus incorporating a large-scale memory, stability of operation cannot be enhanced in case the leakage current in the memory reaches several tens to several hundreds of that in other logic circuits.

Or, the method cannot assure the characteristics of the output range of an analog operational amplifier. In circuits such as a dynamic circuit and a domino amplifier as a ore-charged amplifier often used in the timing borrow system, the noise margin is determined by the threshold value of the MOSFET so that it is impossible to supply an optimum threshold value to stabilize the circuit operation.

Assume a configuration where another "scheme" to perform substrate control of a p-type MOSFET is implemented on top of an n-type MOSFET in the same system as Goichi Ono and one other, "Threshold-voltage balance for Minimum Supply Operation", 2002 IEEE, 2002 Symposium on VLSI Circuit Digest of Technical Papers (see FIG. 9). Assume that semiconductor integrated circuit apparatus whose Ids of the p-type MOSFET is high and the Ids of the n-type MOSFET is low has been fabricate due to process variations.

In this case, the Ids of the p-type MOSFET is high so that the Ids of the n-type MOSFET is low in Goichi Ono and one other, "Threshold-voltage balance for Minimum Supply Operation", 2002 IEEE, 2002 Symposium on VLSI Circuit Digest of Technical Papers (see FIG. 9). The Ids of the n-type MOSFET is low so that substrate control of the p-type MOSFET is made to decrease the Ids of the p-type MOSFET.

Use of the above system produces a MOSFET having the characteristics opposite to the process variations. In other words, the Ids of the p-type MOSFET is controlled low and the Ids of the n-type MOSFET is controlled high. In this way, even when there are separate circuits which are based on n-type and p-type MOSFETs, it is impossible to optimize the Ids of the p-type and n-type MOSFETs.

The technology of Goichi Ono and one other, "Threshold-voltage balance for Minimum Supply Operation", 2002 IEEE, 2002 Symposium on VLSI Circuit Digest of Technical Papers (see FIG. 11, SA-Vt CMOS system) is a control method dependent on the delay in a predetermined critical path. This makes it necessary to physically arrange a dummy path circuit corresponding to the predetermined critical path, which increases the area of the semiconductor integrated circuit apparatus.

The technology of the aforesaid non-patent document 3 provides the method for controlling a substrate bias of MOSFET using the delay in the critical path. With such a method, however, in MOSFET devices different in substrate bias dependence within the critical path, such e.g. as devices different in gate oxide thickness or devices different in gate oxide film dielectric constant, in order to match circuit delays with each other, a different substrate voltage cannot be applied to each device different in substrate bias dependence.

In case a large number of critical paths are present under each of the process conditions, temperature conditions and voltage conditions in the semiconductor integrated circuit apparatus and the corresponding logic generator circuits differ from each other, it is necessary to physically arrange a large number of dummy path circuits corresponding to the large number of critical paths, which further increases the area of the semiconductor integrated circuit apparatus.

When a large substrate voltage is applied, the transistor characteristics show the opposite of the regular behavior. On the forward bias side, an excessive forward voltage applied shows bipolar characteristics thus allowing a forward current to flow between the substrate and the drain. The drain-source current is amplified by the substrate voltage. This invalidates the current control across the drain and the source by a gate current.

On the back bias side, an excessive back bias applied generates a GIDL (Gate-Induced Drain Leakage) effect which is an increase in the subthreshold current. In this way, applying an excessive substrate bias inverts the transistor characteristics, causing deadlock to be applied, not feedback.

The bipolar effect is described for example in Tzuen-His Huang et al., "Base Current Reversal Phenomenon in a CMOS Compatible High Gain n-p-n gated Bipolar Transistor", February 1995, IEEE TRANSACTIONS ON ELECTRON DEVICES, VOL.42, NO.2, P321. The GIDL effect is described for example in Hiroyuki Mizuno and seven others, "An 18-µA Standby Current 1.8-V, 200 MHz Microprocessor with Self-Substrate-Biased Data-Retention Mode", NOVEMBER 1999, IEEE JOURNAL OF SOLID-STATE CIRCUITS, VOL.34, NO.11, p.1392–1500.

SUMMARY OF THE INVENTION

The invention has been accomplished in view of the aforementioned circumstances and aims at providing semiconductor integrated circuit apparatus capable of controlling the substrate voltage of a MOSFET so that the drain current of the MOSFET, in particular the drain current for an arbitrary gate voltage value in a subthreshold region or a saturated region will be free from temperature dependence and process variation dependence, thereby enhancing the stable operation.

In order to attain the object, the first aspect of the invention is semiconductor integrated circuit apparatus characterized by comprising: an integrated circuit main body including a plurality of MOSFETs on a semiconductor substrate; monitor means for monitoring at least one of the drain currents of the plurality of MOSFETs; and substrate voltage regulating means for controlling the substrate voltage of the semiconductor substrate so as to keep constant the drain current.

With this configuration, the monitor means monitors the drain current of the MOSFETs, and in accordance with the monitored current value, the substrate voltage regulating means regulates the substrate voltage to regulate the drain voltage of the plurality of MOSFETs in the integrated circuit main body. This regulation reduces the temperature dependence of a drain current in case there occurred a variation in the temperature of the semiconductor integrated circuit apparatus and reduces variations in the characteristics of the semiconductor integrated circuit apparatus created by a fabrication process (process variation dependence). This enhances the stable operation of the semiconductor integrated circuit apparatus.

The second aspect of the invention is semiconductor integrated circuit apparatus characterized by comprising a plurality of the substrate voltage regulating means.

With this configuration, when circuits and devices having different characteristics are present within the semiconductor integrated circuit, or the like, the plurality of substrate voltage regulating means can be regulated to a substrate voltage suitable for the individual circuits and devices.

The third aspect of the invention is semiconductor integrated circuit apparatus characterized by having first substrate voltage regulating means for regulating a substrate potential so that the individual threshold values of the plurality of MOSFETs become uniform, and second substrate voltage regulating means for regulating a substrate potential so that the individual drain currents of the plurality of MOSFETs are constant, and in that the first substrate voltage current regulating means is used for substrate voltage regulation of a portion of the semiconductor integrated circuit main body in which portion a noise margin is lower than a predetermined value, and that the second substrate voltage current regulating means is used for substrate voltage regulation of a portion of the semiconductor integrated circuit main body in which portion a noise margin is higher than the predetermined value.

With this configuration, it is possible to realize stable circuit operation and furthermore to prevent reversion of temperature dependence of delay time under a low voltage. Thus, it is possible to reduce a leakage current under high temperature. Besides, it is possible to increase circuit speed and furthermore to prevent reversion of temperature dependence of delay time under a low voltage. Thus, it is possible to reduce a leakage current under high temperature.

The fourth aspect of the invention is semiconductor integrated circuit apparatus characterized in that the interior of the integrated circuit main body is divided into a plurality of regions, and substrate voltage regulating means for regulating the substrate voltage of a MOSFET within the region is connected to the inside or vicinity of each of the regions.

With this configuration, it is possible to apply to each region a substrate voltage for obtaining an appropriate threshold value and saturation current when the device characteristics of MOSFETs within the semiconductor integrated circuit have local dependence. Thus, it is possible to reduce variations in circuit characteristics within the semiconductor integrated circuit.

The fifth aspect of the invention is semiconductor integrated circuit apparatus characterized in that MOSFETs different in device characteristics for a substrate voltage are mounted together within the integrated circuit main body, and the same substrate voltage regulating means is connected to MOSFET groups substantially identical in the device characteristics to each other.

With this configuration, it is possible to apply an appropriate substrate voltage, without deteriorating a circuit noise margin, to each of MOSFET groups different in device characteristics for a substrate voltage.

The sixth aspect of the invention is semiconductor integrated circuit apparatus characterized in that the drain current is a drain current for an arbitrary gate voltage value in a subthreshold region or a saturated region.

With this configuration, it is possible to regulate to an optimum value the drain current in the subthreshold region or saturated region of a plurality of MOSFETs in the integrated circuit main body by monitoring, on monitoring means, the drain current for an arbitrary gate voltage value in the subthreshold region or saturated region of the MOSFETs.

This regulation reduces the temperature dependence of a drain current in case there occurred a variation in the temperature of semiconductor integrated circuit apparatus and reduces variations in the characteristics of the individual semiconductor integrated circuit apparatus created by a fabrication process (process variation dependence). This enhances the stable operation of the semiconductor integrated circuit apparatus.

The seventh aspect of the invention is semiconductor integrated circuit apparatus characterized in that the gm of the transistor is kept constant by the substrate voltage regulating means.

With this configuration, it is possible to provide a circuit generating gm in the neighborhood of a predetermined voltage value thus keeping constant the gm of the transistor so that the temperature dependence and process variation dependence of the semiconductor integrated circuit apparatus will be eliminated.

The eighth aspect of the invention is semiconductor integrated circuit apparatus characterized in that the monitor means comprises a constant current source and a monitoring MOSFET formed on the same substrate as the plurality of MOSFETs, that the substrate voltage regulating means comprises comparison means for comparing the source potential of the monitoring MOSFET with a predetermined reference potential with the drain terminal of the monitoring MOSFET and the drain terminals of the plurality of MOSFETs connected to the ground potential, and that the substrate voltage regulating means feeds back the output voltage output based on the comparison result by the comparison means to the substrate voltage of the monitoring MOSFET.

With this configuration, the monitor means comprising a constant current source and a monitoring MOSFET monitors the drain current of the MOSFET. The substrate voltage regulating means compares the source potential of the monitoring MOSFET determined in accordance with the monitored current value with a predetermined reference potential by way of comparison means and outputs the output voltage according to the comparison result, and feeds back the output voltage to the substrate voltage of the monitoring MOSFET, thereby keeping constant the threshold value (Vth) or drain current (Ids) of each of the plurality of MOSFETs arranged on the integrated circuit main body. In this way, the threshold value (Vth) or drain current (Ids) of each of the MOSFETs is kept constant so that the drain current of the plurality of MOSFETs on the integrated circuit main body is regulated to an optimum value.

This regulation reduces the temperature dependence of a drain current in case there occurred a variation in the temperature of the semiconductor integrated circuit apparatus and reduces variations in the characteristics of the semiconductor integrated circuit apparatus created by a fabrication process (process variation dependence).

The ninth aspect of the invention is semiconductor integrated circuit apparatus characterized in that the reference potential is a supply potential to the integrated circuit main body.

With this configuration, it is possible to keep constant the threshold value (Vth) or drain current (Ids) of each of the plurality of MOSFETs arranged on the integrated circuit main body, by comparing, on comparison means, the source potential or ground potential as a supply potential to the integrated circuit main body with the source potential of the monitoring MOSFET and outputting the output voltage according to the comparison result, and feeding back the output voltage to the substrate voltage of the monitoring MOSFET. In this way, the threshold value (Vth) or drain current (Ids) of each of the MOSFETs is kept constant so that the drain current of the plurality of MOSFETs on the integrated circuit main body is regulated to an optimum value.

This regulation reduces the temperature dependence of a drain current in case there occurred a variation in the temperature of the semiconductor integrated circuit apparatus and reduces variations in the characteristics of individual semiconductor integrated circuit apparatus created by a fabrication process (process variation dependence).

The tenth aspect of the invention is semiconductor integrated circuit apparatus characterized in that the substrate voltage regulating means outputs a voltage value obtained by providing, by way of limiting means, the upper and lower limits of the output voltage output based on the comparison result of the comparison means.

With this configuration, the output which is based n the comparison result of the comparison means is limited within a predetermined value range by way of the limiting means. Thus it is possible to provide the upper and lower limits of the substrate voltage output from the substrate voltage regulating means, thereby preventing a so-called "deadlock", a phenomenon where an appropriate feedback is not applied to the substrate voltage of the monitoring MOSFET thus stabilizing the substrate voltage regulating means in an abnormal state.

The eleventh aspect of the invention is semiconductor integrated circuit apparatus characterized in that the monitoring MOSFET is a p-type monitoring MOSFET, that the upper limit of the output voltage value of the substrate voltage regulating means is set to a voltage equal to or above the supply potential of the integrated circuit main body and within a range where the GIDL effect does not occur in the p-type monitoring MOSFET, and that the lower limit of the output voltage value of the substrate voltage regulating means is set to a voltage below the supply potential of the integrated circuit main body and within a range where the p-type monitoring MOSFET does not show the bipolar characteristics.

With this configuration, it is possible to prevent the GIDL effect where the transistor characteristics are opposite to the regular characteristics as well as the bipolar characteristics where a forward current flows between the substrate and the drain thus reducing the drain-source current, in case a large amount of substrate voltage is applied.

The twelfth aspect of the invention is semiconductor integrated circuit apparatus characterized in that the monitoring MOSFET is an n-type monitoring MOSFET, that the upper limit of the output voltage value of the substrate voltage regulating means is set to a voltage equal to or above the ground potential of the integrated circuit main body and within a range where the n-type monitoring MOSFET does not show the bipolar characteristics, and that the lower limit of the output voltage value of the substrate voltage regulating means is set to a voltage below the ground potential of the integrated circuit main body and within a range where the GIDL effect does not occur in the n-type monitoring MOSFET.

With this configuration, it is possible to prevent the GIDL effect where the transistor characteristics are opposite to the regular characteristics as well as the bipolar characteristics where a forward current flows between the substrate and the drain thus reducing the drain-source current, in case a large amount of substrate voltage is applied.

The thirteenth aspect of the invention is semiconductor integrated circuit apparatus characterized in that the output of the limiting means is connected to voltage supply means for supplying a source voltage to the integrated circuit main body, and by being configured such that the source voltage is raised when a substrate voltage is an upper limit voltage or more and the source voltage is lowered when the substrate voltage is a lower limit voltage or less.

With this configuration, the source voltage supplied to the integrated circuit main body can be made variable. Thus, it is possible to further secure the improvement in the threshold value characteristics, saturation current characteristics, and gm characteristics of MOSFET by the substrate voltage regulating means.

The fourteenth aspect of the invention is semiconductor integrated circuit apparatus characterized in that the constant current source has a leakage current canceling MOSFET substantially identical in transistor size to the monitoring MOSFET, that when the leakage current canceling MOSFET is an n-type MOSFET, a source-drain current provided when the gate and drain of the n-type MOSFET have substantially the same potential is added, and that when the leakage current canceling MOSFET is a p-type MOSFET, a source-drain current provided when the gate and drain of the p-type MOSFET have substantially the same potential is added.

With this configuration, the leakage component of a parasitic bipolar or GIDL effect can be cancelled. Thus, it is possible to apply a substrate voltage capable of securing the original threshold value and saturation current of the MOSFET of the monitor means.

The fifteenth aspect of the invention is semiconductor integrated circuit apparatus characterized in that a well region that provides the substrate of the leakage current canceling MOSFET is separated from a well region that provides the substrate of the monitoring MOSFET.

With this configuration, it is possible to eliminate the leakage current component caused by the parasitic bipolar effect between the MOSFET of the monitor means and the leakage current canceling MOSFET. Thus, it is possible to apply a substrate voltage capable of securing the original threshold value and saturation current of the MOSFET of the monitor means.

The sixteenth aspect of the invention is semiconductor integrated circuit apparatus characterized by having substrate voltage regulating means for regulating a substrate potential so that the individual threshold values of the plurality of MOSFETs become uniform, and in that a voltage is applied to the gate of the monitoring MOSFET as the voltage value is changed in accordance with temperature so as to provide a more gradual gradient than the temperature gradient of the threshold values formed when a voltage applied to the gate is set to be constant.

With this configuration, the gain of the integrated circuit main body due to a reduction in junction capacity of MOSFET can be made lower than when the gate voltage of the monitoring MOSFET of the substrate voltage regulating means is constant. Besides, variations in threshold value of individual MOSFETs within the integrated circuit main body can be suppressed even when the temperature is changed.

The seventeenth aspect of the invention is semiconductor integrated circuit apparatus characterized by having frequency-voltage conversion means, and by being configured such that a signal originating from a clock supplied to the integrated circuit main body is inputted to the frequency-voltage conversion means, that the frequency of the signal is converted into a voltage by the frequency-voltage conversion means, and that the voltage is applied to the gate of a MOSFET constituting the monitor means.

With this configuration, the threshold value regulated by a circuit generating a constant threshold value (Vth) can be set to be higher at the time of a clock low frequency than at the time of a high frequency for the integrated circuit main body. Thus, MOSFET device leakage is reduced during the use at a low frequency.

The eighteenth aspect of the invention is semiconductor integrated circuit apparatus, having a n-well region, which become a substrate of a p-type MOSFET, and a p-well region, which is provided inside said n-well region, and become a substrate of a n-type MOSFET, characterized in that there are provided a second p-well region and a second n-well region, and that the second p-well region is electrically connected to the substrate potential of the n-type MOSFET and the second n-well region is electrically connected to the ground potential of the n-type MOSFET.

With this configuration, voltage variation between the source and substrate of the n-type MOSFET is reduced, thus enabling high-precision application of a substrate voltage.

The nineteenth aspect of the invention is semiconductor integrated circuit apparatus, characterized by that a source and substrate are independently controlled, wherein a gate capacity of MOSFET is added between the source of the MOSFET and the substrate of the MOSFET.

With this configuration, voltage variation between the source and substrate of the n-type MOSFET is reduced, thus enabling high-precision application of a substrate voltage.

The twentieth aspect of the invention is semiconductor integrated circuit apparatus, having a n-well region, which become a substrate of a p-type MOSFET, and a p-well region, which is provided inside said n-well region, and become a substrate of a n-type MOSFET, characterized in that an electric capacity value between a p-well region that provides the substrate of an n-type MOSFET and the ground potential of the n-type MOSFET is higher than an electric capacity value between the p-well region and an n-well region that provides the substrate of a p-type MOSFET.

With this configuration, voltage variation between the source and substrate of the n-type MOSFET is reduced, thus enabling higher-precision application of a substrate voltage.

The twenty-first aspect of the invention is semiconductor integrated circuit apparatus characterized in that the integrated circuit main body comprises a feedback buffer and that the substrate voltage of the MOSFET of the feedback buffer is set by the substrate voltage regulating means.

With this configuration, stable operation of the semiconductor integrated circuit apparatus is allowed even when the feedback buffer is driven on a low voltage. Moreover, the leakage current is reduced.

The twenty-second aspect of the invention is semiconductor integrated circuit apparatus characterized in that the integrated circuit main body comprises a memory circuit and that the substrate voltage of the MOSFET of the memory circuit is set by the substrate voltage regulating means.

With this configuration, it is possible to control the source-substrate voltage value of the MOSFET in the memory circuit so that the drain current for an arbitrary gate voltage value in a subthreshold region will be free from temperature dependence and process variation dependence, thereby preventing corruption of memory data by a subthreshold leakage.

The twenty-third aspect of the invention is semiconductor integrated circuit apparatus characterized in that the integrated circuit main body comprises an SRAM and that the substrate voltage of the MOSFET of the SRAM is set by the substrate voltage regulating means.

With this configuration, it is possible to reduce the temperature dependence of the noise margin at low voltages. This allows operation of the semiconductor integrated circuit apparatus at a low voltage thereby reducing the power consumption of the SRAM.

The twenty-fourth aspect of the invention is semiconductor integrated circuit apparatus characterized in that the integrated circuit main body comprises a circuit of the timing borrow system and that the substrate voltage of the MOSFET of the circuit of the timing borrow system is set by the substrate voltage regulating means.

With this configuration, it is possible to reduce the temperature dependence and process variation dependence of a circuit of the timing borrow system, since the static noise margin of the circuit of the timing borrow system is determined by the threshold value of the MOSFET. It is also possible to reduce the leakage current in the circuit of the timing borrow system.

The twenty-fifth aspect of the invention is semiconductor integrated circuit apparatus characterized in that the integrated circuit main body comprises a differential operational amplifier and that the substrate voltage of the MOSFET of the differential operational amplifier is set by the substrate voltage regulating means.

With this configuration, it is possible to reduce the temperature dependence and process variation dependence of the lower limit voltage in the output range of the differential operational amplifier.

The twenty-sixth aspect of the invention is semiconductor integrated circuit apparatus characterized in that the integrated circuit main body comprises a voltage-controlled oscillator and that the substrate voltage of the MOSFET of the voltage-controlled oscillator is set by the substrate voltage regulating means.

With this configuration, it is possible to reduce the temperature dependence and process variation dependence of the frequency response with respect to the input voltage of the voltage-controlled oscillator.

The twenty-seventh aspect of the invention is semiconductor integrated circuit apparatus characterized in that the integrated circuit main body comprises a CMOS logic circuit and that the substrate voltage of the MOSFET of the CMOS logic circuit is set by the substrate voltage regulating means.

With this configuration, it is possible to reduce the temperature dependence and process variation dependence of a delay in the CMOS logic circuit.

The twenty-eighth aspect of the invention is semiconductor integrated circuit apparatus characterized in that the integrated circuit main body comprises a current-controlled oscillator and that the substrate voltage of the MOSFET of the current-controlled oscillator is set by the substrate voltage regulating means.

With this configuration, it is possible to keep constant the delay value of the current-controlled oscillator and reduce the temperature dependence and process variation dependence of the oscillating frequency.

DESCRIPTION OF THE PREFERRED EMBODIMENTS

Figure 1:
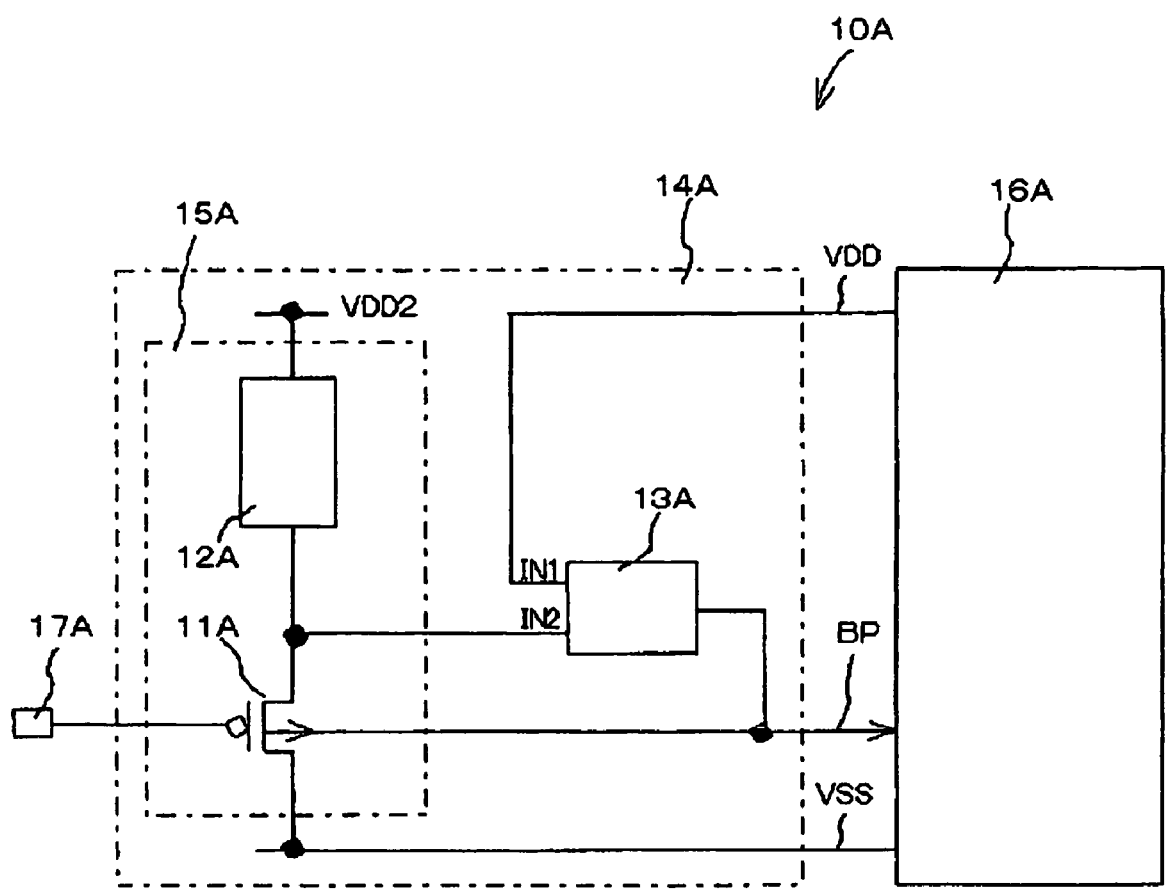
FIG. 1 is a circuit diagram showing semiconductor integrated circuit apparatus according to the first embodiment of the invention.

Embodiments of the invention will be described referring to the drawings.

(First Embodiment)

FIG. 1 is a circuit diagram showing semiconductor integrated circuit apparatus 10A according to the first embodiment. As shown in FIG. 1, the semiconductor integrated circuit apparatus 10A comprises a circuit 14A generating a constant threshold value (Vth) (substrate voltage regulating means) including monitor means 15A including a p-type MOSFET 11A and a constant current source 12A and a comparator section 13A (comparison means), and an integrated circuit main body 16A.

In the first embodiment, the threshold value Vth of the MOSFET is Vgs (gate-source voltage) obtained for example in case Ids=50 nA×(W/L) when VDD=1 V. The Ids is a source-drain current of MOSFET, W is the channel width of MOSFET, and L is the channel length of MOSFET.

The p-type MOSFET 11A is arranged on the same substrate as the integrated circuit main body 16A. In this embodiment, the transistor size of the p-type MOSFET 11A is: channel width W=1.2 μm, channel length L=0.12 μm.

The constant current source 12A and the comparator section 13A may be or may not be arranged on the same substrate as the integrated circuit main body 16A.

The constant current source 12A uses a material which is "not temperature dependent" and is composed of for example a band gap reference circuit showing the constant current characteristics. The term "not temperature dependent" is defined equal to or below 20 PPM/° C. (which does not mean "temperature independent"). The constant current source 12A supplies a current of 500 nA.

The comparator section 13A comprises for example an operational amplifier and an OTA. At least a reference voltage value and a measured voltage value are input to the input terminal of the comparator section 13A. The reference voltage value and the measured voltage value are compared with each other. In case the measured voltage value is lower than the reference voltage value, the output voltage value from the output terminal is increased. In case the measured voltage value is higher than the reference voltage value, the output voltage value from the output terminal is decreased.

The source of the p-type MOSFET 11A is connected to the constant current source 12A. The drain of the p-type MOSFET 11A is connected to the ground potential Vss of the integrated circuit main body 16A. The gate of the p-type MOSFET 11A is set to an arbitrary voltage 17A below the source voltage Vdd of the integrated circuit main body 16A. The difference between the source voltage Vdd of the integrated circuit main body 16A and the arbitrary voltage 17A is always constant. Here, the difference is set to 0.4 V.

That is, the gate voltage of the p-type MOSFET 11A is 0.6 V. The voltage value of the reference input IN1 of the comparator section 13A is set to the source voltage Vdd of the integrated circuit main body 16A. The measured input IN2 of the comparator section 13A is connected to the source of the p-type MOSFET 11A. The output of the comparator section 13A is connected to the substrate voltage BP of the p-type MOSFET 11A. The upper limit of the output range of the comparator section 13A is equal to or above the source voltage Vdd of the integrated circuit main body 16A and the lower limit is below the source voltage Vdd of the integrated circuit main body 16A.

Assume that the output range of the comparator section 13A is a voltage range of 0.6 V through 2.0 V.

It is possible to output the substrate voltage BP via a limiter 19A (limiting means) which uses the upper or lower limit value of the output range of the comparator section 13A as a limit voltage value.

An example will be described where the comparator section 13A to output the substrate voltage BP on the PMOS comprises a limiter 19A.

Figure 2:
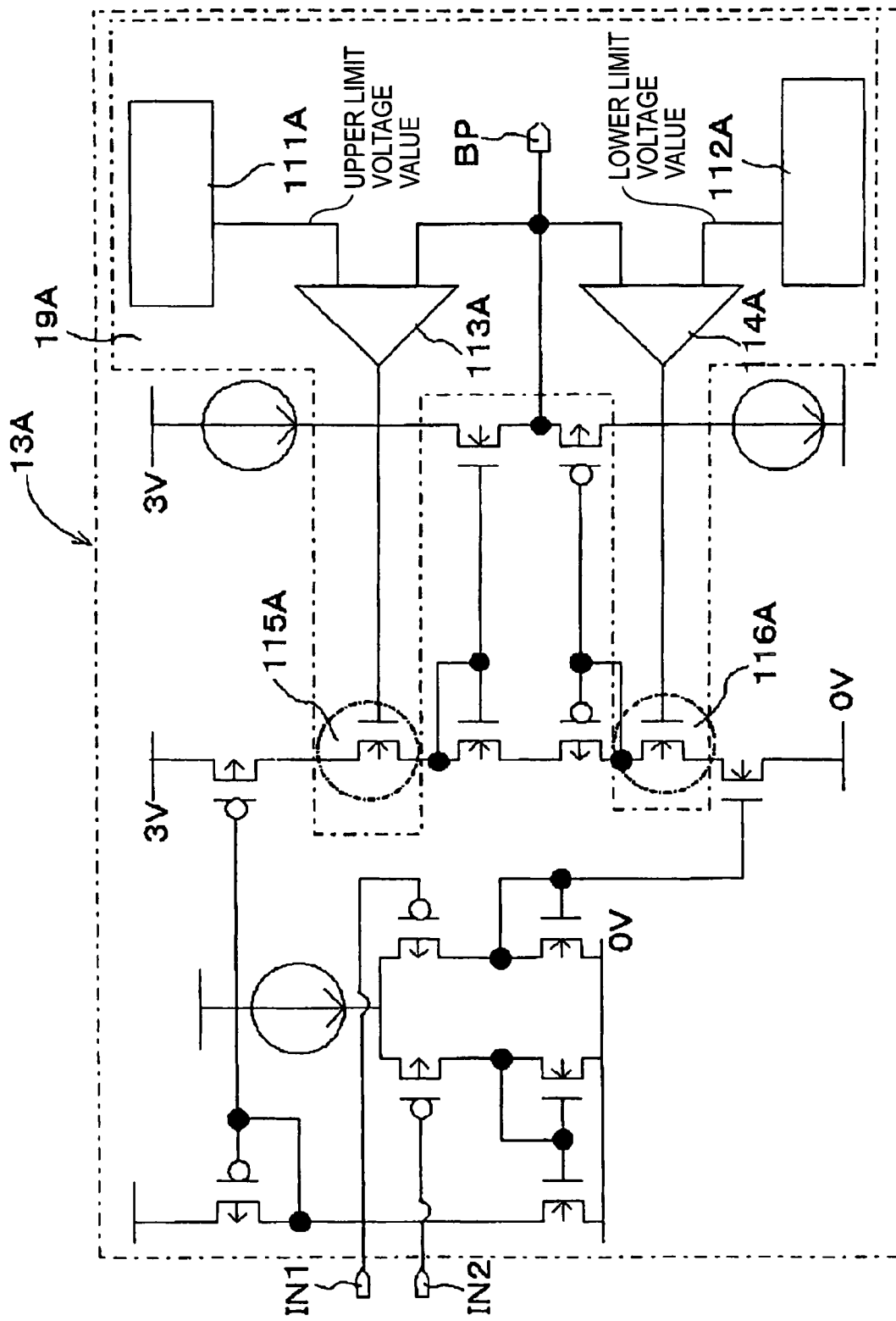
FIG. 2 is a circuit diagram showing an example of the comparator section (CMOS side) comprising a limiter.

FIG. 2 is a circuit diagram showing an example of the comparator section 13A comprising a limiter 19A.

As shown in FIG. 2, the comparator section 13A comprises an operational amplifier 18A and the limiter 19A. The limiter 19A comprises registers 11A, 112A, comparators 113A, 114A, and MOSFETs 115A, 116A for the limiter.

Next, a method for determining a limit voltage value by way of the limiter 19A will be described.

In the semiconductor integrated circuit apparatus 10A which has undergone the fabrication process, the potential difference between the source and the drain is transitioned toward negative values from 0. The voltage value obtained when the drain current Ids of the p-type MOSFET 11A has reached its minimum value is stored into the register 11A.

Next, the potential difference between the source and the substrate is transitioned toward positive values from 0. The voltage value obtained when the drain current Ids of the p-type MOSFET 11A has reached its maximum value is stored into the separate register 112A.

It is possible to provide the upper limit of the substrate voltage BP by comparing, on the comparator 113A, the voltage value stored in the register 111A (upper limit voltage) and the voltage BP to be output and turning on/off the MOSFET 115A for the limiter the gate of which is connected to the output of the comparator 113A.

The upper limit of the substrate voltage BP (upper limit of the output voltage value of the substrate voltage regulating means) is preferably set to a voltage within a range where the GIDL effect does not occur in the p-type MOSFET 11A.

It is possible to provide the lower limit of the substrate voltage BP by comparing, on the comparator 114A, the voltage value stored in the register 112A (lower limit voltage) and the voltage BP to be output and turning on/off the MOSFET 115A for the limiter the gate of which is connected to the output of the comparator 114A.

When an excessive negative substrate voltage (back bias) is applied, the polarity of the feedback gain of the circuit 14A generating a constant threshold value (Vth) is changed by way of the GIDL effect, thus causing deadlock in the feedback system, a phenomenon where appropriate feedback is not applied thus stabilizing the feedback system in an abnormal state.

Figure 3:
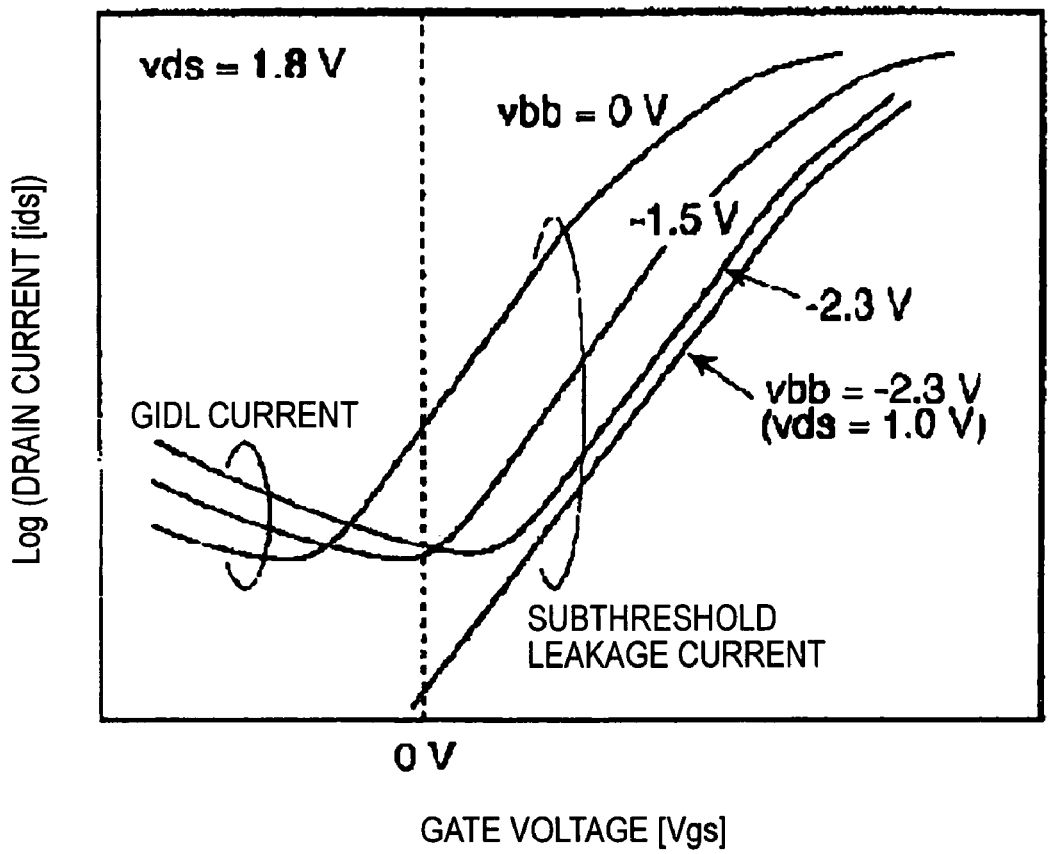
FIG. 3 shows the Ids-Vgs characteristics used to explain the GIDL effect.
Figure 8:
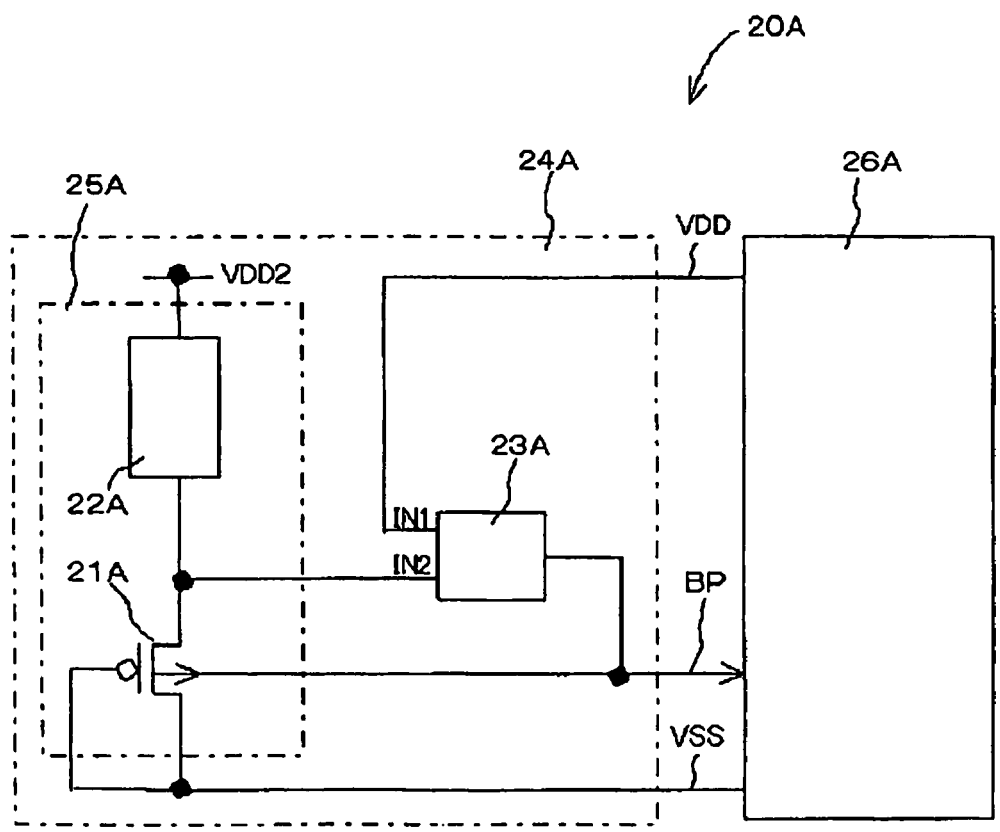
FIG. 8 is a circuit diagram showing semiconductor integrated circuit apparatus according to the third embodiment of the invention.

As a reference, FIG. 3 shows FIG. 8 representing the Ids-Vgs characteristics in Hiroyuki Mizuno and seven others, "An 18-µ A Standby Current 1.8-V, 200 MHz Microprocessor with Self-Substrate-Biased Data-Retention Mode", NOVEMBER 1999, IEEE JOURNAL OF SOLID-STATE CIRCUITS, VOL.34, NO.11, p.1392–1500. In FIG. 3, for Vbb=−2.3V with large back bias, the drain current due to the GIDL effect is high.

Note that the feedback system may be subject to deadlock depending on the arrangement of a circuit source.

When an excessive positive substrate voltage (forward bias) is applied, the MOSFET shows the bipolar characteristics and the feedback gain of the circuit 14A generating a constant threshold value (Vth) increases to a large extent and the feedback system becomes more likely to oscillate.

Figure 4:
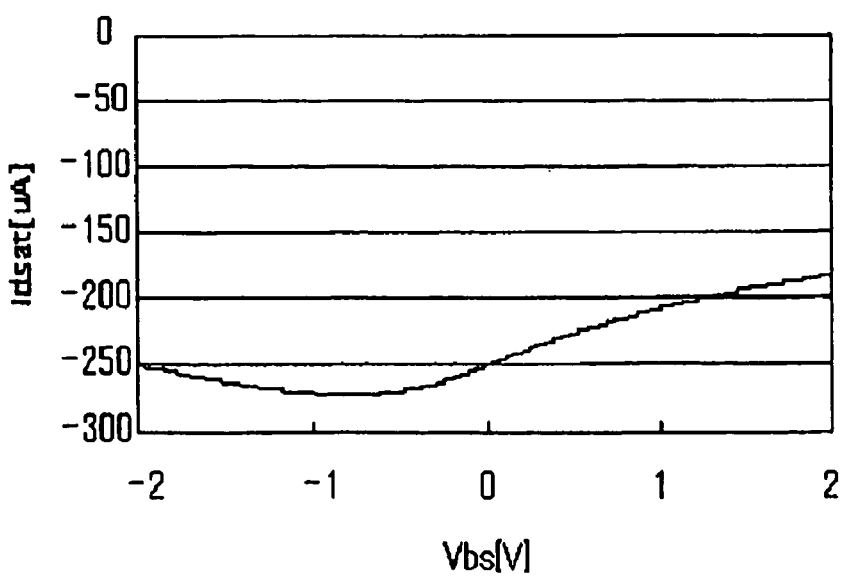
FIG. 4 shows the simulation values of the drain current Ids obtained when the substrate voltage Vbs of the p-type MOSFET used to explain the bipolar characteristics is varied.

FIG. 4 shows the simulation values of the drain current Ids obtained when the substrate voltage Vbs of the p-type MOSFET is varied. AS shown in FIG. 4, applying a forward bias exceeding a predetermined voltage (minus direction in FIG. 4) to the MOSFET causes the drain current Ids to decrease.

Thus, it is important that the limit voltage to prevent deadlock and the limit voltage to prevent oscillation of the feedback system are reflected onto the limit voltage value.

In order to prevent deadlock and oscillation of the feedback system mentioned above, the lower limit of the substrate voltage BP (lower limit of the output voltage value of the substrate voltage regulating means) is preferably set to a voltage in the range where the p-type MOSFET 11A does not show the bipolar characteristics. The upper limit of the substrate voltage BP (upper limit of the output voltage value of the substrate voltage regulating means) is preferably set to a voltage in the range where the GIDL effect does not occur in the p-type MOSFET 11A.

While the limit voltage value is stored into the registers 111A, 112A, the limit voltage value maybe set to a fixed voltage value obtained through a trimming technique and input to the comparators 113A, 114A.

The characteristics of the semiconductor integrated circuit apparatus 10A which has undergone the fabrication process may be stored in a separate index database in advance and the above limit voltage value may be determined at an arbitrary measurement point alone.

To reflect secular change after fabrication, the above method for determining a limit voltage value may be applied to the semiconductor integrated circuit apparatus 10A as required to change the limit voltage value.

For example, assuming that the measured voltage is 1.1 V when the substrate voltage BP of the p-type MOSFET 11 is 1 V, the output voltage of the comparator section 13 will drop and regulation is made so that the measured voltage will be 1 V.

The circuit 14A generating a constant threshold value (Vth) controls the source-substrate voltage value of MOSFET so that the drain current for an arbitrary gate voltage value in a subthreshold region will be free from temperature dependence and process variation dependence. The obtained value of the drain current shows that the threshold value of the plurality of p-type MOSFETs arranged on the integrated circuit main body 16A is constant.

(Second Embodiment)

Figure 5:
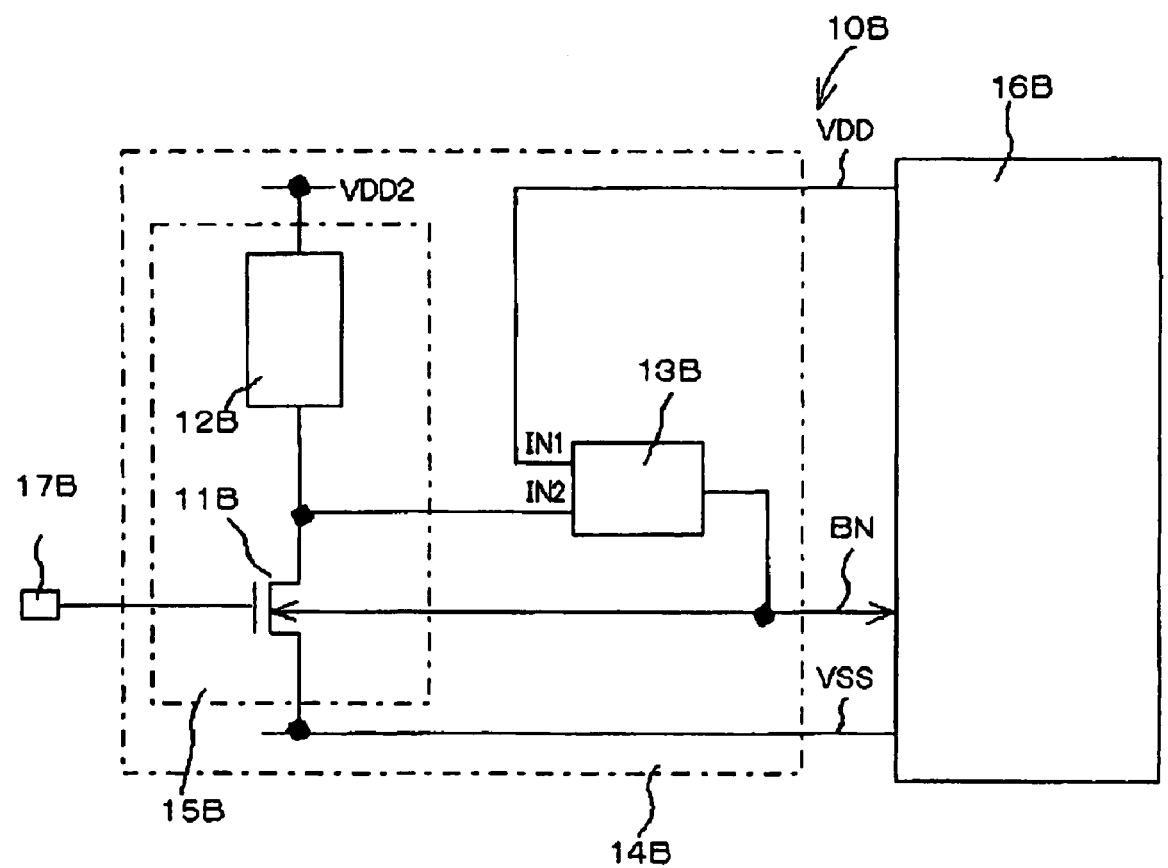
FIG. 5 is a circuit diagram showing semiconductor integrated circuit apparatus according to the second embodiment of the invention.

FIG. 5 is a circuit diagram showing semiconductor integrated circuit apparatus 10B according to the second embodiment. As shown in FIG. 5, the semiconductor integrated circuit apparatus 10B comprises a circuit 14A generating a constant threshold value (Vth) (substrate voltage regulating means) including monitor means 15B including an n-type MOSFET 11B and a constant current source 12B and a comparator section 13B (comparison means), and an integrated circuit main body 16B.

In the second embodiment, the threshold value Vth of the MOSFET is Vgs (gate-source voltage) obtained for example in case Ids=50 nA×(W/L) when VDD=1 V. The Ids is a source-drain current of MOSFET, W is the channel width of MOSFET, and L is the channel length of MOSFET.

The n-type MOSFET 11B is arranged on the same substrate as the integrated circuit main body 16B. In this embodiment, the transistor size of the n-type MOSFET 11B is: channel width W=1.2 µm, channel length L=0.12 µm.

The constant current source 12B and the comparator section 13B may be or may not be arranged on the same substrate as the integrated circuit main body 16B.

The constant current source 12B uses a material which is "not temperature dependent" and is composed of for example a band gap reference circuit showing the constant current characteristics. The term "not temperature dependent" is defined equal to or below 20 PPM/° C. (which does not mean "temperature independent"). The constant current source 12B supplies a current of 500 nA.

The comparator section 13B comprises for example an operational amplifier and an OTA. To the input terminal of the comparator section 13B are input at least a reference voltage value and a measured voltage value. The reference voltage value and the measured voltage value are compared with each other. In case the measured voltage value is lower than the reference voltage value, the output voltage value from the output terminal is increased. In case the measured voltage value is higher than the reference voltage value, the output voltage value from the output terminal is decreased.

The drain of the n-type MOSFET 11B is connected to the constant current source 12B. The source of the n-type MOSFET 11B is connected to the ground potential Vss of the integrated circuit main body 16B. The gate of the n-type MOSFET 11B is set to an arbitrary voltage 17B equal to or above the ground voltage Vss of the integrated circuit main body 16B. The difference between the source voltage Vdd of the integrated circuit main body 16B and the arbitrary voltage 17B is always constant. Here, the difference is set to 0.4 V.

The voltage value of the reference input IN1 of the comparator section 13B is set to the source voltage value of the integrated circuit main body 16B. The measured input IN2 of the comparator section 13B is connected to the drain of the n-type MOSFET 11B. The output of the comparator section 13B is connected to the substrate of the n-type MOSFET 11B. The upper limit of the output range of the comparator section 13B is equal to or above the ground potential of the semiconductor integrated circuit apparatus 10B and the lower limit is below ground potential of the semiconductor integrated circuit apparatus 10B.

Assume that the output range of the comparator section 13B is a voltage range of −1.0 V through 0.4 V.

It is possible to output the substrate voltage BP via a limiter 19B (limiting means) which uses the upper or lower limit value of the output range of the comparator section 13B as a limit voltage value.

An example will be described where the comparator section 13B to output the substrate voltage BN on the NMOS comprises a limiter 19B.

Figure 6:
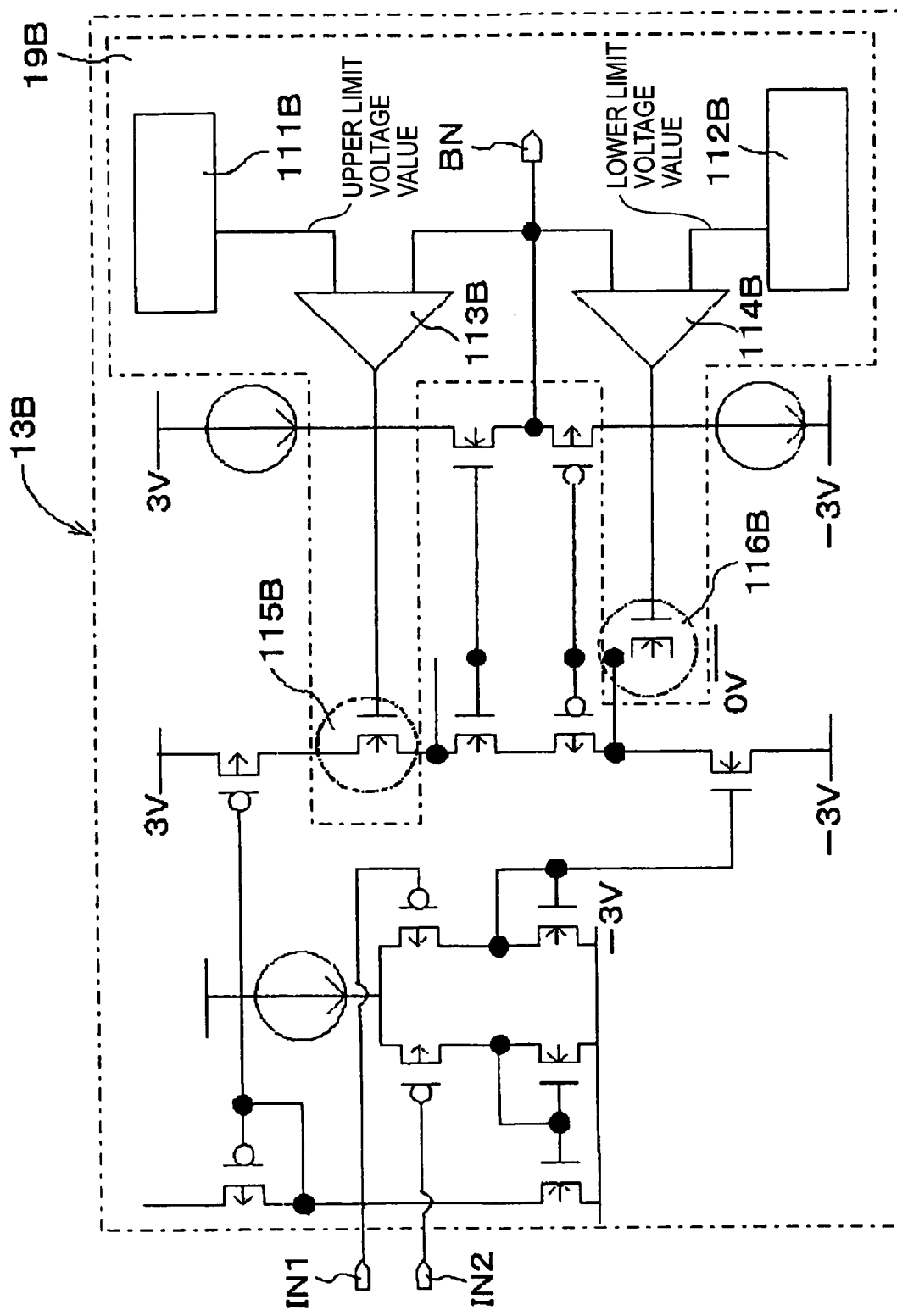
FIG. 6 is a circuit diagram showing an example of the comparator section (NMOS side) comprising a limiter.

FIG. 6 is a circuit diagram showing an example of the comparator section 13B comprising a limiter 19B.

As shown in FIG. 6, the comparator section 13B comprises an operational amplifier 18B and the limiter 19B. The limiter 19B comprises registers 111B, 112B, comparators 113B, 114B, and MOSFETs 115B, 116B for the limiter.

Using such an output circuit allows a current to be supplied stably up to the neighborhood of a limit value. A substrate voltage is stably obtained in a forward bias mode when a current flows into a source via a substrate, which is especially effective in the stable operation of a target circuit.

A minus voltage is in advance generated by a minus booster circuit, and a configuration such that the applied voltage is input to a part where VDD is equal to −3V is adopted, then the response capability of the feedback loop will be good. If the boosted circuit is used in a final buffer, characteristics of the feedback loop will be discrete and the response capability will become worse, because of its generating clock.

Next, a method for determining a limit voltage value by way of the limiter 19B will be described.

In the semiconductor integrated circuit apparatus 10B which has undergone the fabrication process, the potential difference between the source and the drain is transitioned toward negative values from 0. The voltage value obtained when the drain current Ids of the n-type MOSFET 11B has reached its minimum value is stored into the register 111B.

Next, the potential difference between the source and the substrate is transitioned toward positive values from 0.

The voltage value obtained when the drain current Ids of the n-type MOSFET 11B has reached its maximum value is stored into the separate register 112B.

It is possible to provide the upper limit of the substrate voltage BN by comparing, on the comparator 113B, the voltage value stored in the register 111B (upper limit voltage) and the voltage BN to be output and turning on/off the MOSFET 115B for the limiter the gate of which is connected to the output of the comparator 113B.

The upper limit of the substrate voltage BN is preferably set to a voltage within a range where the n-type MOSFET 11A does not show the bipolar characteristics.

It is possible to provide the lower limit of the substrate voltage BN by comparing, on the comparator 114B, the voltage value stored in the register 112B (lower limit voltage) and the voltage BN to be output and turning on/off the MOSFET 115B for the limiter the gate of which is connected to the output of the comparator 114B.

When an excessive negative substrate voltage (back bias) is applied, the polarity of the feedback gain of the circuit 14B generating a constant threshold value (Vth) is changed by way of the GIDL effect, thus causing deadlock in the feedback system, a phenomenon where appropriate feedback is not applied thus stabilizing the feedback system in an abnormal state.

Note that the feedback system may be subject to deadlock depending on the arrangement of a circuit source.

When an excessive positive substrate voltage (forward bias) is applied, the MOSFET shows the bipolar characteristics and the feedback gain of the circuit 14A generating a constant threshold value (Vth) increases to a large extent and the feedback system becomes more likely to oscillate.

Figure 7:
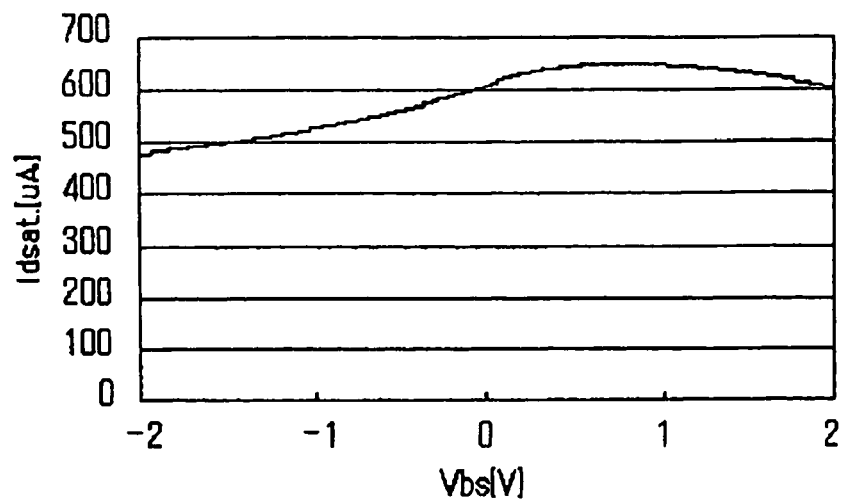
FIG. 7 shows the simulation values of the drain current Ids obtained when the substrate voltage Vbs of the p-type MOSFET used to explain the bipolar characteristics is varied.

FIG. 7 shows the simulation values of the drain current Ids obtained when the substrate voltage Vbs of the n-type MOSFET is varied. AS shown in FIG. 7, applying a forward bias exceeding a predetermined voltage (minus direction in FIG. 7) to the MOSFET causes the drain current Ids to decrease.

Thus, it is important that the limit voltage to prevent deadlock and the limit voltage to prevent oscillation of the feedback system are reflected onto the limit voltage value.

The lower limit of the substrate voltage BN is preferably set to a voltage in the range where the GIDL effect does not occur in the n-type MOSFET 11B. The upper limit of the substrate voltage BN (upper limit of the output voltage value of the substrate voltage regulating means) is preferably set to a voltage in the range where the n-type MOSFET 11B does not show the bipolar characteristics.

While the limit voltage value is stored into the registers 111B, 112B, the limit voltage value may be set to a fixed voltage value obtained through a trimming technique and input to the comparators 113B, 114B.

The characteristics of the semiconductor integrated circuit apparatus 10B which has undergone the fabrication process may be stored in a separate index database in advance and the above limit voltage value may be determined at an arbitrary measurement point alone.

To reflect secular change after fabrication, the above method for determining a limit voltage value may be applied to the semiconductor integrated circuit apparatus 10B as required to change the limit voltage value.

The circuit 14B generating a constant threshold value (Vth) controls the source-substrate voltage value of MOSFET so that the drain current for an arbitrary gate voltage value in a subthreshold region will be free from temperature dependence and process variation dependence. The obtained value of the drain current shows that the thresholds value for the plurality of n-type MOSFETs arranged on the integrated circuit main body 16 is constant.

Figure 23:
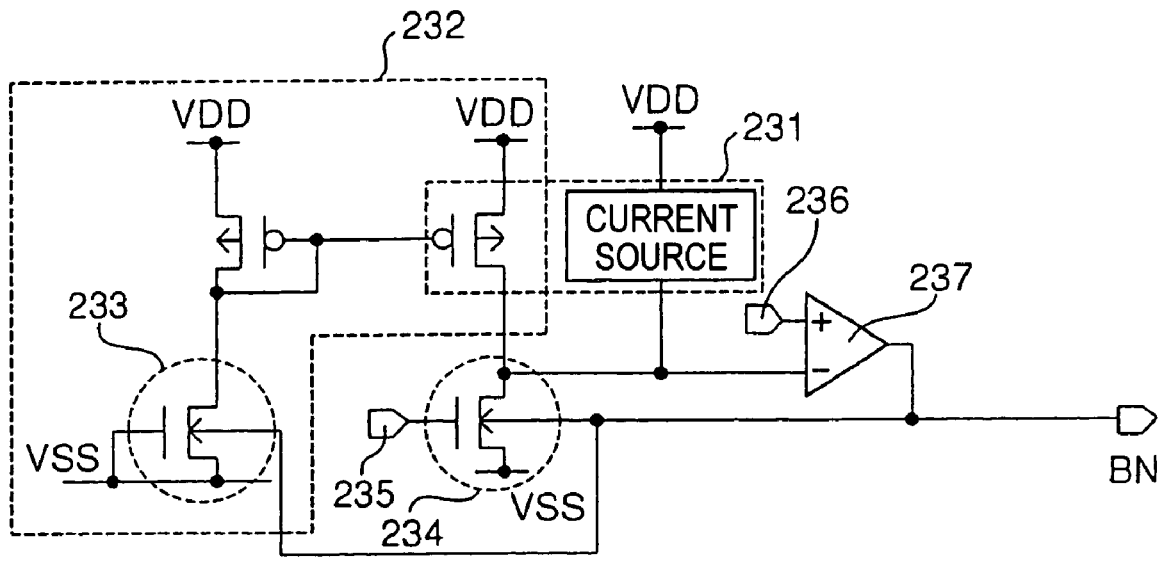
FIG. 23 is a configuration example in which the characteristics of a constant current source 12B have been further approximated to ideal current source characteristics.

FIG. 23 is a configuration example in which the characteristics of the constant current source 12B shown in FIG. 5 have been further approximated to ideal current source characteristics.

The configuration is as follows. The gate of a MOSFET 233 having at least the same channel length L and channel width W as a MOSFET 234 to be monitored is set to have the same potential as the source potential of the MOSFET 233. A current mirror circuit 232 taking its source from the drain current of the MOSFET 233 is then added in parallel to the constant current source 12B in FIG. 5. Additionally, a predetermined voltage value is applied to each of input terminals 235, 236. Reference numeral 237 denotes an operational amplifier.

If this current source 231 is absent, when the substrate voltage value of a monitor device becomes lower than −0.4 V, usually, the GIDL effect causes leakage to increase, leading to an increase in amount of a virtual current. Thus, the applied voltage of the substrate voltage value will be increased by such an amount of increase.

However, in this current source 231, a term of GIDL is cancelled, so that it becomes possible to obtain a pure threshold value or saturation current of MOSFET, thus applying the substrate voltage BN regulated to higher accuracy than in the configuration using the constant current source 12B.

Then, when a positive substrate voltage (forward bias) is applied, the bipolar effect causes leakage of the MOSFET 234 to increase, but it is possible to cancel such an increase.

Figure 24:
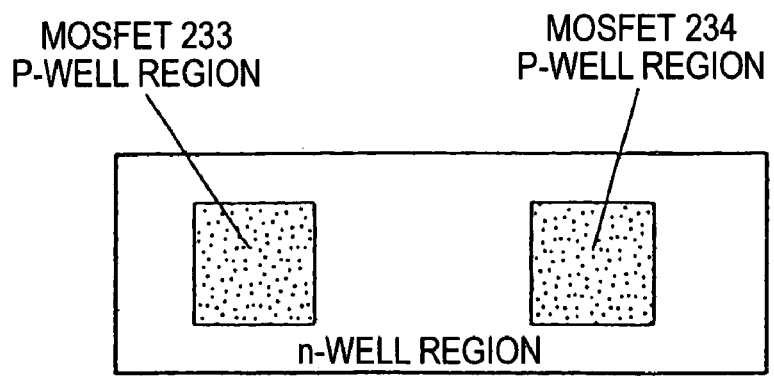
FIG. 24 is a diagram showing a p-well region that provides the substrate of an n-type MOSFET shown in FIG. 23.

Furthermore, FIG. 24 shows p-well regions that provide the substrates of the n-type MOSFETs 233, 234 shown in FIG. 23. The p-well region that provides the substrate of the n-type MOSFET 233 and the p-well region that provides the substrate of the n-type MOSFET 234 are separated, as shown in FIG. 24, as an n-well region is formed therebetween.

Figure 25:
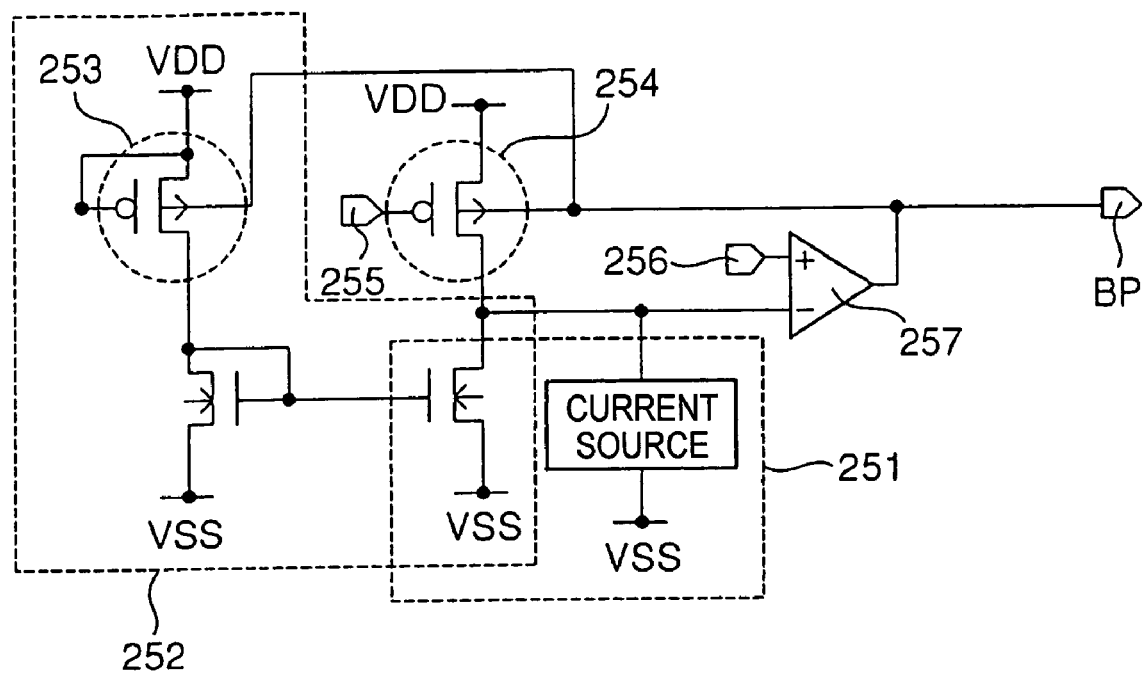
FIG. 25 is a configuration example in which the characteristics of a constant current source 12A shown in FIG. 1 have been further approximated to ideal current source characteristics.

Besides, FIG. 25 shows a configuration example in which the constant current source 12A shown in FIG. 1 has also been approximated to ideal current source characteristics similarly to FIG. 23.

The configuration is as follows. The gate of a MOSFET 253 having at least the same channel length L and channel width W as a MOSFET 254 to be monitored is set to have the same potential as the source potential of the MOSFET 253. A current mirror circuit 252 taking its source from the drain current of the MOSFET 253 is then added in parallel to the constant current source 12A in FIG. 1. Additionally, a predetermined voltage value is applied to each of input terminals 255, 256. Reference numeral 257 denotes an operational amplifier.

(Third Embodiment)

FIG. 8 is a circuit diagram showing semiconductor integrated circuit apparatus 20A according to the third embodiment. As shown in FIG. 8, the semiconductor integrated circuit apparatus 20A comprises a circuit 24A generating a constant drain current (substrate voltage regulating means) including monitor means 25A including a p-type MOSFET 21A and a constant current source 22A and a comparator section 23A (comparison means), and an integrated circuit main body 26.

In the third embodiment, assume that the saturation current of MOSFET is for example a source-drain current obtained when Vgs=1 V, VDD=1 V, and Vss=0.

The circuit 24A generating a constant drain current (Ids) is a circuit (substrate voltage regulating means) which controls the substrate voltage of MOSFET so that the drain current for an arbitrary gate voltage value in the saturated region of MOSFET will be constant. The transistor size of the p-type MOSFET 21A is: channel width W=1 μm, channel length L=0.12 μm.

The constant current source 22A uses a material which is "not temperature dependent" and is composed of for example a band gap reference circuit showing the constant current characteristics. The term "not temperature dependent" is defined equal to or below 20 PPM/° C. (which does not mean "temperature independent"). The constant current source 22A supplies a current of 300 μA.

The comparator section 23A comprises for example an operational amplifier and an OTA. To the input terminal of the comparator section 23A are input at least a reference voltage value and a measured voltage value. The reference voltage value and the measured voltage value are compared with each other. In case the measured voltage value is lower than the reference voltage value, the output voltage value from the output terminal is increased. In case the measured voltage value is higher than the reference voltage value, the output voltage value from the output terminal is decreased.

The source of the p-type MOSFET 21A is connected to the constant current source 22A. The drain of the p-type MOSFET 21A is connected to the ground potential Vss of the integrated circuit main body 26. The gate of the p-type MOSFET 21A is connected to the ground potential Vss of the integrated circuit main body 26.

The voltage value of the reference input IN1 of the comparator section 23A is set to the source voltage Vdd of the integrated circuit main body 26. The measured input IN2 of the comparator section 23A is connected to the source of the p-type MOSFET 21A. The output of the comparator section 23A is connected to the substrate voltage BP of the p-type MOSFET 21A. The upper limit of the output range of the comparator section 13A is equal to or above the source voltage Vdd of the integrated circuit main body 26 and the lower limit is below the source voltage Vdd of the integrated circuit main body 26.

Assume that the output range of the comparator section 23A is a voltage range of 0.6 V through 2.0 V.

It is possible to output the substrate voltage BP via a limiter 19A (limiting means) which uses the upper or lower limit value of the output range of the comparator section 23A as a limit voltage value. The action assumed in case limiting means is provided in this embodiment is the same as that in the first embodiment.

The circuit 24A generating a drain current (Ids) controls the substrate voltage BP so that the drain current for an arbitrary gate voltage value the saturated region of MOSFET will be constant. The obtained value of the drain current shows that the drain current Ids for the plurality of p-type MOSFETs arranged on the integrated circuit main body 26 is constant.

(Fourth Embodiment)

Figure 9:
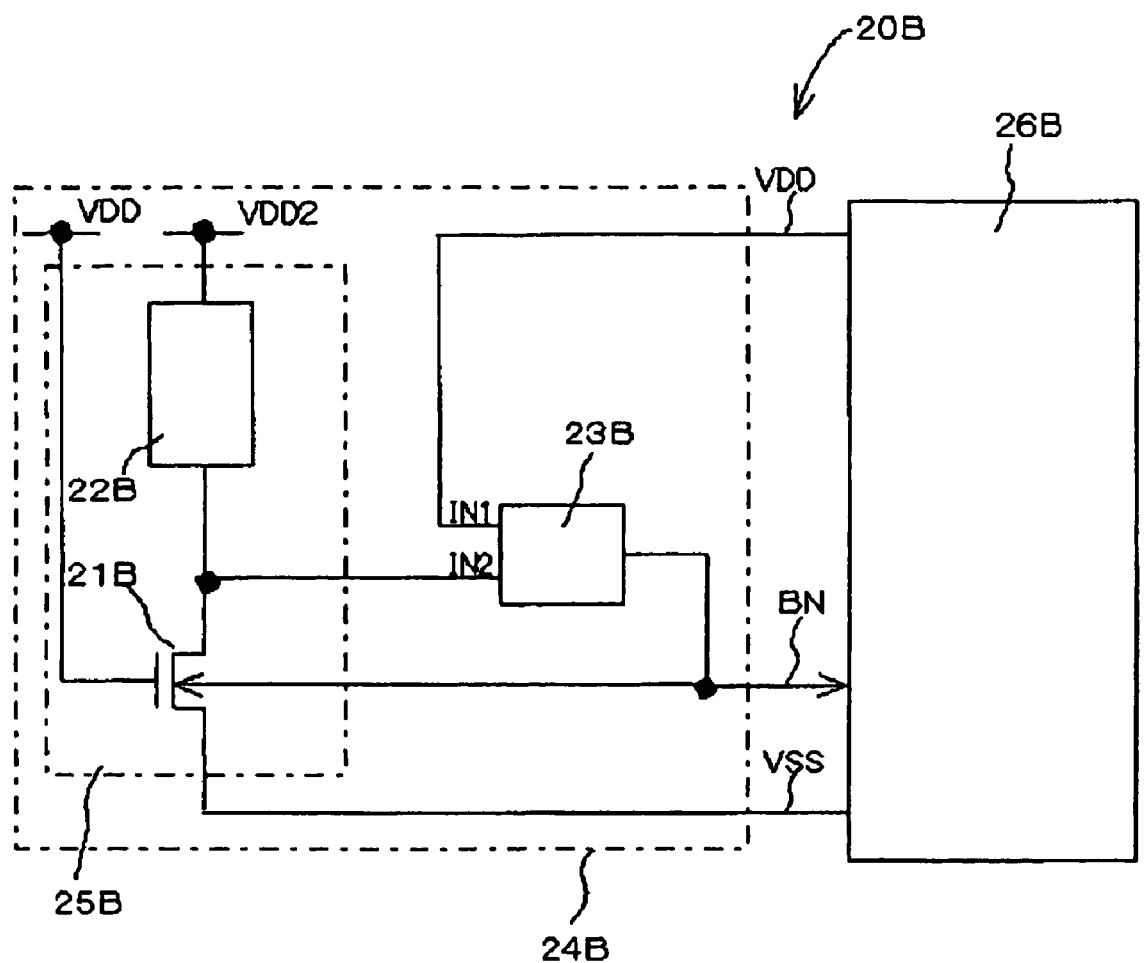
FIG. 9 is a circuit diagram showing semiconductor integrated circuit apparatus according to the fourth embodiment of the invention.

FIG. 9 is a circuit diagram showing semiconductor integrated circuit apparatus 20B according to the fourth embodiment.

As shown in FIG. 9, the semiconductor integrated circuit apparatus 20A comprises a circuit 24A generating a constant drain current (Ids) (substrate voltage regulating means) including monitor means 25A including an n-type MOSFET 21B and a constant current source 22A and a comparator section 23A (comparison means), and an integrated circuit main body 26A.

In the fourth embodiment, assume that the saturation current of MOSFET is for example a source-drain current obtained when Vgs=1 V, VDD=1 V, and Vss=0.

The circuit 24B generating a constant drain current (Ids) is a circuit (substrate voltage regulating means) which controls the substrate voltage of MOSFET so that the drain current for an arbitrary gate voltage value in the saturated region of MOSFET will be constant. The transistor size of the n-type MOSFET 21B is: channel width W=1 μm, channel length L=0.12 μm.

The constant current source 22B uses a material which is "not temperature dependent" and is composed of for example a band gap reference circuit showing the constant current characteristics. The term "not temperature dependent" is defined equal to or below 20 PPM/° C. (which does not mean "temperature independent"). The constant current source 22B supplies a current of 600 μA.

The comparator section 23B comprises for example an operational amplifier and an OTA. To the input terminal of the comparator section 23B are input at least a reference voltage value and a measured voltage value. The reference voltage value and the measured voltage value are compared with each other. In case the measured voltage value is lower than the reference voltage value, the output voltage value from the output terminal is increased. In case the measured voltage value is higher than the reference voltage value, the output voltage value from the output terminal is decreased.

The drain of the n-type MOSFET 21B is connected to the constant current source 22B. The source of the n-type MOSFET 21B is connected to the ground potential Vss of the integrated circuit main body 26. The gate of the n-type MOSFET 21B is set the source voltage Vdd of the integrated circuit main body 26.

The voltage value of the reference input IN1 of the comparator section 23B is set to the source voltage Vdd of the integrated circuit main body 26A. The measured input IN2 of the comparator section 23A is connected to the source of the n-type MOSFET 21B. The upper limit of the output range of the comparator section 23B is equal to or above the ground potential Vss of the integrated circuit main body 26 and the lower limit is below the ground potential Vss of the integrated circuit main body 26.

Assume that the output range of the comparator section 23B is a voltage range of −1.0 V through 2.0 V.

In this embodiment, same as the second embodiment, it is possible to output the substrate voltage BN via a limiter 19B (limiting means) which uses the upper or lower limit value of the output range of the comparator section 23B as a limit value. In this way, the action assumed in case limiting means is provided in this embodiment is the same as that in the second embodiment.

The circuit 24B generating a drain current (Ids) controls the substrate voltage BN so that the drain current for an arbitrary gate voltage value in the saturated region of MOSFET will be constant. The obtained value of the drain current shows that the drain current Ids for the plurality of n-type MOSFETs arranged on the integrated circuit main body 26 is constant.

(Fifth Embodiment)

Figure 10:
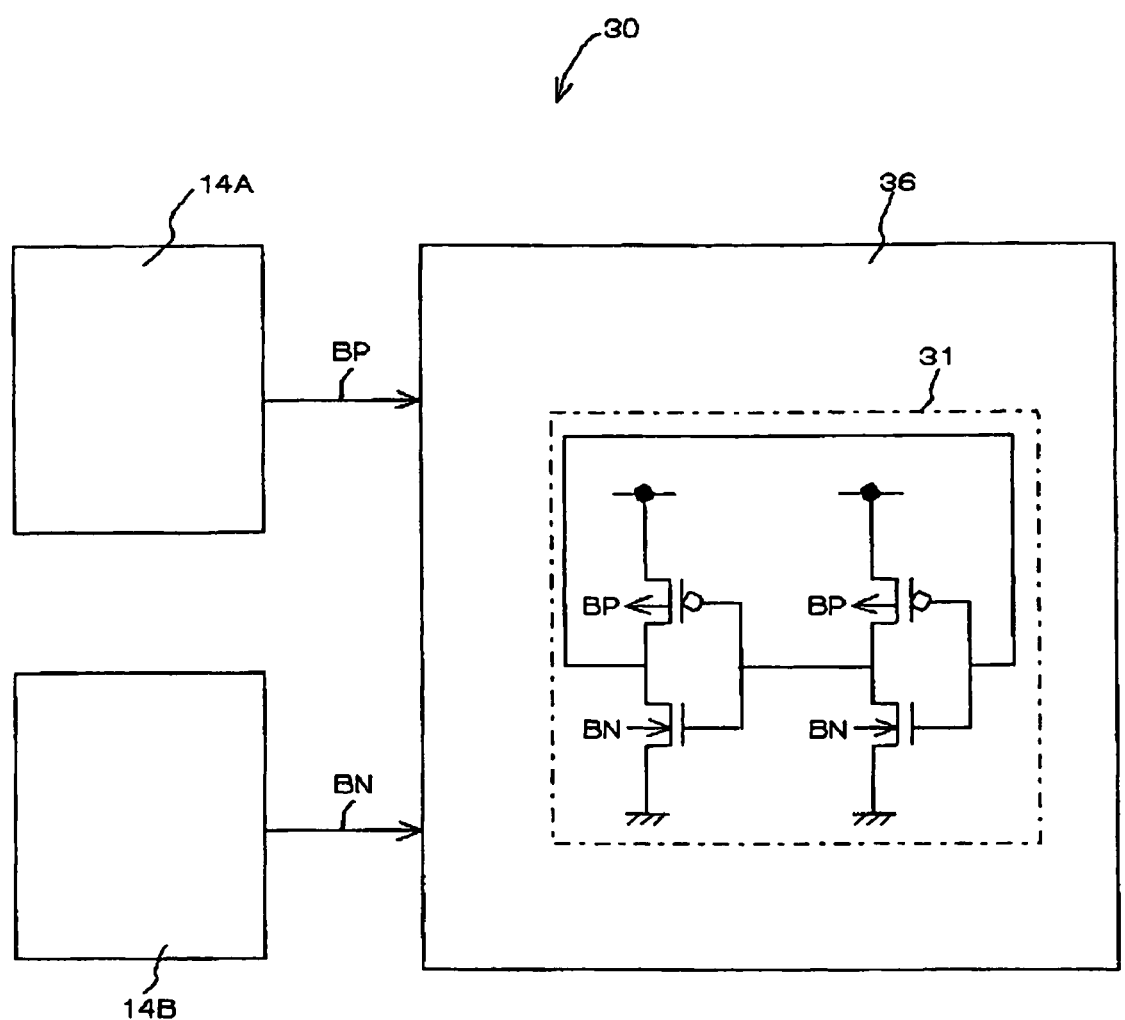
FIG. 10 is a circuit diagram showing semiconductor integrated circuit apparatus according to the fifth embodiment of the invention.

FIG. 10 is a circuit diagram showing semiconductor integrated circuit apparatus 30 according to the fifth embodiment. As shown in FIG. 10, the semiconductor integrated circuit apparatus 30 comprises the circuits 14A, 14B generating a constant threshold value (Vth) shown in the first and second embodiments and integrated circuit main body 36 incorporating a feedback buffer 31. The substrate voltages BP, BN of the circuits 14A, 14B generating a constant threshold value (Vth) are connected to the respective substrate voltages of the n-type and p-type MOSFETS of the feedback buffer 31 in the integrated circuit main body 36.

Figure 11:
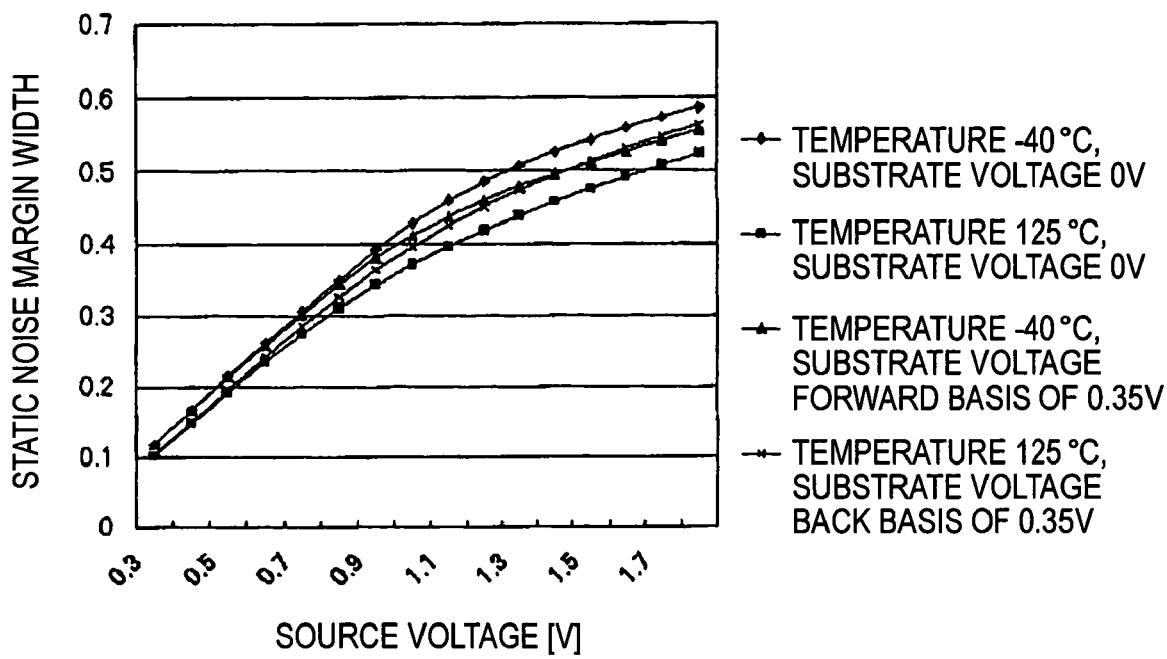
FIG. 11 is a graph showing the circuit simulation result of a static noise margin width with respect to the source voltage in the semiconductor integrated circuit apparatus according to the fifth embodiment of the invention.

The advantage of using the circuits 14A, 14B generating a constant threshold value (Vth) in this embodiment will be described with relation to the evaluation result by a specific example of the feedback buffer 31. In this example, each MOSFET constituting the feedback buffer 31 has the following parameters:

Ids of p-type MOSFET=240 μA/μm; Vth of p-type MOSFET=0.35 V;

Ids of n-type MOSFET=600 μA/μm; Vth of n-type MOSFET=0.35 V;

W of p-type MOSFET=2 μm; L of p-type MOSFET=0.12 μm;

W of n-type MOSFET=1 μm; L of n-type MOSFET=0.12 μm;

FIG. 11 shows static noise margin widths obtained through circuit simulation (SPICE) using the circuits 14A, 14B generating a constant threshold value (Vth), with the source voltage varied under four conditions: 1) T=−40° C. (low temperature); substrate voltages BN, BP=0 V; 2) T=−40° C. (low temperature); substrate voltages BN, BP=0.35 V (forward bias); 3) T=125° C. (high temperature); substrate voltages BN, BP=0 V; 4) T=125° C. (high temperature); substrate voltages BN, BP=−0.35 V (back bias).

In FIG. 11, the horizontal axis represents the source voltage value of the feedback buffer 31, and the vertical axis represents the static noise margin width of the feedback buffer 31. As shown in FIG. 11, in case the circuits 14A, 14B generating a constant threshold value (Vth) are used, the width of variation of static noise margin widths is narrower and stable operation is assured at low voltages.

Figure 12:
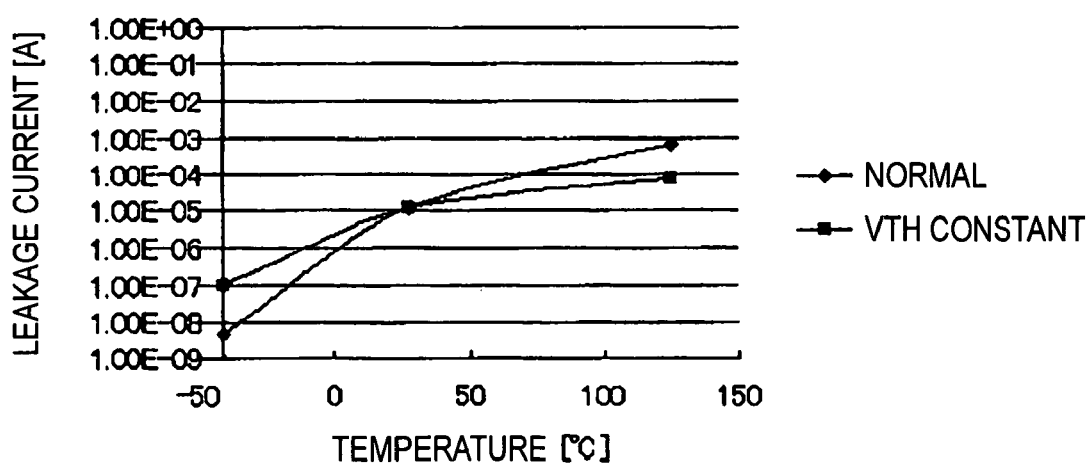
FIG. 12 is a graph showing the circuit simulation result of the temperature dependence of a leakage current in the semiconductor integrated circuit apparatus according to the fifth embodiment of the invention.

FIG. 12 shows the temperature dependence of a leakage current assumed in two cases: 1) the circuits 14A, 14B generating a constant threshold value (Vth) are used for the substrate voltage of the feedback buffer 31; and 2) the circuits 14A, 14B are not used for the substrate voltage of the feedback buffer 31.

In FIG. 12, the horizontal axis represents a temperature and the vertical axis a leakage current in logarithm. As shown in FIG. 12, the leakage current slightly increases at low temperatures but is reduced dramatically at high temperatures.

While the reference voltage is a low voltage of 0.4 V in this example, there may be a need to set a higher Vth in case the Vth is too low and the static margin is reduced at a high voltage. In such a case, resistance division means may be provided in the reference voltage section so that the reference voltage value will be some percentage of the applied voltage value.

A limit voltage circuit is further effective in varying the reference voltage. For example, when a reference voltage of 0.35V is set when VDD=1 V, the ratio of the reference voltage to the applied voltage is 35%. The reference voltage is 0.7 V when VDD=2 V. To provide the value, a further back bias must be applied thus resulting in the GIDL effect. To prevent this, the limit circuit is effective.

(Sixth Embodiment)

Figure 13:
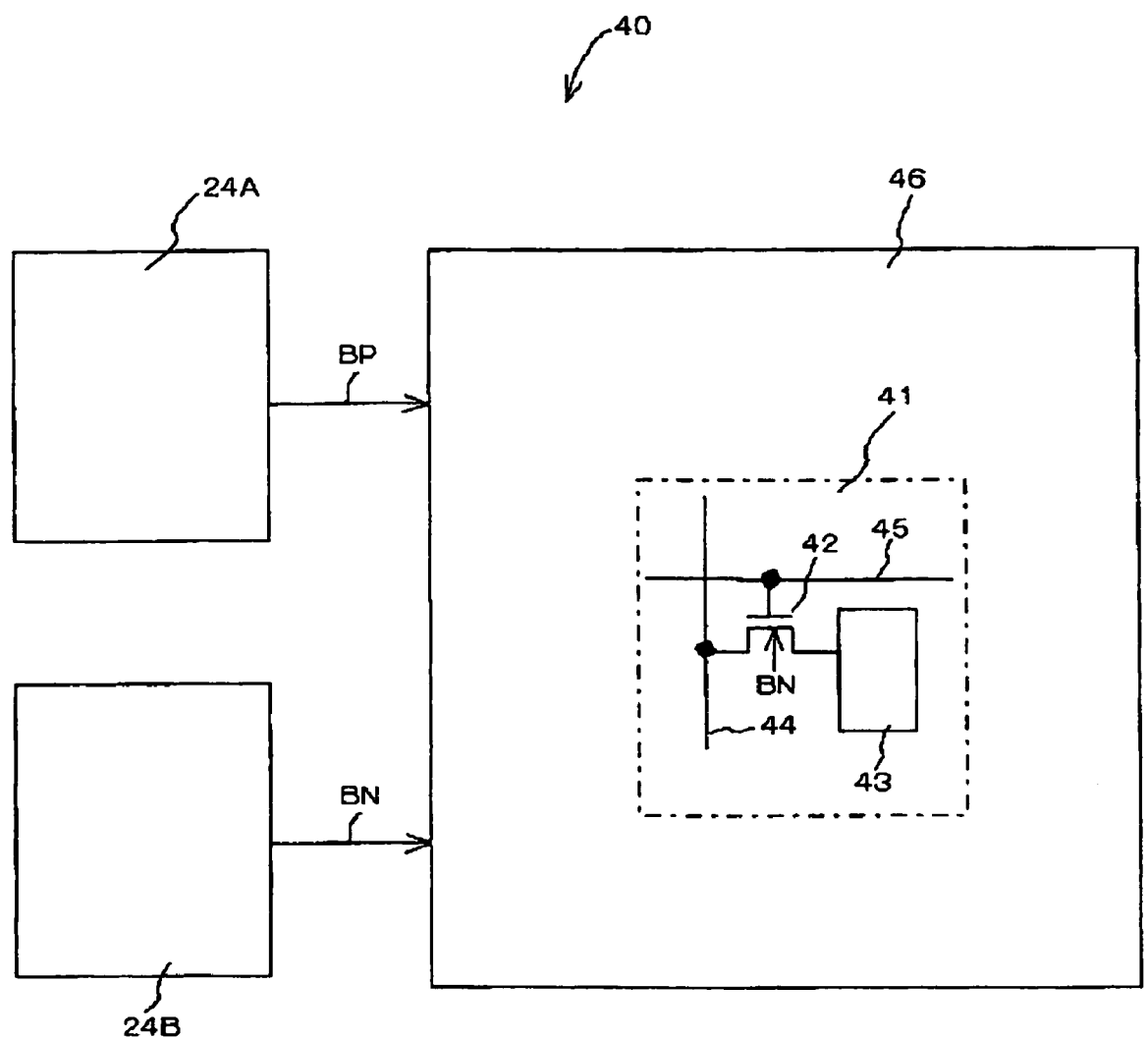
FIG. 13 is a circuit diagram showing semiconductor integrated circuit apparatus according to the sixth embodiment of the invention.

FIG. 13 is a circuit diagram showing semiconductor integrated circuit apparatus 40 according to the sixth embodiment. As shown in FIG. 13, the semiconductor integrated circuit apparatus 40 comprises the circuits 24A, 24B generating a constant drain current (Ids) shown in the first embodiment and integrated circuit main body 46 incorporating a memory circuit 41 (only one memory cell is shown). The substrate voltages BP, BN of the circuits 24A, 24B generating a constant drain current (Ids) are connected to the respective substrate voltages of the n-type and p-type MOSFETS of the memory circuit in the integrated circuit main body 36.

The memory circuit 41 comprises at least a transfer gate including an n-type MOSFET 42, a memory storage device 43, a bit line 44, and a word line 45. The memory storage device 43 may be a capacitor of DRAM or a CMOS inverter of SRAM. As the DRAM and SRAM are provided a large number of memory circuits 41 shown in FIG. 13.

The drain of the n-type MOSFET 42 is connected to the memory storage device 43. The source of the n-type MOSFET 42 is connected to the bit line 44. The gate of the n-type MOSFET 42 is connected to the word line 45.

In this way, the circuits 24A, 24B generating a constant drain current (Ids) supplies substrate voltages BP, BN to the integrated circuit main body 46 to control the voltage value across the source and substrate of the n-type MOSFET 42 in the memory circuit 41 and other p-type or n-type MOSFETs (not shown) so that the drain current for an arbitrary gate voltage value in a subthreshold region will be free from temperature dependence and process variation dependence, thus preventing memory data from being corrupted due to a leakage current in the subthreshold region.

(Seventh Embodiment)

Figure 14:
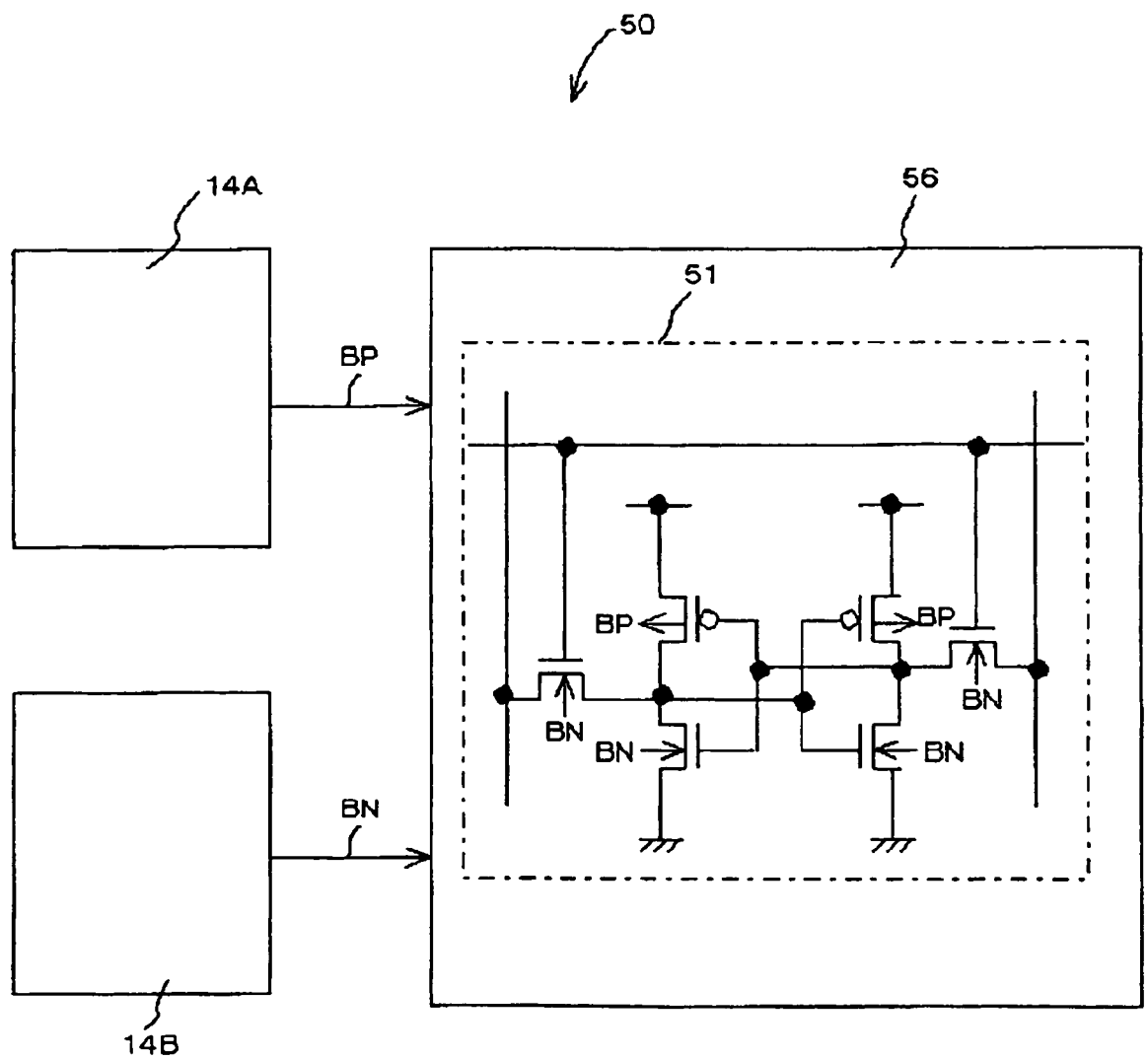
FIG. 14 is a circuit diagram showing semiconductor integrated circuit apparatus according to the seventh embodiment of the invention.

FIG. 14 is a circuit diagram showing semiconductor integrated circuit apparatus 50 according to the seventh embodiment. As shown in FIG. 14, the semiconductor integrated circuit apparatus 50 comprises the circuits 14A, 14B generating a constant threshold value (Vth) shown in the first and second embodiments and integrated circuit main body 56 incorporating a feedback buffer 31 incorporating an SRAM circuit 51 (only one memory cell is shown).

The substrate voltages BP, BN of the circuits 14A, 14B generating a constant threshold value (Vth) are connected to the respective substrate voltages of the n-type and p-type MOSFETS of the SRAM circuit 51 in the integrated circuit main body 56.

The advantage of using the circuits 14A, 14B generating a constant threshold value (Vth) in this embodiment will be described with relation to the evaluation result by a specific example.

Figure 15:
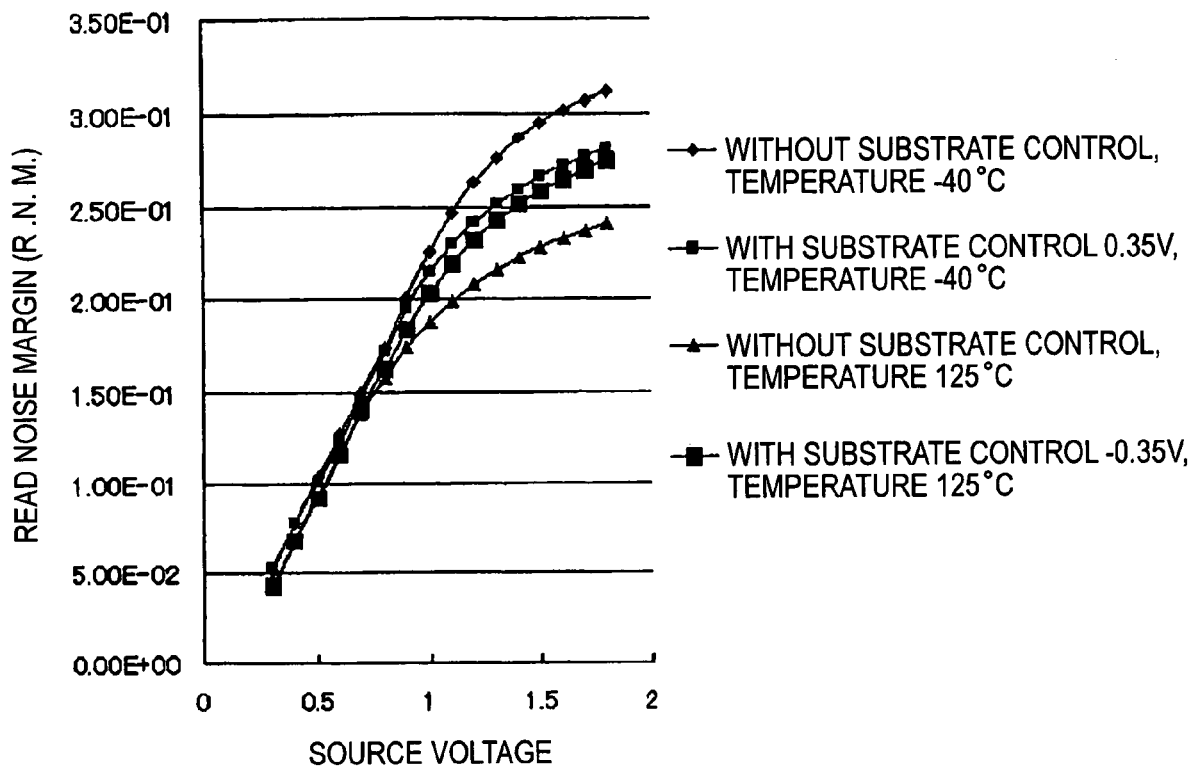
FIG. 15 is a graph showing the simulation result of the read noise margin of SRAM in the semiconductor integrated circuit apparatus according to the seventh embodiment of the invention.

FIG. 15 shows the source voltage and the read noise margin of SRAM at each of the high and low temperatures for a case where a substrate voltage is not applied and a case where a substrate voltage is applied so that Vth will be constant.

Figure 16:
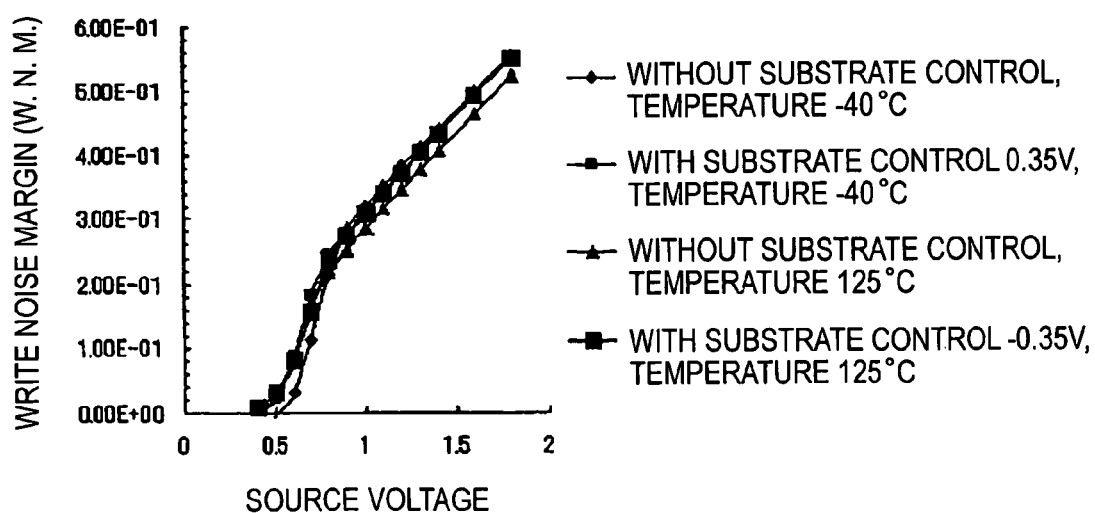
FIG. 16 is a graph showing the simulation result of the write noise margin of SRAM in the semiconductor integrated circuit apparatus according to the seventh embodiment of the invention.

FIG. 16 shows a similar graph of the temperature dependence of the write noise margin of SRAM. The figure shows the effect of reduction of the temperature dependence of the write noise margin at low voltages by the application of an optimum substrate voltage. That is, operation is allowed at low voltages thus reducing the power consumption of SRAM.

(Eighth Embodiment)

Figure 17:
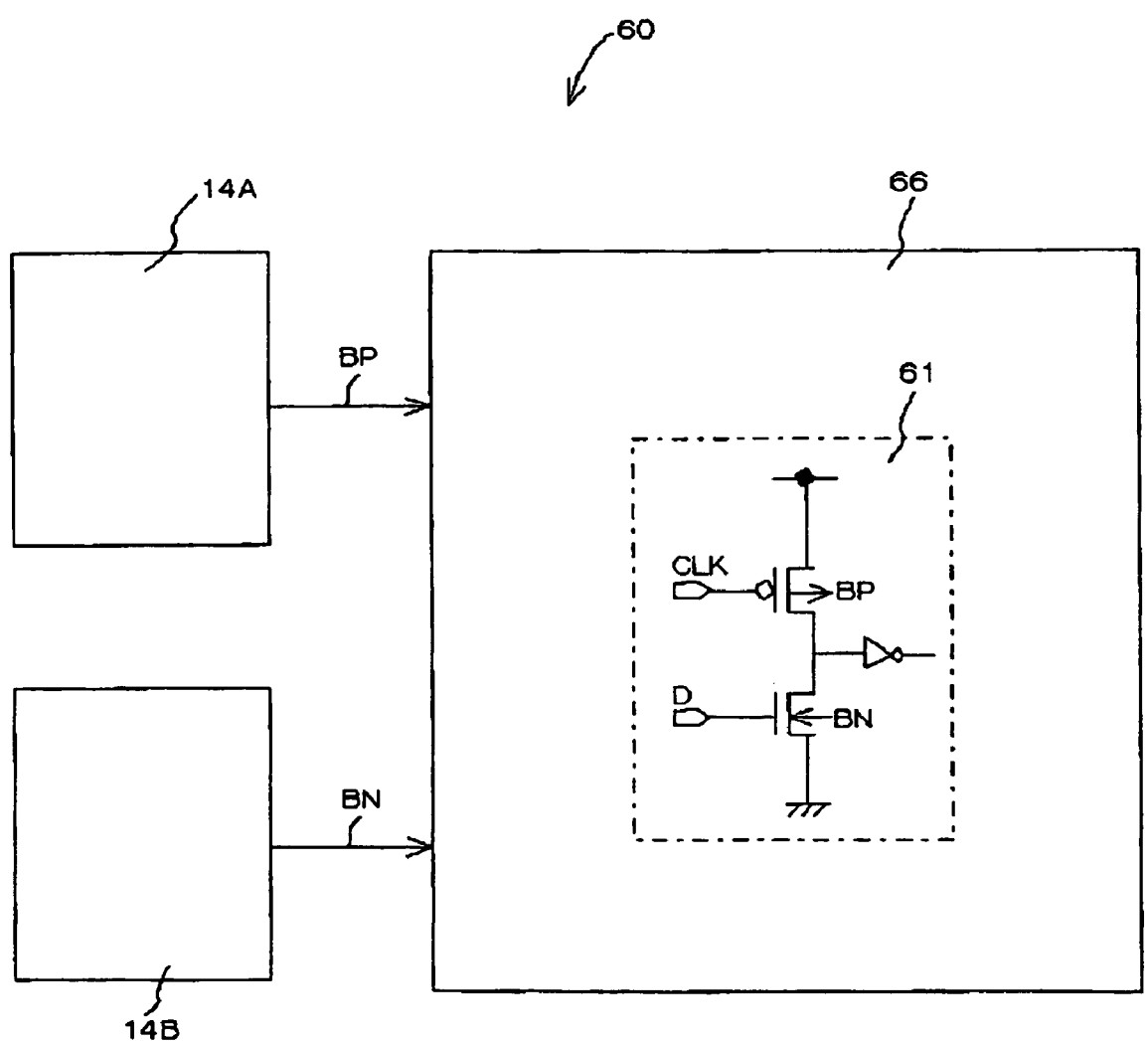
FIG. 17 is a circuit diagram showing semiconductor integrated circuit apparatus according to the eighth embodiment of the invention.

FIG. 17 is a circuit diagram showing semiconductor integrated circuit apparatus 60 according to the eighth embodiment.

As shown in FIG. 17, the semiconductor integrated circuit apparatus 60 uses the output voltages BP, BN of the circuits 14A, 14B generating a constant threshold value (Vth) as the substrate voltages of the timing borrow circuit 61. D in the timing borrow circuit 61 represents data input and CLK clock input.

The static noise margin of the timing borrow circuit 61 is determined by Vth of the n-type MOSFET. In other words, it is possible to reduce temperature dependence and process variation dependence by using the circuits 14A, 14B generating a constant threshold value (Vth). As shown in the seventh embodiment, the leakage current is also reduced.

(Ninth Embodiment)

Figure 18:
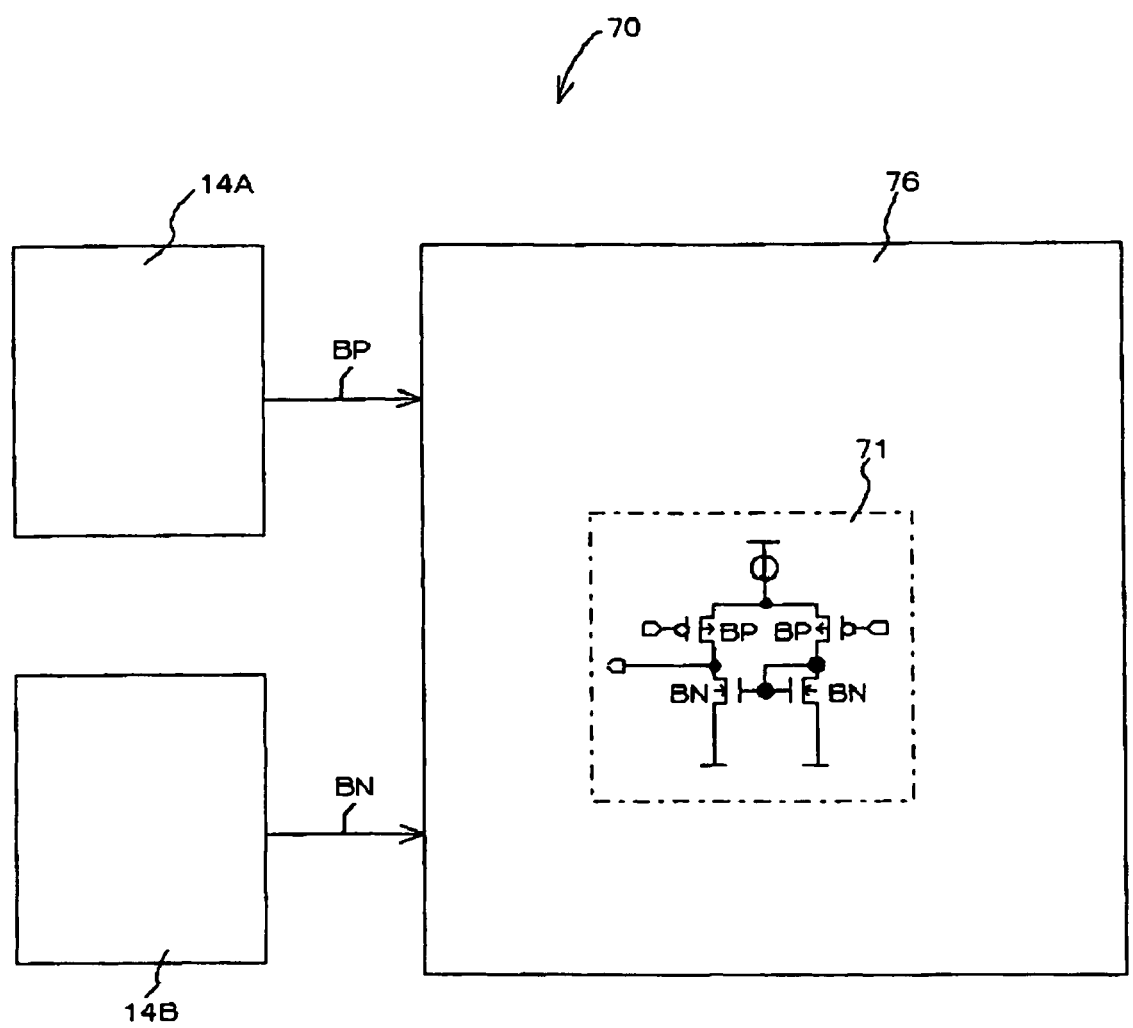
FIG. 18 is a circuit diagram showing semiconductor integrated circuit apparatus according to the ninth embodiment of the invention.

FIG. 18 is a circuit diagram showing semiconductor integrated circuit apparatus 70 according to the ninth embodiment.

As shown in FIG. 18, the semiconductor integrated circuit apparatus 70 uses the output voltages BP, BN of the circuits 14A, 14B generating a constant threshold value (Vth) as the substrate voltages of the MOSFETs of the differential operational amplifier 71 in the integrated circuit main body 76. In case the Vth of the n-type MOSFETs are varied, the output voltage of the differential operational amplifier is above Vth so that the output voltage depends on Vth.

However, in case the circuits 14A, 14B generating a constant threshold value (Vth) are used, Vth is kept constant so that the output voltage of the differential operational amplifier does not depend on Vth but is constant. With this configuration, the temperature dependence and process variation dependence of the lower limit voltage in the output range of the differential operational amplifier are reduced.

(Tenth Embodiment)

Figure 19:
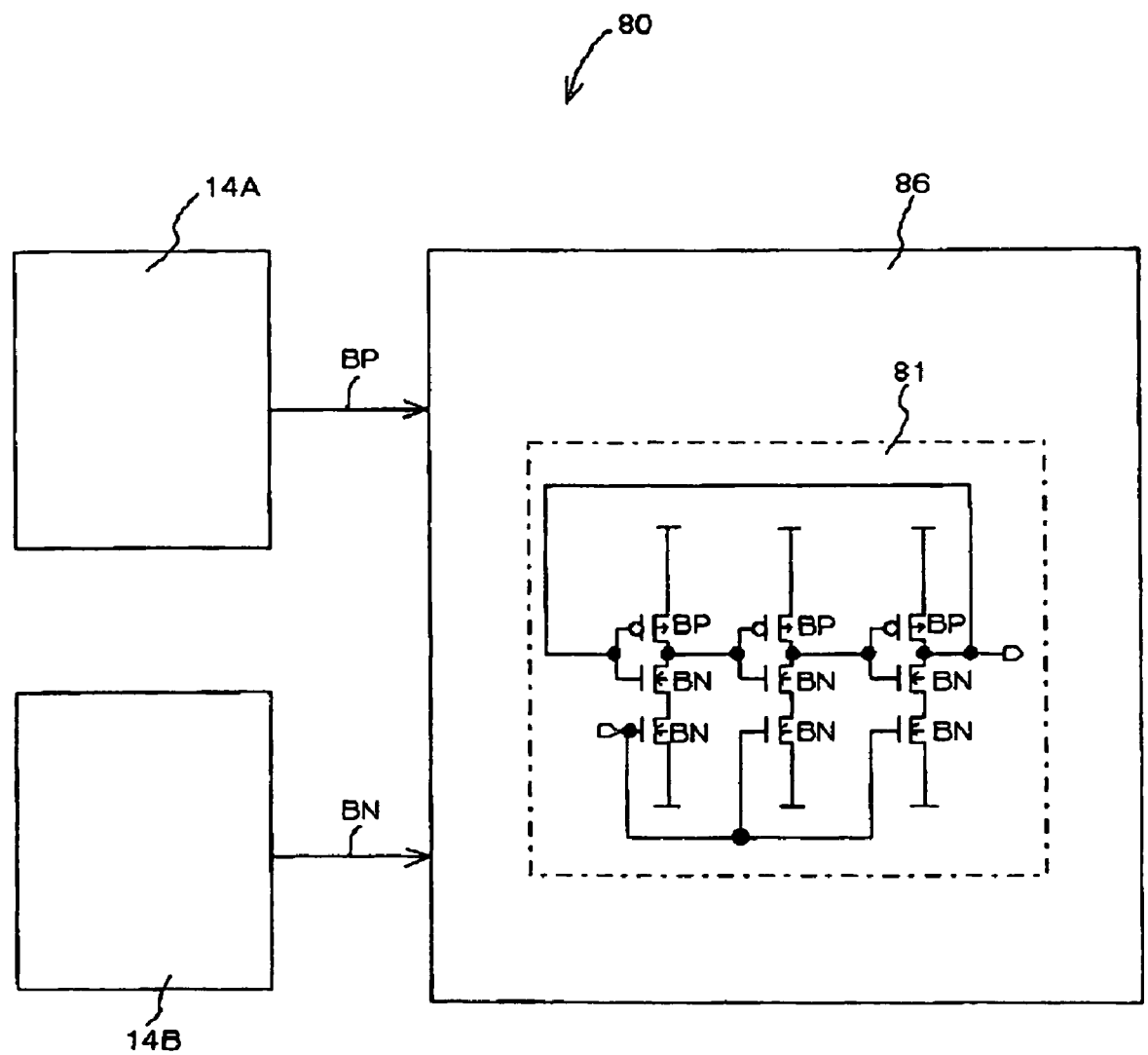
FIG. 19 is a circuit diagram showing semiconductor integrated circuit apparatus according to the tenth embodiment of the invention.

FIG. 19 is a circuit diagram showing semiconductor integrated circuit apparatus 80 according to the tenth embodiment.

As shown in FIG. 19, the semiconductor integrated circuit apparatus 80 uses the output voltages BP, BN of the circuits 14A, 14B generating a constant threshold value (Vth) as the substrate voltages of the MOSFETs of the VCO (Voltage-controlled Oscillator) 81 in the integrated circuit main body 86. In case the gate of the MOSFET to supply a bias voltage depends on a threshold value, the frequency response with respect to the input voltage is varied.

By using the output of the circuits generating a constant threshold value (Vth) as the substrate voltage of the MOSFET, the temperature dependence and process variation dependence of the frequency response with respect to the input voltage are reduced.

The circuit shown in FIG. 19 is an example. The tenth embodiment is applicable to all VCOs where the input voltage is input to the gate of MOSFET.

(Eleventh Embodiment)

Figure 20:
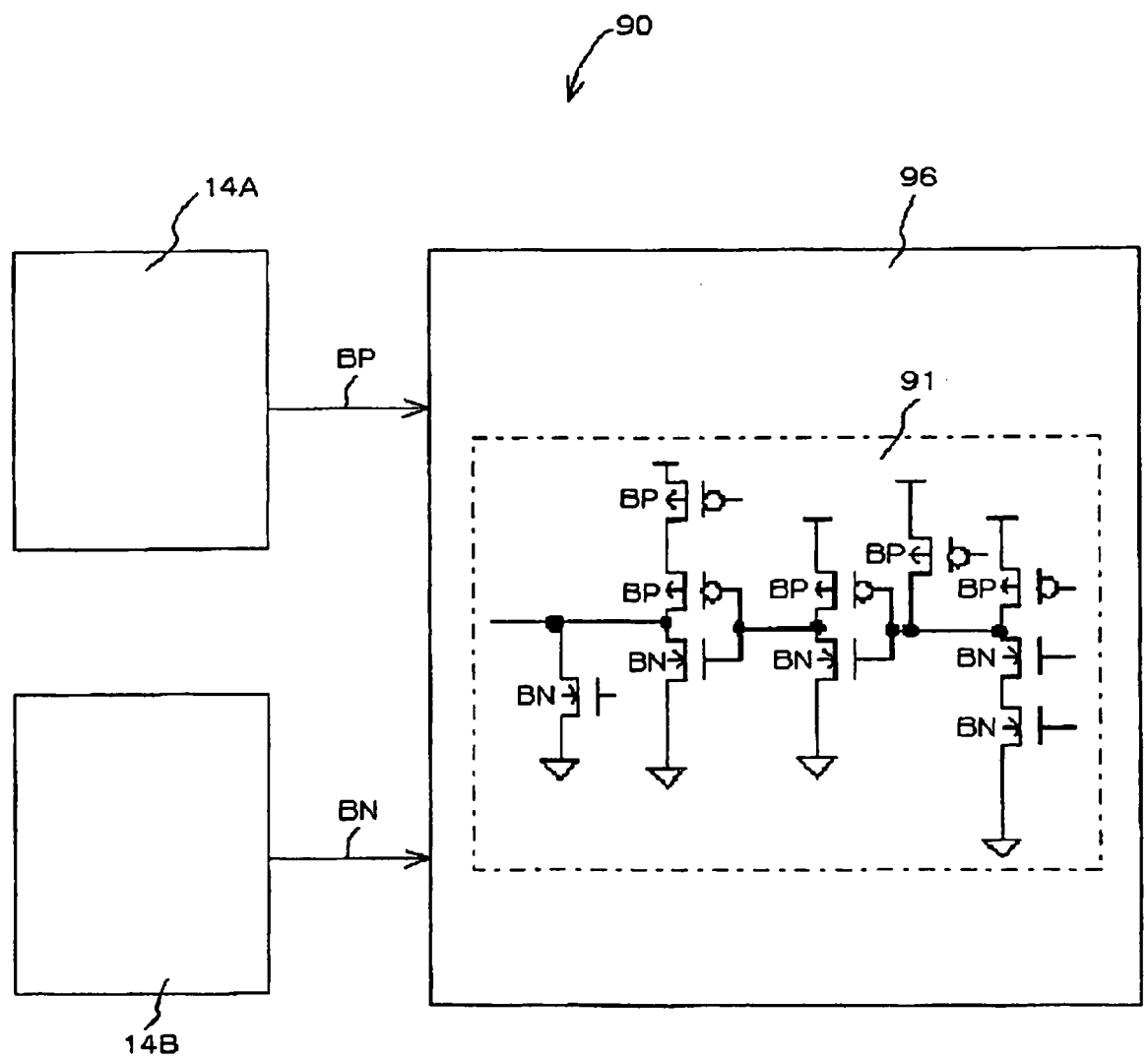
FIG. 20 is a circuit diagram showing semiconductor integrated circuit apparatus according to the eleventh embodiment of the invention.

FIG. 20 is a circuit diagram showing semiconductor integrated circuit apparatus 90 according to the eleventh embodiment.

As shown in FIG. 20, the semiconductor integrated circuit apparatus 90 uses the output voltages BP, BN of the circuits 14A, 14B generating a constant threshold value (Vth) as the substrate voltage of the CMOS logic circuit 91 in the integrated circuit main body 96. The delay value of the CMOS logic circuit 91 is di/dt=CV so that the temperature dependence and process variation dependence of delay are reduced.

The circuit shown in FIG. 20 is an example of CMOS logic circuit. The eleventh embodiment is applicable to all CMOS logic circuits of any logic configuration.

(Twelfth Embodiment)

Figure 21:
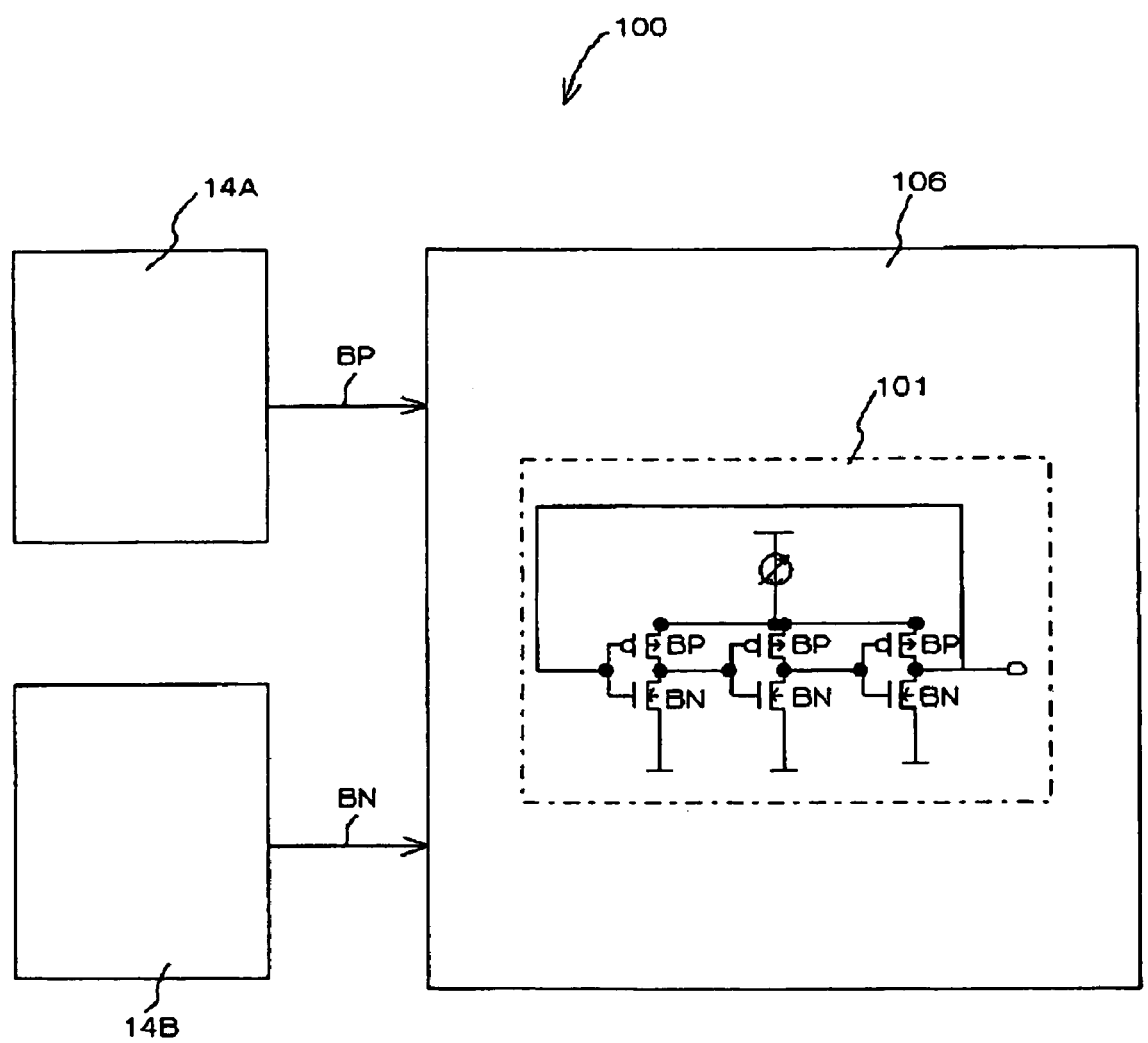
FIG. 21 is a circuit diagram showing semiconductor integrated circuit apparatus according to the twelfth embodiment of the invention.

FIG. 21 is a circuit diagram showing semiconductor integrated circuit apparatus 100 according to the tenth embodiment.

As shown in FIG. 21, the semiconductor integrated circuit apparatus 100 uses the output voltages BP, BN of the circuits 14A, 14B generating a constant threshold value (Vth) as the substrate voltage of the inverter of the CCO (Current-controlled Oscillator) 101 in the integrated circuit main body 106.

With this configuration, same as the eleventh embodiment, the delay value of the circuit is kept constant, thereby reducing the temperature dependence and process variation dependence of the oscillating frequency of the CCO 101.

(Thirteenth Embodiment)

Figure 22:
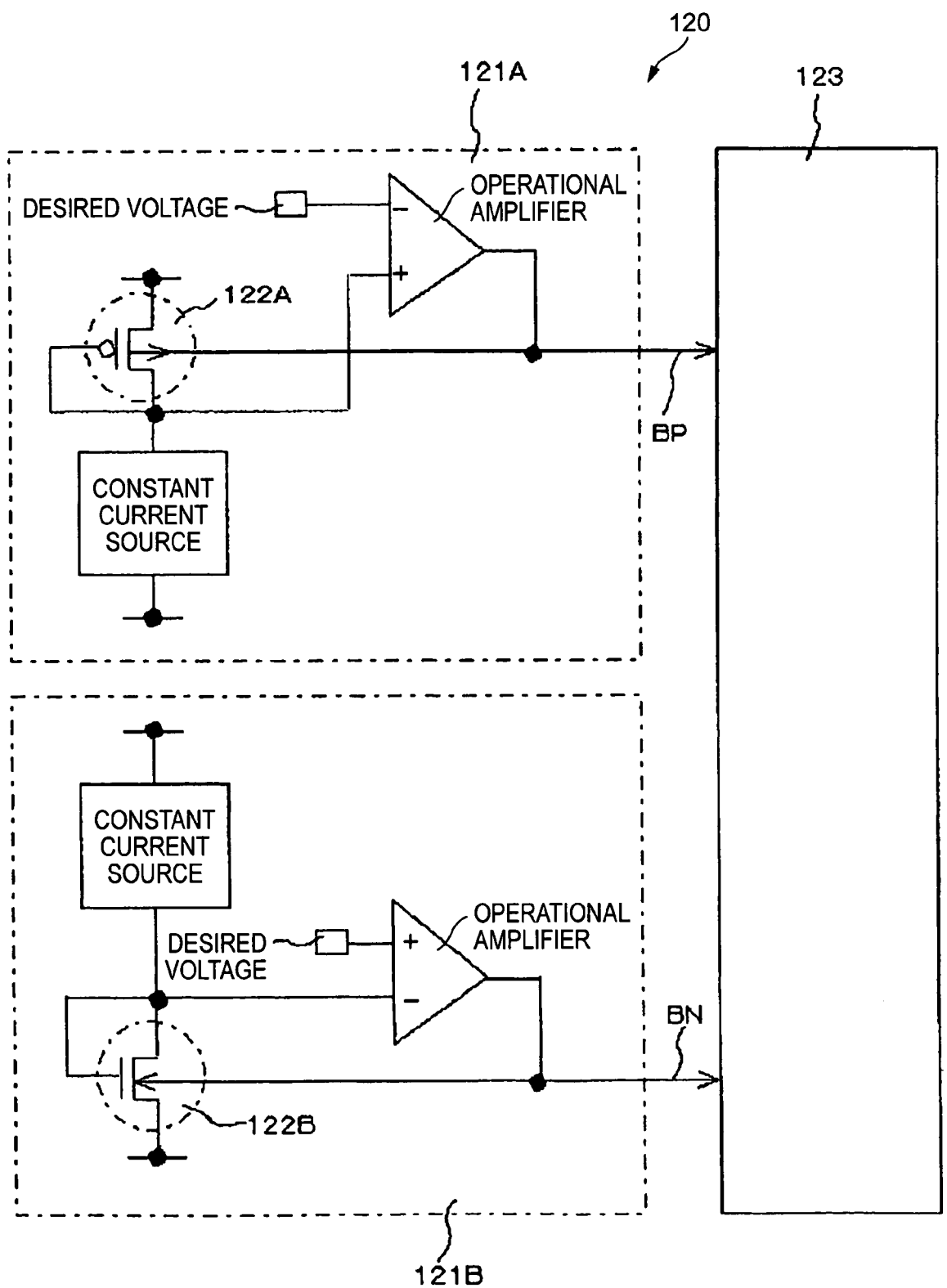
FIG. 22 is a circuit diagram showing semiconductor integrated circuit apparatus according to the thirteenth embodiment of the invention.

FIG. 22 is a circuit diagram showing semiconductor integrated circuit apparatus 100 according to the thirteenth embodiment.

As shown in FIG. 22, in the circuits 121A, 121B generating a constant gm (transconductance: the ratio of the variation in the drain current with respect to the variation in the gate voltage), the gate and the drain are connected to each other on the p-type MOSFET 122A and the n-type MOSFET 122B. In case the gate and the drain are connected to each other, it is possible to approximate the substrate voltage to the gm of the transistor.

By setting a desired voltage as the reference voltage of the operational amplifier, it is possible to provide a circuit generating a constant gm in the neighborhood of a predetermined voltage value. By applying this configuration to a circuit generating a constant gm of the transistor in the integrated circuit main body 122, for example a current mirror circuit, it is possible to keep constant the gm of the transistor so that the temperature dependence and process variation dependence of the semiconductor integrated circuit apparatus will be eliminated.

(Fourteenth Embodiment)

The fourteenth embodiment will hereinafter be described. As an example of this embodiment, FIG. 26 shows an example of a multi-port register file such that the aforesaid circuit generating a constant threshold value (Vth) and circuit generating a constant Ids are mounted together in the integrated circuit main body.

Figure 26:
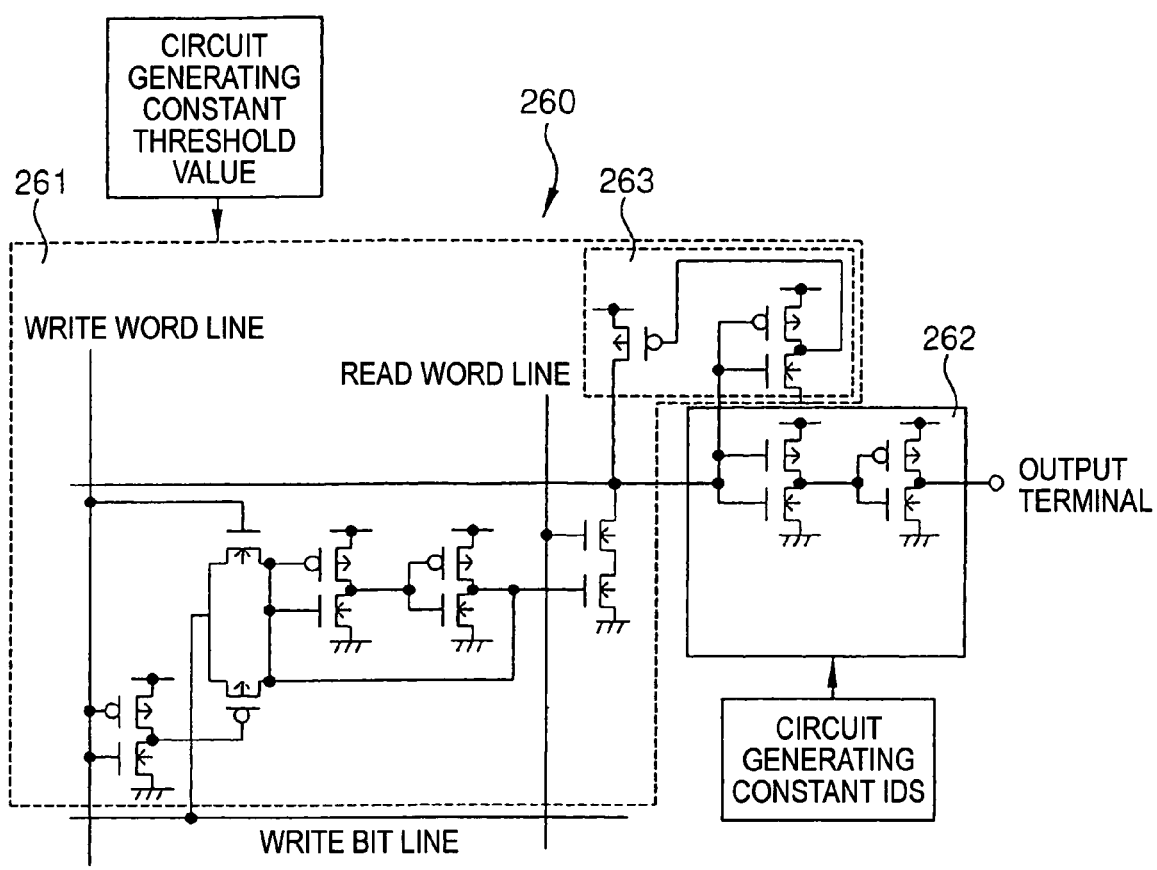
FIG. 26 is a circuit diagram showing a multi-port register file that is an example of semiconductor integrated circuit apparatus according to the fourteenth embodiment of the invention.

The multi-port register file 260 shown in FIG. 26 comprises a memory cell section 261 and a read data output circuit 262.

The circuit operation of this multi-port register file 260 will hereinafter be described.

In the memory cell section 261, when a write word line is activated, data is written thereinto via a write bit line.

Besides, a data read from the memory cell section 261 is performed such that when a read word line is activated, data is read out into a read bit line and this read data is further amplified by the read data output circuit and outputted to the external through an output terminal.

In this multi-port register file, the substrates of the individual MOSFETs, of the memory cell section 261 and of a keeper section 263 for holding the data in the read bit line, are connected to the circuit generating a constant threshold value (Vth).

Besides, the substrates of individual MOSFETs constituting the read data output circuit 262 are connected to the circuit generating a constant Ids.

Thus, in the multi-port register file 260 shown in FIG. 26, the circuit generating a constant threshold value (Vth) is used to regulate the substrate voltage of, for example, a circuit section having a comparatively low noise margin (or a sensitive circuit section) such as the memory cell section 261. The circuit generating a constant Ids (drain current) is used in, for example, the read data output circuit 262 that comprises a CMOS etc., has a comparatively high noise margin and is required for high-speed operation.

That is, the circuit generating a constant threshold value (Vth) is used to regulate the substrate voltage of a portion having a noise margin lower than a predetermined value. The circuit generating a constant Ids (drain current) is used to regulate the substrate voltage of a portion having a noise margin higher than the predetermined value.

Thereby, stable operation can be realized without loosing the high-speed properties of the integrated circuit main body. Furthermore, the delay and electrical power having less temperature dependence can be realized.

Figure 27:
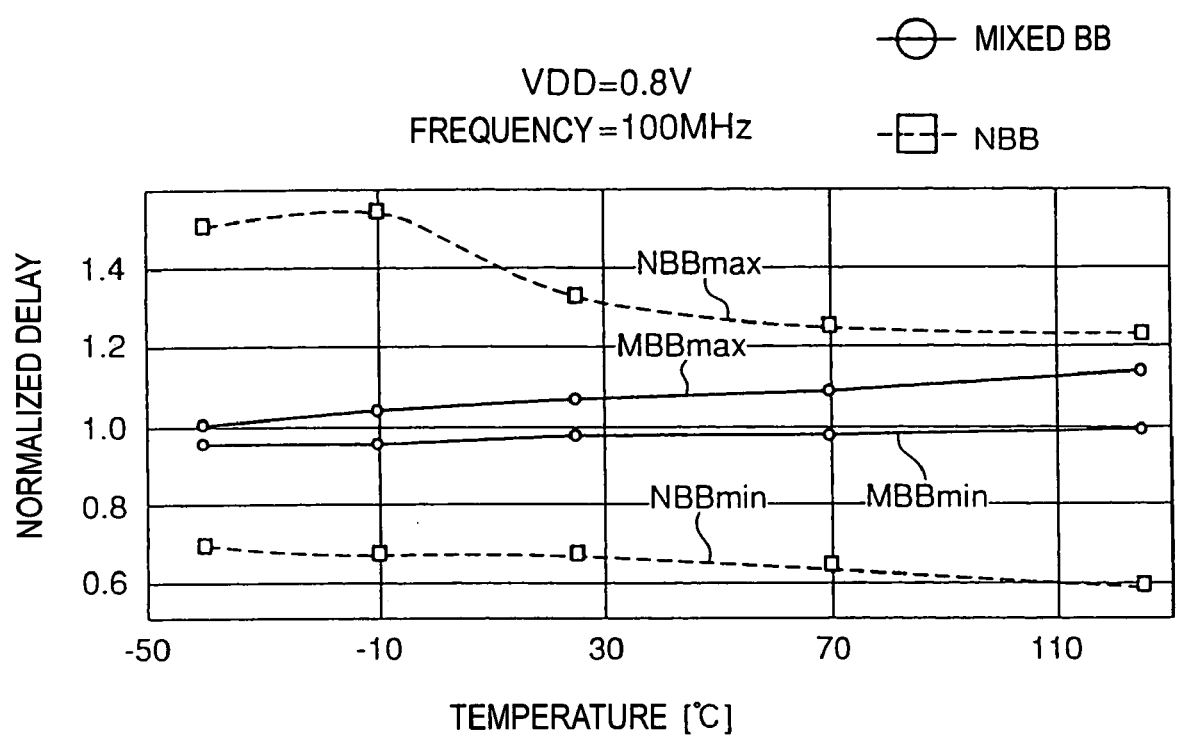
FIG. 27 is temperature characteristics of a relative value of delay time for a data read (Normalized Delay) in the multi-port register file having the configuration of FIG. 26.
Figure 28:
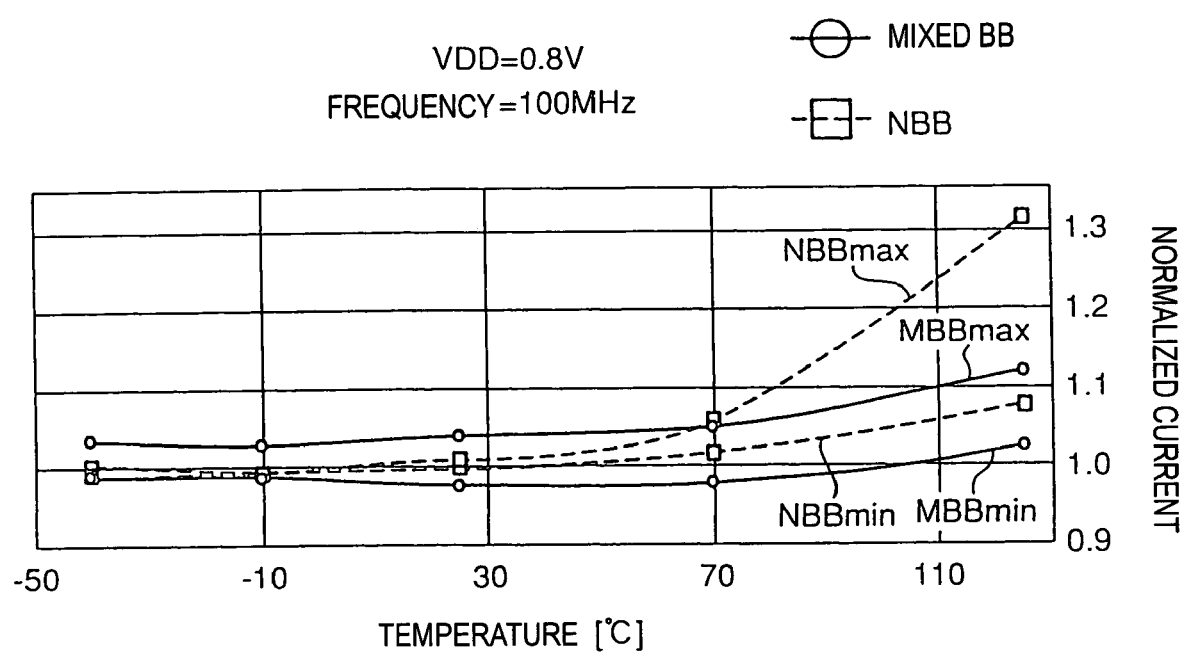
FIG. 28 is temperature characteristics of a relative value of current consumption during operation (Normalized Current) in the multi-port register file having the configuration of FIG. 26.

Next, the multi-port register file having the aforesaid configuration of FIG. 26 is actually manufactured by way of trial and the measured results are shown in FIGS. 27 and 28.

FIG. 27 shows the temperature characteristics of the relative value of delay time for a data read (Normalized Delay).

FIG. 28 shows the temperature characteristics of the relative value of current consumption during operation (Normalized Current).

MBB (Mixed BB) is the measurement result obtained when the circuit generating a constant threshold value (Vth) is used for the memory cell section 261 and the circuit generating a constant Ids (drain current) is used for the read data output circuit 262.

NBB is the measurement result obtained when the substrate voltage is not changed without operating the circuit generating a constant threshold value (Vth) or the circuit generating a constant Ids, that is, when the substrate potential is set to be equal in potential to a source voltage of MOSFET.

Upon trial manufacture, two wafers are made on an experimental basis: a wafer subjected to a process condition such as to intentionally cause the threshold voltage to deviate about +10% from a target threshold voltage, and a wafer subjected to a process condition such as to intentionally cause the threshold voltage to deviate about −10% from a target threshold voltage.

A plurality of chips are formed on these two wafers. Under the condition that VDD=0.8 V and an operating frequency (Freq.)=100 MHz, the plurality of chips are each measured for the temperature characteristics of delay time for a data read and the temperature characteristics of current consumption during operation.

In the wafer subjected to the process condition of about −10% deviation, the relative value of a chip having the fastest delay time (FIG. 27) and the relative value of a chip having the largest current consumption during operation (FIG. 28) are indicated by MBBmax and NBBmax, respectively. In the wafer subjected to the process condition of about +10% deviation, the relative value of a chip having the slowest delay time (FIG. 27) and the relative value of a chip having the smallest current consumption during operation (FIG. 28) are indicated by MBBmin and NBBmin, respectively.

As seen from the result of FIG. 27, the difference between the maximum and minimum values of delay time in case where the substrate voltage is always constant (NBB) is lower than the difference between the maximum and minimum values of delay time in case where the circuit generating a constant threshold value (Vth) and the circuit generating a constant Ids are mounted together (MBB (Mixed BB)). For example, when the temperature is 125° C., the aforesaid difference between the maximum and minimum values is reduced to about 75%.

Besides, as seen from the result of FIG. 28, the difference between the maximum and minimum values of current consumption during high-temperature operation in case where the substrate voltage is always constant (NBB) is large. However, the aforesaid difference between the maximum and minimum values in case where the circuit generating a constant threshold value (Vth) and the circuit generating a constant Ids are mounted together (MBB (Mixed BB) is reduced about 27% when the temperature is 125° C. as compared with NBB.

Figure 29:
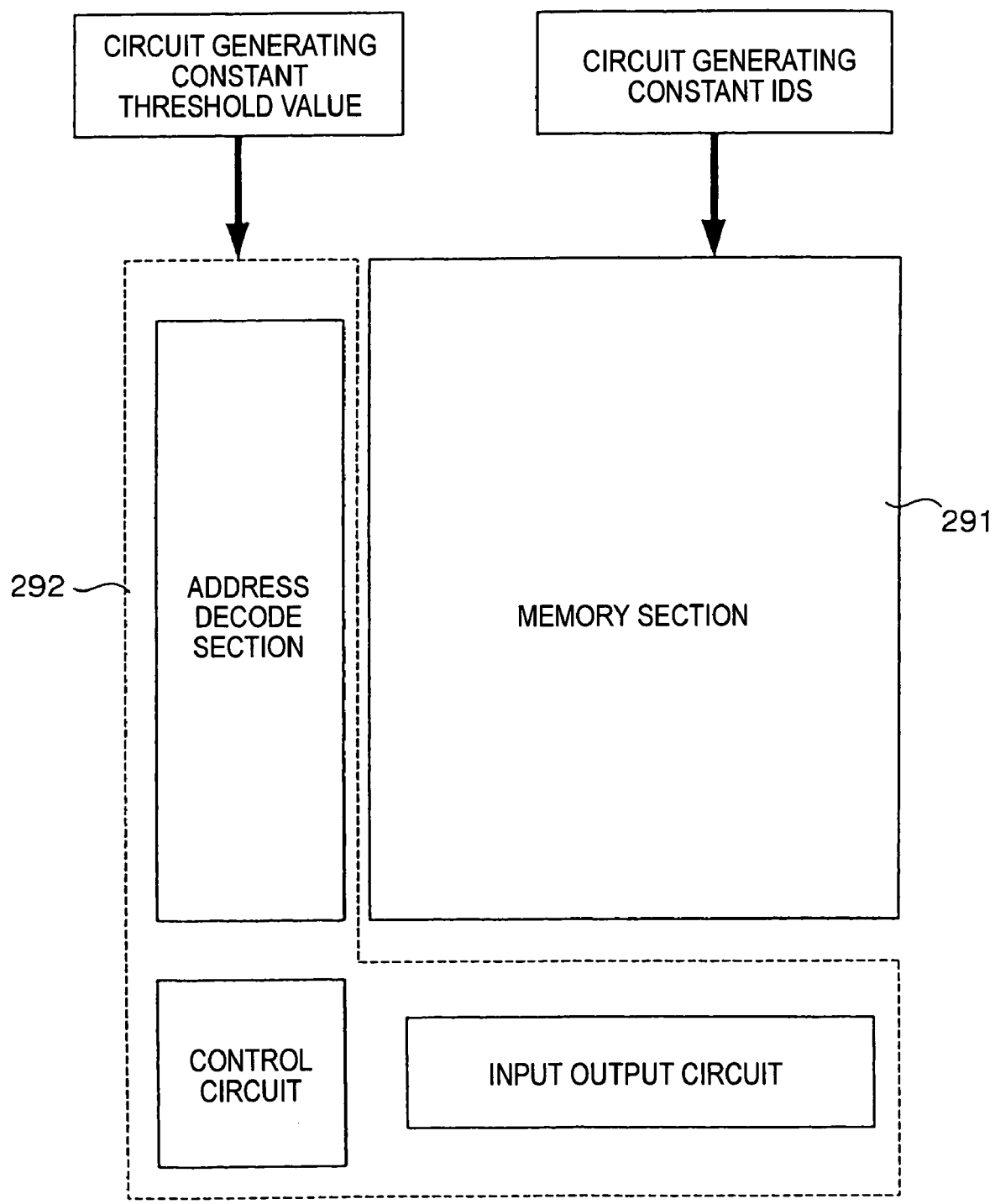
FIG. 29 is a schematic diagram showing an example in which the semiconductor integrated circuit apparatus according to the fourteenth embodiment of the invention is applied to an SRAM circuit.

Furthermore, an example that is applied to a general SRAM circuit will be cited in FIG. 29 and described as another example such that the aforesaid circuit generating a constant threshold value (Vth) and circuit generating a constant Ids are mounted together in the integrated circuit main body.

As shown in FIG. 29, a memory section 291 and a peripheral section 292, whose respective substrates are separated from each other, are configured such that different substrate voltages are applicable.

That is, the circuit generating a constant threshold value (Vth) is connected to the memory section 291 having a comparatively low noise margin (or being sensitive). The circuit generating a constant Ids is connected to the peripheral section 292 including a portion that has a comparatively high noise margin and is required for high-speed operation of an input/output circuit or the like.

As aforesaid, in the fourteenth embodiment, the circuit generating a constant threshold value (Vth) and the circuit generating a constant Ids are mixed together and thus applied to regulation of the substrate potentials of various circuit sections, thereby enabling optimization of the characteristics of each circuit.

(Fifteenth Embodiment)

Figure 30:
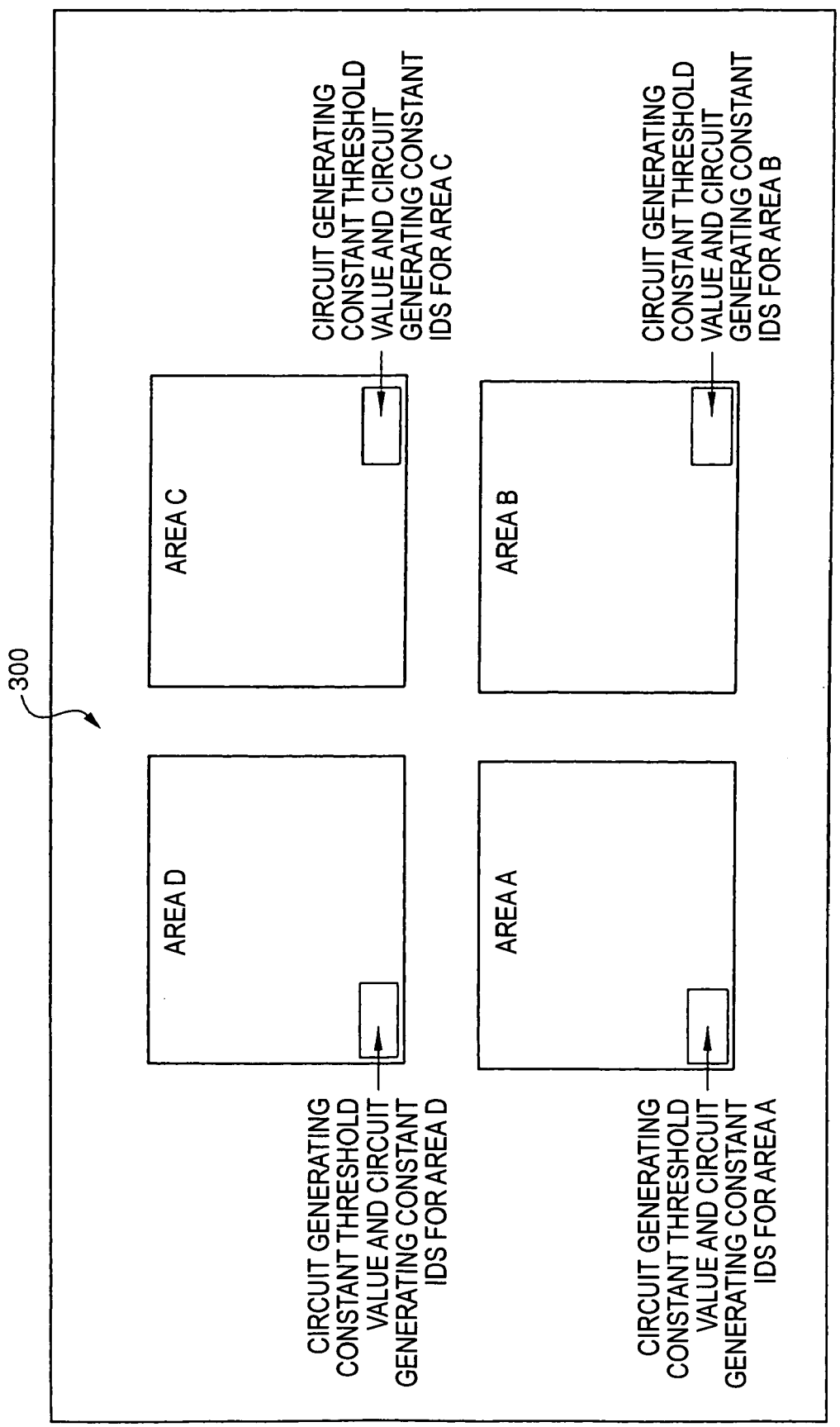
FIG. 30 is a diagram showing in schematic form the circuit layout of an integrated circuit main body according to the fifteenth embodiment of the invention.

FIG. 30 is a diagram showing in schematic form the circuit layout of an integrated circuit main body 300 of the fifteenth embodiment.

The integrated circuit main body 300 of this embodiment has its circuit region divided into a plurality of (four) regions that are areas A to D.

The circuit generating a constant threshold value (Vth) and the circuit generating a constant Ids are (or only any one of them may be) provided inside each of the areas A to D or in the vicinity of each of the regions.

The circuit generating a constant threshold value (Vth) and the circuit generating a constant Ids, which regulate the substrate potential of each of the regions, are thus provided in each of the areas A to D. Therefore, when there exist the local dependence of the ion dope of the drain and source at the time of MOSFET device formation, the local dependence of a gate oxide film pressure, or the like, MOSFET characteristics become different in each of the areas A to D.

Consequently, since monitor means inside each of the areas A to D reflects the characteristics of a MOSFET within the corresponding region, it is possible to appropriately regulate the substrate potential in correspondence to each of the areas A to D. Thus, it is possible to remove the nonuniformity of Vth and Ids of MOSFETs within the integrated circuit main body 300.

The plural monitor means of the circuit generating a constant threshold value (Vth) and the circuit generating a constant Ids for regulating the substrate potential may be provided inside of the each areas. These monitor means may connected in parallel, each of the monitor means may be monitored in time division. Further, if the monitor means are displaced in center and four corners of the area, it will be more effective.

(Sixteenth Embodiment)

Figure 31:
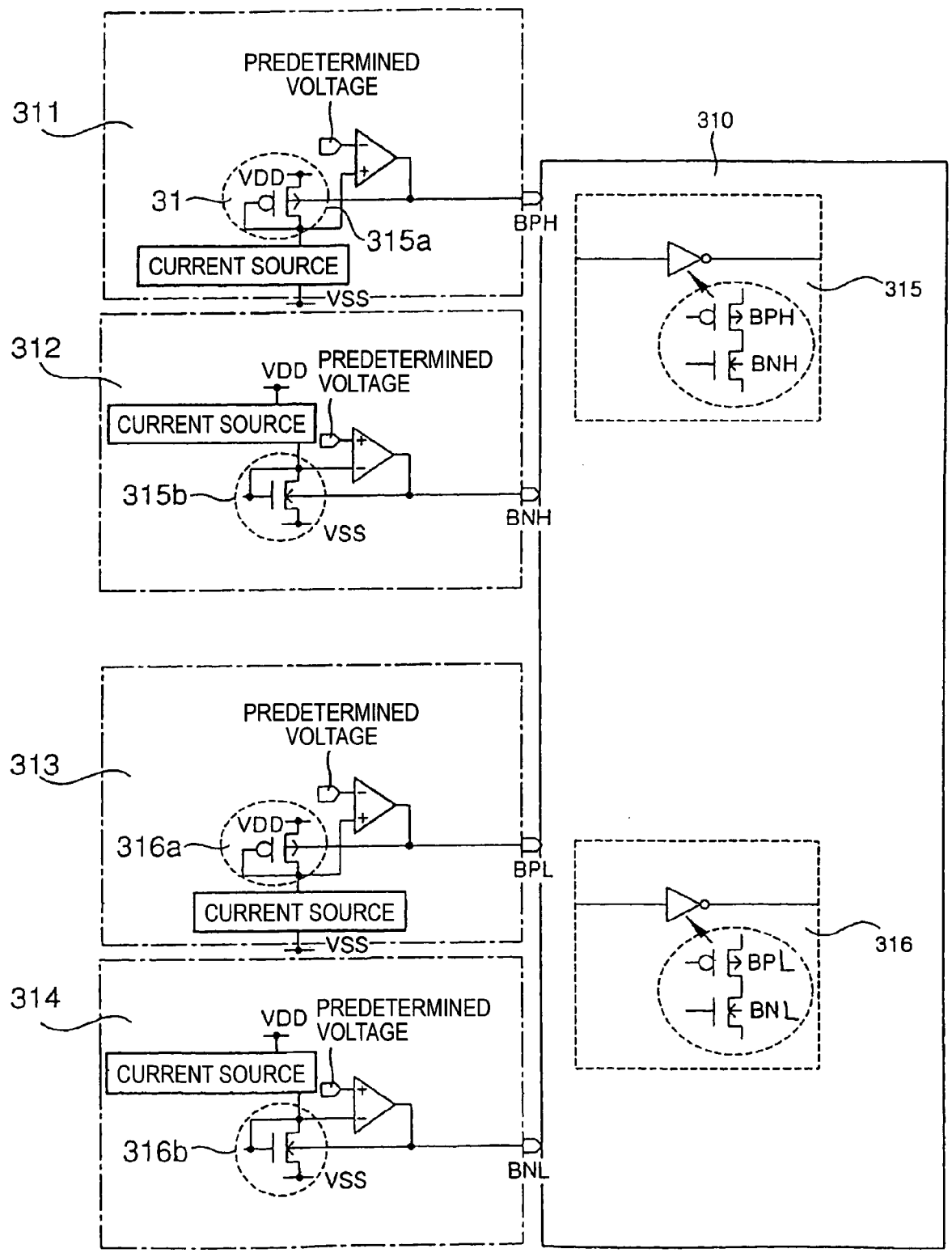
FIG. 31 is a diagram showing in schematic form the configuration of the sixteenth embodiment of the invention.

FIG. 31 is a diagram showing in schematic form the configuration of the sixteenth embodiment. As shown in FIG. 31, in this embodiment, an integrated circuit main body 310 is connected in which are mounted together (two in the example of the figure) MOSFET groups 315 (a high-Vth MOSFET), 316 (a low-Vth MOSFET) of the kinds different in device characteristics (substrate voltage dependence).

The aforesaid MOSFET groups 315, 316 comprise MOSFETs having substantially the same device characteristics. An output BPH of a circuit 311 generating a constant threshold value (Vth) of the p-type MOSFET and an output BNH of a circuit 312 generating a constant threshold value (Vth) of the n-type MOSFET, for regulating the high-Vth MOSFET, are connected to provide the substrate voltage of the MOSFET group 315.

Besides, an output BPL of a circuit 311 generating a constant threshold value (Vth) of the p-type MOSFET and an output BNL of a circuit 312 generating a constant threshold value (Vth) of the n-type MOSFET, for regulating the low-Vth MOSFET, are connected to provide the substrate voltage of the MOSFET group 316.

The monitor sections of the circuits 311, 312 generating a constant threshold value (Vth) use devices 315a, 315b corresponding to Vth of the MOSFET group 315 to which a substrate voltage is applied. The monitor sections of the circuits 313, 314 generating a constant threshold value (Vth) use devices 316a, 316b corresponding to Vth of the MOSFET group 316 to which a substrate voltage is applied.

By adopting such a configuration as aforesaid, it is possible to apply a substrate voltage value suitable for the threshold value (Vth), Ids value, and gm value required by individual MOSFETs different in device characteristics (substrate voltage dependence). Thus, distortion will not occur in a circuit noise margin or the like, so that stable operation can be realized.

(Seventeenth Embodiment)

The seventeenth embodiment has a frequency-voltage conversion circuit. The configuration is made such that the output of this frequency-voltage conversion circuit is applied to the gate of the MOSFET constituting the monitor means of the substrate voltage regulating means.

Figure 32:
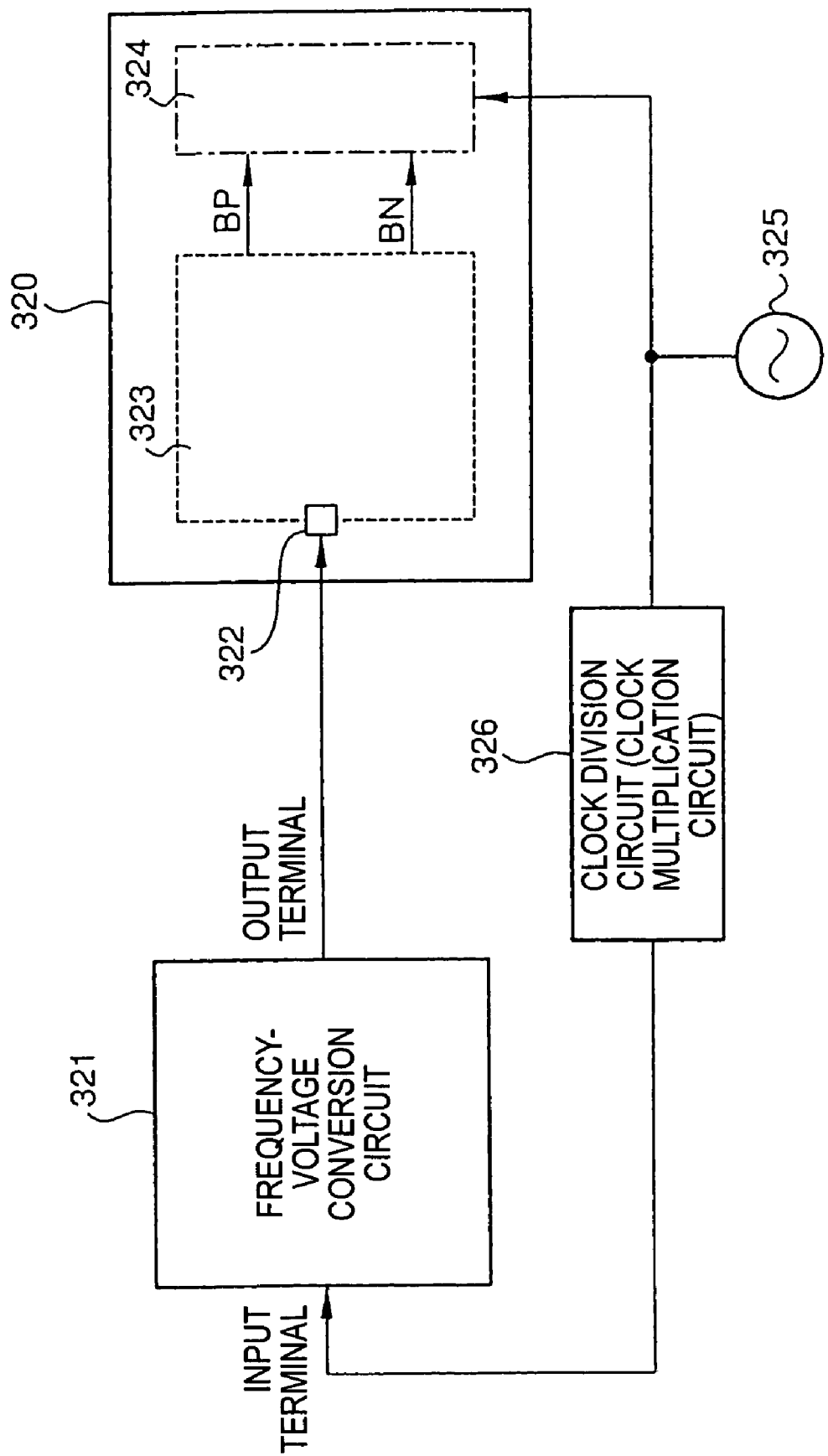
FIG. 32 is a block diagram showing the seventeenth embodiment of the invention.

FIG. 32 is a block diagram showing, as an example of this embodiment, an example in which the frequency-voltage conversion circuit 321 is connected to an input terminal 322 (corresponding to 17A of FIG. 1 for example) of a circuit 323 generating a constant threshold value (Vth).

A clock division circuit (or clock multiplication circuit) 326 for outputting a clock obtained by dividing (or multiplying) a clock provided from a clock oscillator 325 is connected to the input terminal of the frequency-voltage conversion circuit 321 so that an output clock of the clock division circuit 326 is inputted.

Additionally, instead of using this clock division circuit (or clock multiplication circuit) 326, a clock of the clock oscillator 325 may be inputted as it is. Otherwise, the output of the clock division circuit (or clock multiplication circuit) may be connected to the clock input of an integrated circuit main body 324. Clocks originating from the same clock oscillating source (clock oscillator 325) need only be supplied to the integrated circuit main body 324 and frequency-voltage conversion circuit 321 so that a clock to be supplied to the integrated circuit main body 324 is matched in phase with a clock to be supplied to the frequency-voltage conversion circuit 321.

Figure 33:
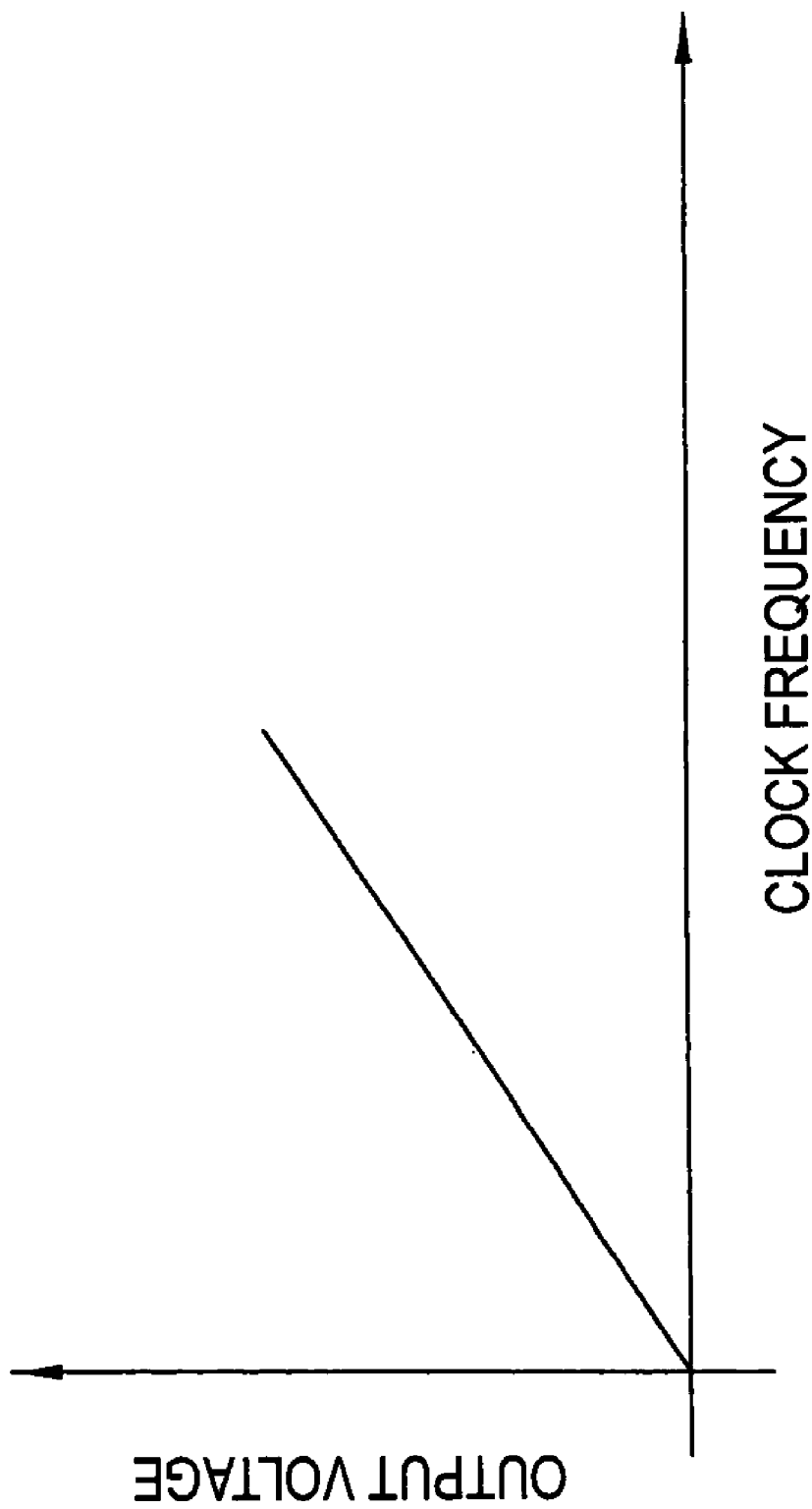
FIG. 33 is a graph showing the frequency-voltage conversion characteristics of a frequency-voltage conversion circuit of FIG. 32.

Besides, as shown in the graph of FIG. 33, the frequency-voltage conversion characteristic of the aforesaid frequency-voltage conversion circuit 321 is a characteristic such that a clock frequency inputted is converted into an output voltage value with a positive gradient.

Then, the frequency-voltage conversion circuit 321 comprises, for example, a D-A converter or a DC-DC conversion circuit.

With the aforesaid configuration, in this embodiment, the threshold value (Vth) regulated by the circuit generating a constant threshold value (Vth) can be set to be higher at the time of a clock low frequency than at the time of a clock high frequency for the integrated circuit main body 324. Thus, there is the advantage of reducing MOSFET device leakage during the use at a low frequency.

Additionally, the example in which the frequency-voltage conversion circuit 321 is a sequential circuit has been shown here. However, the circuit configuration or the like may be simplified to output a discrete value.

Besides, when the monitor means is a p-type MOSFET, as a matter of course, the frequency-voltage conversion circuit need only be configured such that the relationship between a frequency and an output voltage has a negative gradient.

Further, in this embodiment, example of application of the frequency-voltage conversion circuit in case that the substrate voltage regulating means is the circuit generating a constant threshold value (Vth), is described as aforementioned. However, in case that the substrate voltage regulating means is a GM constant circuit, if a value of the current source in 121 of FIG. 22 source is varied by the the frequency-voltage conversion circuit, needless to say, same effect as case of the circuit generating a constant threshold value (Vth) can be gained.

(Eighteenth Embodiment)

Figure 34:
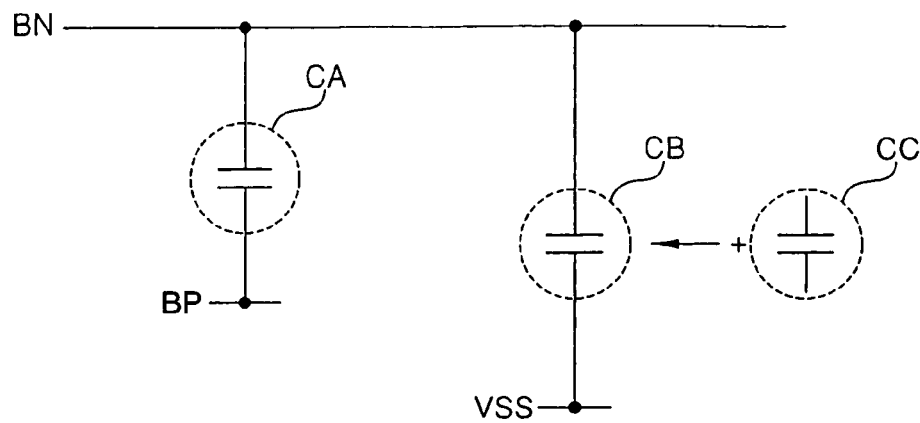
FIG. 34 is a schematic diagram A showing the characteristics of the eighteenth embodiment of the invention; a diagram B showing the variation of BN and variation of Vss produced when a capacity component CC is absent; a diagram C showing the variation of BP and variation of Vss produced when the capacity component CC is present.
Figure 34:
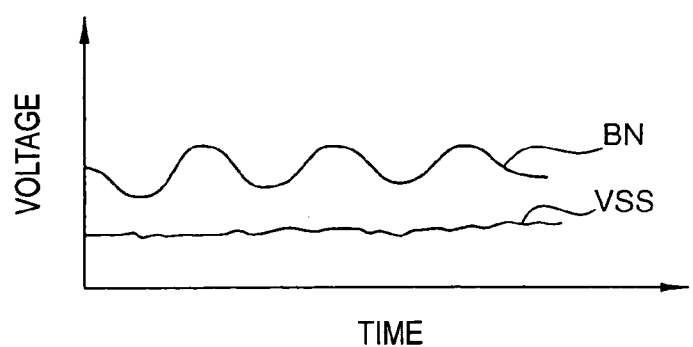
Figure 34:
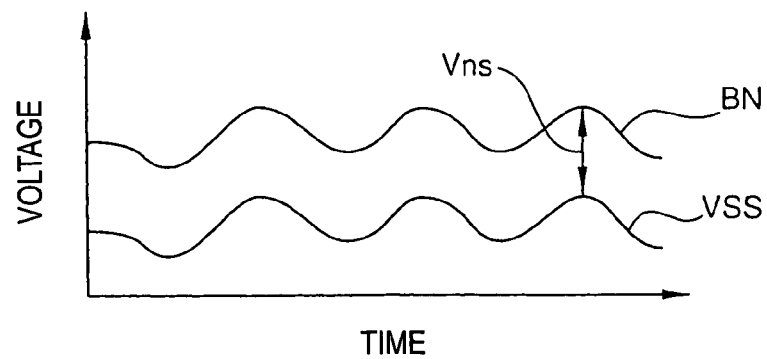

As shown in FIG. 34A, the eighteenth embodiment is characterized by the following in the relationship between an electric capacity CB between the substrate voltage BN of the n-type MOSFET within the integrated circuit main body and the ground potential Vss of the n-type MOSFET, and an electric capacity CA between the aforesaid substrate voltage BN and the substrate potential BP of the p-type MOSFET. That is, in such a relationship, a capacity component CC is added between these BN and BP.

Figure 35:
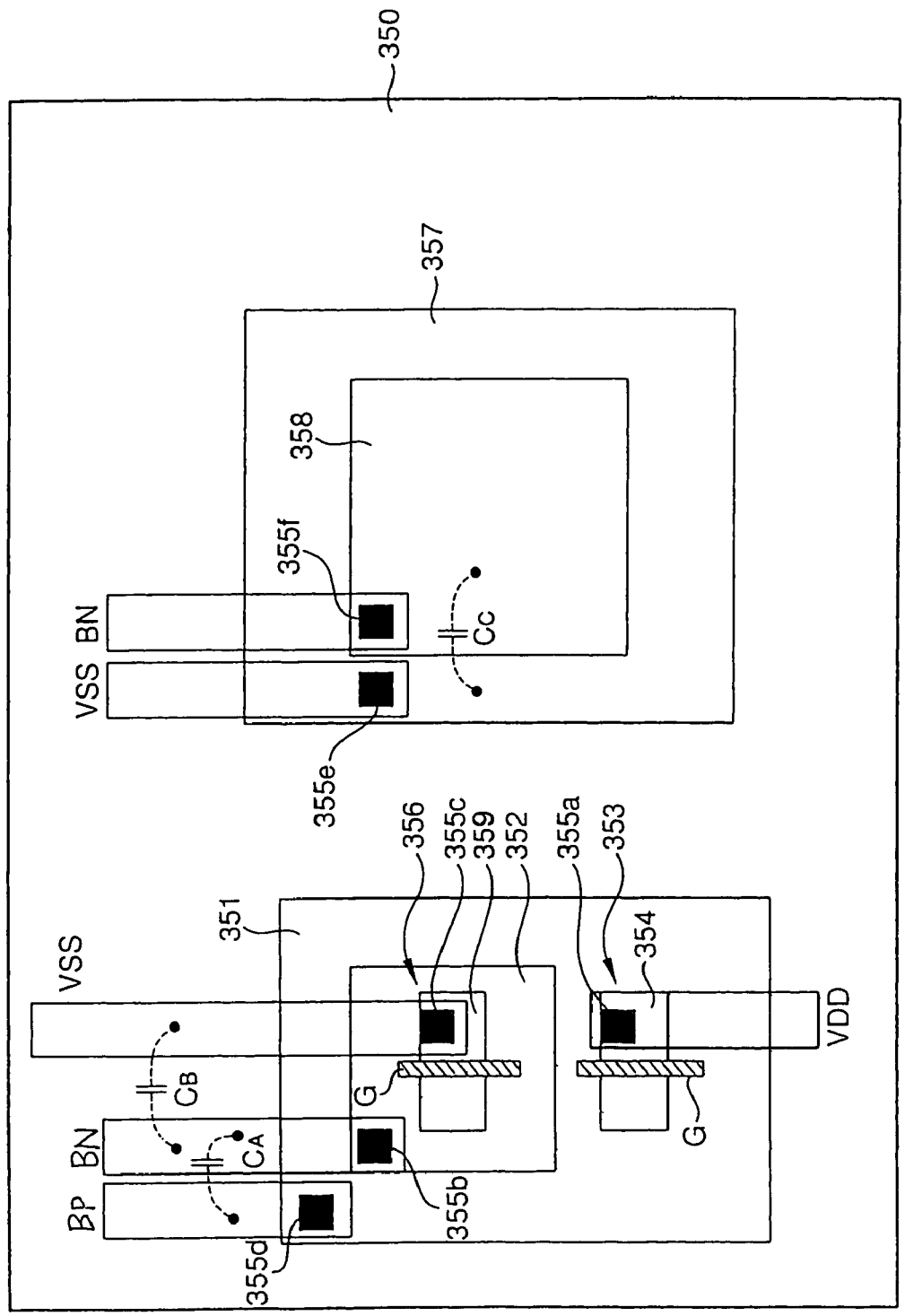
FIG. 35 is a schematic diagram showing an example of a configuration for realizing the eighteenth embodiment of the invention.

FIG. 35 is a schematic diagram showing an example of a configuration for realizing this embodiment.

In an integrated circuit main body of this embodiment, an n-well region 351 is configured on a P substrate and a p-well region 352 is configured on this n-well region 351.

A p-type MOSFET constituting the integrated circuit main body exits on this n-well region 351, and the source voltage Vdd is connected via a contact hole 355a to a source 354 of a p-type MOSFET 353.

Besides, the substrate voltage BP is connected via a contact hole 355b to the p-well region 352, and the ground potential Vss is connected via a contact hole 355c to a source 359 of an n-type MOSFET 356 provided on the p-well retion 352.

Furthermore, the substrate voltage BN is connected via a contact hole 355d to the n-well region 351. Additionally, reference character G denotes a gate of MOSFET.

A plurality of such p-type MOSFETs 353 and n-type MOSFETs 356 as aforesaid exist in the integrated circuit main body, and the individual MOSFETs also have the same configuration.

In the conventional integrated circuit, the BN-BP electric capacity CA becomes higher than the aforesaid BN-Vss electric capacity CB. The reason is that the area of a region in which the n-well region 351 makes contact with the p-well region 352 is far higher than the area of a region in which the source 354 makes contact with the p-well region 352.

In case where the electric capacity CB is thus lower, when BN is varied, this variation is difficult to transmit to Vss, so that the variation of BN and the variation of Vss are reduced to such profiles as shown in FIG. 34B.

In the example of this embodiment shown in FIG. 35, as shown on the right as seen in the figure, the ground potential Vss is connected via a contact hole 355e to an n-well region 357 that is separated from the n-well region 351 formed with MOSFETs so as not to short with BP.

Besides, a p-well region 358, provided in this n-well region 357, is connected via a contact hole 355f to BN, and the capacity component CC obtained by the connection is added to the BN-Vss electric capacity CB.

In this embodiment, the BN-Vss electric capacity is thus increased to CB+CC. Therefore, the variation produced when BN is varied is easy to transmit to Vss and as shown in FIG. 34C, BN and Vss are varied in the same phase. Thus, a potential difference Vns between BN and Vss becomes likely to be constant, so that the circuit operation of the integrated circuit main body is stabilized.

Additionally, this capacity component CC may comprise the capacity component of another portion other than the example shown in FIG. 35 such as the capacity between wirings.

Figure 36:
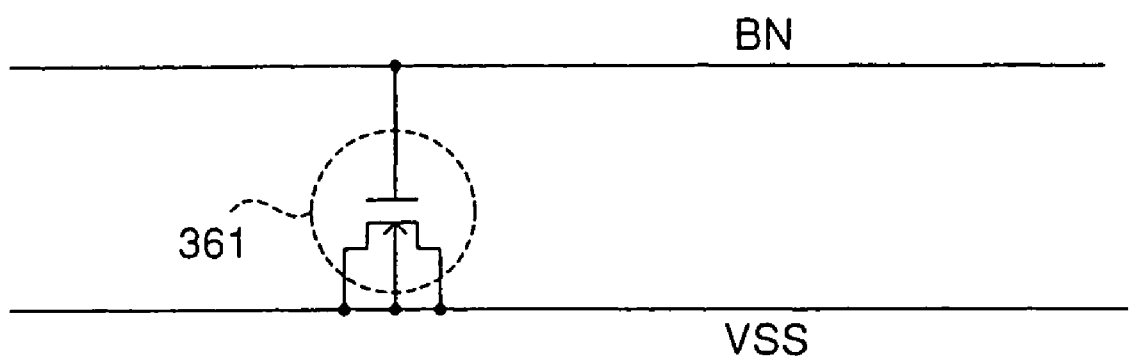
FIG. 36 is a schematic diagram showing an example in which the capacity component of FIG. 34 comprises a gate capacity.

Next, FIG. 36 shows an example in which this capacity component CC comprises a gate capacity.

As shown in FIG. 36, there is provided a MOSFET 361 that is not involved in the circuit operation of the integrated circuit main body. The gate of this MOSFET 361 is connected to BN, while the source, drain, and substrate thereof are connected to Vss.

When the gate of the MOSFET 361 is connected to the side of a substrate voltage applied to the integrated circuit main body, the capacity always becomes constant on the negative bias side.

Besides, on the positive bias side, the capacity value is slightly reduced, but there are the bipolar effect of a MOSFET substrate and a current component flowing from a substrate to a source. Therefore, the variation of BN and Vss becomes likely to have the same phase, so that the integrated circuit main body is stably operated.

Furthermore, more preferably, when the BN-Vss electric capacity CB+CC is set to be higher than the BP-BN electric capacity CA, the aforesaid integrated circuit main body is made more reliable in its stable operation.

(Nineteenth Embodiment)

The nineteenth embodiment is set as follows. A variable voltage is applied to the gate (17A), of the monitoring MOSFET 11A of the circuit generating a constant threshold value (Vth) that is the substrate voltage regulating means shown in FIG. 1, so as to provide a more gradual gradient than the temperature gradient of the threshold value (Vth) formed when a voltage applied to the aforesaid gate (17A) is set to be constant.

Conventionally, since the threshold value (Vth) of MOSFET decreases together with the temperature, when a constant voltage is applied to the gate 17A, the substrate voltage BP lowers as the temperature rises. On the contrary, in this embodiment, a variable voltage is applied to the gate 17A so as to provide a negative gradient against a rise in temperature.

Figure 37:
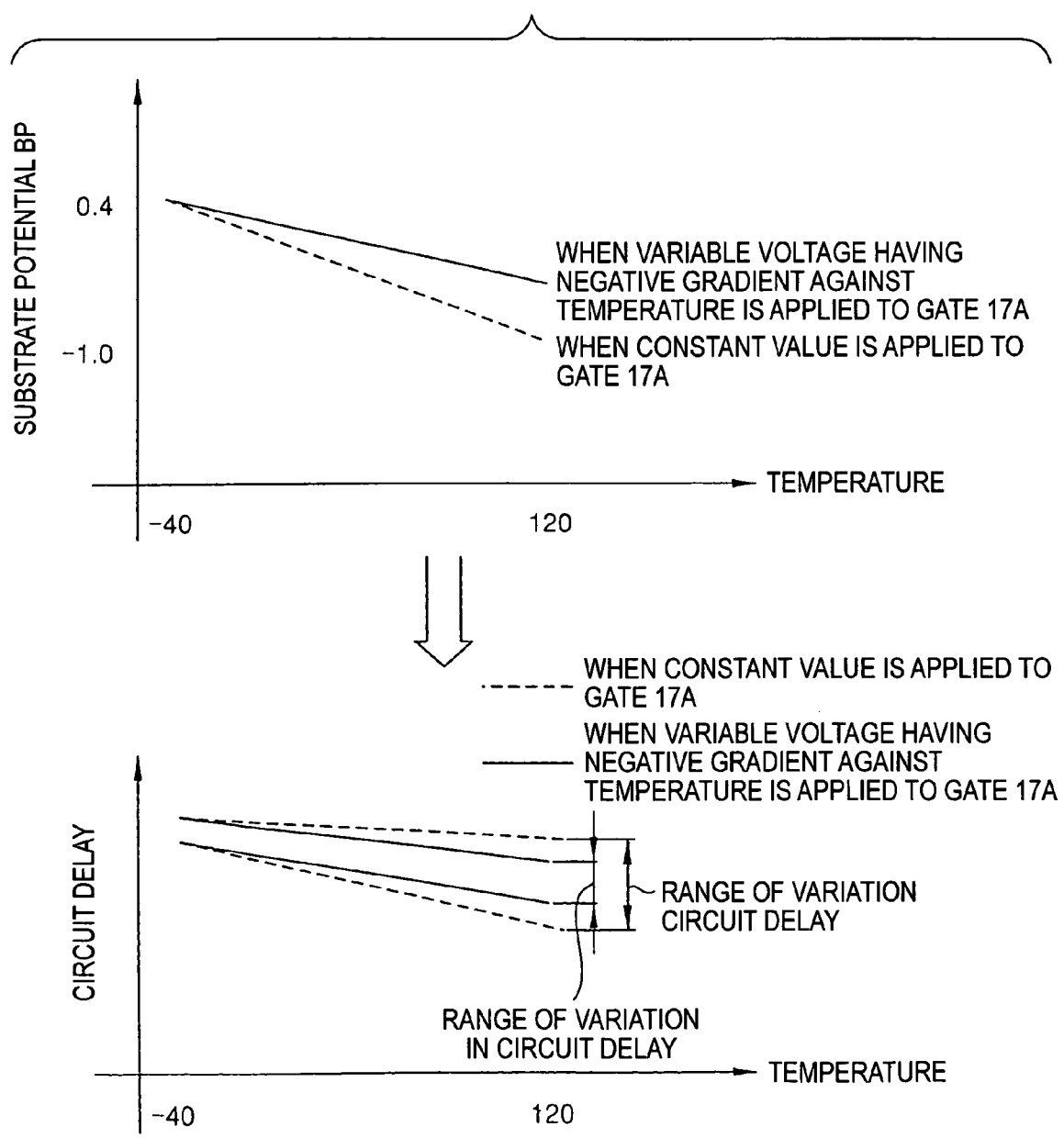
FIG. 37 is a graph showing an effect of the nineteenth embodiment of the invention.

For example, in FIG. 1, the temperature dependence of the substrate voltage BP, obtained when a constant voltage is applied to the gate 17A that is the gate of the monitoring MOSFET 11A, is reduced to an incline such as shown by the dashed line of FIG. 37A. However, when a variable voltage having a negative gradient against the temperature (the higher the temperature is, the applied voltage is reduced) is applied to the gate 17A, the temperature dependence of the substrate potential BP is reduced as shown by the solid line of FIG. 37A.

By such setting, the temperature dependence of the substrate voltage regulating means, for making regulation such that the threshold values (Vth) of individual MOSFETs within the integrated circuit main body of FIG. 1 are constant, can be made lower than when the gate 17A has a constant voltage. Thus, the aforesaid threshold values (Vth) of the individual MOSFETs can be made uniform in a wider temperature range.

A voltage application circuit for applying to the gate 17A a variable voltage having a negative gradient against the temperature need only use, for example, the band gap reference circuit.

Besides, the configuration may be made such that a variable voltage having a negative gradient is applied to the gate 17A until the temperature reaches a predetermined value and the voltage value becomes constant when the temperature reaches the predetermined value or more. For example, the configuration need only be made such that a temperature detection circuit is added and the limiter acts on the voltage when the temperature reaches a certain value or more.

In this embodiment, in the integrated circuit main body to which is adapted the circuit generating a constant threshold value (Vth), the gain of the integrated circuit main body due to a reduction in junction capacity of MOSFET can be reduced on a high temperature side, i.e., in the sate where a substrate voltage is negatively applied. Besides, variations in threshold value of individual MOSFETs within the integrated circuit main body can be suppressed even when the temperature is varied.

When variations in threshold value (Vth) are thus reduced, variations in switching rate of individual MOSFETs are reduced. Therefore, as shown in FIG. 37B, even when the temperature is varied, it is possible to prevent the phenomenon that the range of variations in circuit delay is widened.

Further, in this embodiment, relation between the temperature and the voltage in case that the substrate voltage regulating means is the circuit generating a constant threshold value (Vth), is described as aforementioned. However, in case that the substrate voltage regulating means is a GM constant circuit, the desired value of FIG. 22 can be applied. If a value of the current in 121 of FIG. 22 source is varied by the the frequency-voltage conversion circuit, needless to say, same effect as case of the circuit generating a constant threshold value (Vth) can be gained.

(Twentieth Embodiment)

The twentieth embodiment is configured as follows. The output of the limiting means is connected to a voltage supply circuit for supplying a source voltage to the integrated circuit main body. The aforesaid source voltage is raised when a substrate voltage is the upper limit voltage or more, while the aforesaid source voltage is reduced when the substrate voltage is the lower limit voltage or less.

Figure 38:
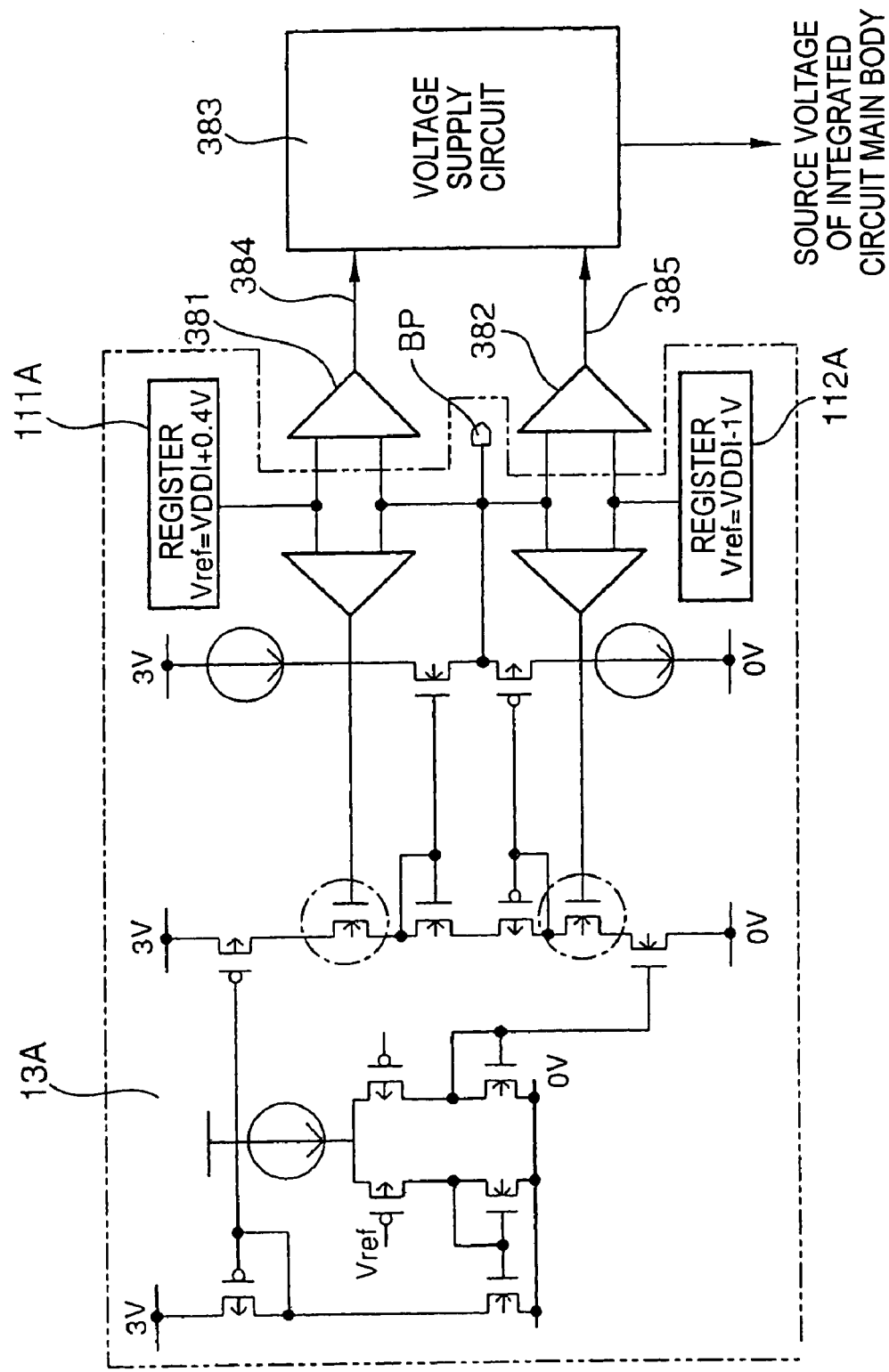
FIG. 38 is a circuit diagram showing an example of the configuration of the twentieth embodiment of the invention.

For example, in FIG. 38, the configuration is made such that an upper limit comparison signal 384 and an lower limit comparison signal 385 are inputted from the comparator section 13A including the limiter 19A shown in FIG. 2 to a voltage supply circuit 383 for supplying a source voltage to the integrated circuit main body. The upper limit comparison signal 384 is obtained by comparing the upper limit voltage value of the register 111A and the value of the substrate potential BP through a comparator 381. The lower limit comparison signal 385 is obtained by comparing the lower limit voltage value of the register 112A and the value of the substrate potential BP through a comparator 382.

Additionally, the comparators 381, 382 may use the comparator in the limiter 19A.

In this embodiment, with the aforesaid configuration, if the substrate BP reaches the upper limit value or more, the upper limit comparison signal 384 is transmitted to the voltage supply circuit 383. Thereby, the voltage supply circuit 383 raises a source voltage to be outputted.

At this time, the step of raising the source voltage to be outputted may be either discrete or sequential. When the step is discrete, dispersion power on the order of about 10 mV is desirable. When the upper limit comparison signal 384 has not been transmitted, the rise in the source voltage is completed.

Besides, the voltage supply circuit 383 itself also has set therein a source voltage upper limit value for not allowing the source voltage to rise to a predetermined voltage value or more. Even if this source voltage upper limit value is reached, when the upper limit comparison signal 384 still continues to be transmitted, the source voltage to be outputted is fixed to the source voltage upper limit value.

On the contrary, if the substrate voltage BP reaches the lower limit value or more, the limit comparison signal 385 is transmitted to the voltage supply circuit 383. Thereby, the voltage supply circuit 383 lowers the source voltage to be outputted.

Besides, the voltage supply circuit 383 itself also has set therein a source voltage lower limit value for not allowing a source voltage to lower to a predetermined voltage value or more. Even if this source voltage lower limit value is reached, when the lower limit comparison signal 385 still continues to be transmitted, the source voltage to be outputted is fixed to the source voltage lower limit value. Additionally, the source voltage lower limit value may not be set, or only any one of the source voltage upper and lower limit values may be set.

As aforesaid, in this embodiment, the source voltage to be supplied to the integrated circuit main body is made variable. Thereby, it is possible to further secure the improvement in the threshold value characteristics, saturation current characteristics, and gm characteristics of MOSFET by the substrate voltage regulating means.

Additionally, needless to say, the comparator section 13B including the limiter 19B, shown in FIG. 6, that is the comparator having the substrate potential BP may be applied to FIG. 38.

The invention is not limited to the foregoing embodiments but may be modified without departing from the spirit and scope thereof.

As mentioned hereinabove, the semiconductor integrated circuit apparatus according to the first aspect of the invention comprises: an integrated circuit main body including a plurality of MOSFETs on a semiconductor substrate; monitor means for monitoring at least one of the drain currents of the plurality of MOSFETs; and substrate voltage regulating means for controlling the substrate voltage of the semiconductor substrate so as to keep constant the drain current. With this configuration, it is possible to reduce the temperature dependence of a drain current in case there occurred a variation in the temperature of the semiconductor integrated circuit apparatus and reduce variations in the characteristics of the semiconductor integrated circuit apparatus created by a fabrication process (process variation dependence). This enhances the stable operation of the semiconductor integrated circuit apparatus.

According to the second aspect of the invention, when circuits and devices having different characteristics are present within the semiconductor integrated circuit, or the like, the plurality of substrate voltage regulating means can be regulated to a substrate voltage suitable for the individual circuits and devices.

According to the third aspect of the invention, it is possible to realize stable circuit operation and furthermore to prevent reversion of temperature dependence of delay time under a low voltage. Thus, it is possible to reduce a leakage current under high temperature. Besides, it is possible to increase circuit speed and furthermore to prevent reversion of temperature dependence of delay time under a low voltage. Thus, it is possible to reduce a leakage current under high temperature.

According to the fourth aspect of the invention, it is possible to apply to each region a substrate voltage for obtaining an appropriate threshold value and saturation current when the device characteristics of MOSFETs within the semiconductor integrated circuit have local dependence. Thus, it is possible to reduce variations in circuit characteristics within the semiconductor integrated circuit.

According to the fifth aspect of the invention, it is possible to apply an appropriate substrate voltage, without deteriorating a circuit noise margin, to each of MOSFET groups different in device characteristics for a substrate voltage.

According to the sixth aspect of the invention, the drain current is a drain current for an arbitrary gate voltage value in a subthreshold region or a saturated region. With this configuration, it is possible to reduce the temperature dependence of a drain current in case there occurred a variation in the temperature of semiconductor integrated circuit apparatus and reduce variations in the characteristics of the individual semiconductor integrated circuit apparatus created by a fabrication process (process variation dependence). This enhances the stable operation of the semiconductor integrated circuit apparatus.

According to the seventh aspect of the invention, the gm of the transistor is kept constant by the substrate voltage regulating means. It is thus possible to provide a circuit generating gm in the neighborhood of a predetermined voltage value thus keeping constant the gm of the transistor so that the temperature dependence and process variation dependence of the semiconductor integrated circuit apparatus will be eliminated.

According to the eighth aspect of the invention, the monitor means comprises a constant current source and a monitoring MOSFET formed on the same substrate as the plurality of MOSFETs, the substrate voltage regulating means comprises comparison means for comparing the source potential of the monitoring MOSFET with a predetermined reference potential with the drain terminal of the monitoring MOSFET and the drain terminals of the plurality of MOSFETs connected to the ground potential, and the substrate voltage regulating means feeds back the output voltage output based on the comparison result by the comparison means to the substrate voltage of the monitoring MOSFET. With this configuration, it is possible to keep constant the threshold value (Vth) or drain current (Ids) of each of the plurality of MOSFETs arranged on the integrated circuit main body. In this way, the threshold value (Vth) or drain current (Ids) of each of the MOSFETs is kept constant so that the drain current of the plurality of MOSFETs on the integrated circuit main body is regulated to an optimum value.

This regulation reduces the temperature dependence of a drain current in case there occurred a variation in the temperature of the semiconductor integrated circuit apparatus and reduces variations in the characteristics of the semiconductor integrated circuit apparatus created by a fabrication process (process variation dependence).

According to the ninth aspect of the invention, the reference potential is a supply potential to the integrated circuit main body. It is thus possible to keep constant the threshold value (Vth) or drain current (Ids) of each of the plurality of MOSFETs arranged on the integrated circuit main body. In this way, the threshold value (Vth) or drain current (Ids) of each of the MOSFETs is kept constant so that the drain current of the plurality of MOSFETs on the integrated circuit main body is regulated to an optimum value.

This regulation reduces the temperature dependence of a drain current in case there occurred a variation in the temperature of the semiconductor integrated circuit apparatus and reduces variations in the characteristics of individual semiconductor integrated circuit apparatus created by a fabrication process (process variation dependence).

According to the tenth aspect of the invention, the substrate voltage regulating means outputs a voltage value obtained by providing, by way of limiting means, the upper and lower limits of the output voltage output based on the comparison result of the comparison means. It is thus possible to prevent a so-called "deadlock", a phenomenon where an appropriate feedback is not applied to the substrate voltage of the monitoring MOSFET thus stabilizing the substrate voltage regulating means in an abnormal state.

According to the eleventh aspect of the invention, the monitoring MOSFET is a p-type monitoring MOSFET, the upper limit of the output voltage value of the substrate voltage regulating means is set to a voltage equal to or above the supply potential of the integrated circuit main body and within a range where the GIDL effect does not occur in the p-type monitoring MOSFET, and the lower limit of the output voltage value of the substrate voltage regulating means is set to a voltage below the supply potential of the integrated circuit main body and within a range where the p-type monitoring MOSFET does not show the bipolar characteristics. It is thus possible to prevent the GIDL effect where the transistor characteristics are opposite to the regular characteristics as well as the bipolar characteristics where a forward current flows between the substrate and the drain thus reducing the drain-source current, in case a large amount of substrate voltage is applied.

According to the twelfth aspect of the invention, the monitoring MOSFET is an n-type monitoring MOSFET, the upper limit of the output voltage value of the substrate voltage regulating means is set to a voltage equal to or above the ground potential of the integrated circuit main body and within a range where the n-type monitoring MOSFET does not show the bipolar characteristics, and the lower limit of the output voltage value of the substrate voltage regulating means is set to a voltage below the ground potential of the integrated circuit main body and within a range where the GIDL effect does not occur in the n-type monitoring MOSFET. It is thus possible to prevent the GIDL effect where the transistor characteristics are opposite to the regular characteristics as well as the bipolar characteristics where a forward current flows between the substrate and the drain thus reducing the drain-source current, in case a large amount of substrate voltage is applied.

According to the thirteenth aspect of the invention, the source voltage supplied to the integrated circuit main body can be made variable. Thus, it is possible to further secure the improvement in the threshold value characteristics, saturation current characteristics, and gm characteristics of MOSFET by the substrate voltage regulating means.

According to the fourteenth aspect of the invention, the leakage component of a parasitic bipolar or GIDL effect can be cancelled. Thus, it is possible to apply a substrate voltage capable of securing the original threshold value and saturation current of the MOSFET of the monitor means.

According to the fifteenth aspect of the invention, it is possible to eliminate the leakage current component caused by the parasitic bipolar effect between the MOSFET of the monitor means and the leakage current canceling MOSFET. Thus, it is possible to apply a substrate voltage at which the original threshold value and saturation current of the MOSFET of the monitor means can be secured.

According to the sixteenth aspect of the invention, the gain of the integrated circuit main body due to a reduction in junction capacity of MOSFET can be made lower than when the gate voltage of the monitoring MOSFET of the substrate voltage regulating means is constant. Besides, variations in threshold value of individual MOSFETs within the integrated circuit main body can be suppressed even when the temperature is changed.

According to the seventeenth aspect of the invention, the threshold value regulated by a circuit generating a constant threshold value (Vth) can be set to be higher at the time of a clock low frequency than at the time of a high frequency for the integrated circuit main body. Thus, MOSFET device leakage is reduced during the use at a low frequency.

According to the eighteenth aspect of the invention, voltage variation between the source and substrate of the n-type MOSFET is reduced, thus enabling high-precision application of a substrate voltage.

According to the nineteenth aspect of the invention, voltage variation between the source and substrate of the n-type MOSFET is reduced, thus enabling high-precision application of a substrate voltage.

According to the twentieth aspect of the invention, voltage variation between the source and substrate of the n-type MOSFET is reduced, thus enabling higher-precision application of a substrate voltage.

According to the twenty-first aspect of the invention, the integrated circuit main body comprises a feedback buffer and the substrate voltage of the MOSFET of the feedback buffer is set by the substrate voltage regulating means. With this configuration, stable operation of the semiconductor integrated circuit apparatus is allowed even when the feedback buffer is driven on a low voltage. Moreover, the leakage current is reduced.

According to the twenty-second aspect of the invention, the integrated circuit main body comprises a memory circuit and the substrate voltage of the MOSFET of the memory circuit is set by the substrate voltage regulating means. It is thus possible to control the source-substrate voltage value of the MOSFET in the memory circuit so that the drain current for an arbitrary gate voltage value in a subthreshold region will be free from temperature dependence and process variation dependence, thereby preventing corruption of memory data by a subthreshold leakage.

According to the twenty-third aspect of the invention, the integrated circuit main body comprises an SRAM and the substrate voltage of the MOSFET of the SRAM is set by the substrate voltage regulating means. It is thus possible to reduce the temperature dependence of the noise margin at low voltages. This allows operation of the semiconductor integrated circuit apparatus at a low voltage thereby reducing the power consumption of the SRAM.

According to the twenty-fourth aspect of the invention, the integrated circuit main body comprises a circuit of the timing borrow system and the substrate voltage of the MOSFET of the circuit of the timing borrow system is set by the substrate voltage regulating means. It is thus possible to reduce the temperature dependence and process variation dependence of a circuit of the timing borrow system, since the static noise margin of the circuit of the timing borrow system is determined by the threshold value of the MOSFET. It is also possible to reduce the leakage current in the circuit of the timing borrow system.

According to the twenty-fifth aspect of the invention, the integrated circuit main body comprises a differential operational amplifier and the substrate voltage of the MOSFET of the differential operational amplifier is set by the substrate voltage regulating means. It is thus possible to reduce the temperature dependence and process variation dependence of the lower limit voltage in the output range of the differential operational amplifier.

According to the twenty-sixth aspect of the invention, the integrated circuit main body comprises a voltage-controlled oscillator and the substrate voltage of the MOSFET of the voltage-controlled oscillator is set by the substrate voltage regulating means. It is thus possible to reduce the temperature dependence and process variation dependence of the frequency response with respect to the input voltage of the voltage-controlled oscillator.

According to the twenty-seventh aspect of the invention, the integrated circuit main body comprises a CMOS logic circuit and the substrate voltage of the MOSFET of the CMOS logic circuit is set by the substrate voltage regulating means.

It is thus possible to reduce the temperature dependence and process variation dependence of a delay in the CMOS logic circuit.

According to the twenty-eighth aspect of the invention, the integrated circuit main body comprises a current-controlled oscillator and the substrate voltage of the MOSFET of the current-controlled oscillator is set by the substrate voltage regulating means. It is thus possible to keep constant the delay value of the current-controlled oscillator and reduce the temperature dependence and process variation dependence of the oscillating frequency.

What is claimed is:

1. A semiconductor integrated circuit apparatus comprising:
    an integrated circuit main body including a plurality of MOSFETs on a semiconductor substrate;
    monitor means for monitoring at least one of the drain currents of said plurality of MOSFETs; and
    a plurality of substrate voltage regulating means for regulating the substrate voltage of said semiconductor substrate so that said drain currents are constant,
    wherein said monitor means comprises a constant current source and a monitoring MOSFET formed on the same substrate as said plurality of MOSFETs,
    said substrate voltage regulating means comprises comparison means for comparing the source potential of said monitoring MOSFET with a predetermined reference potential with the drain terminal of said monitoring MOSFET and the drain terminals of said plurality of MOSFETs connected to a predetermined potential, and said substrate voltage regulating means feeds back the output voltage output based on the comparison result by said comparison means to the substrate voltage of said monitoring MOSFET.

2. The semiconductor integrated circuit apparatus according to claim 1,
wherein said constant current source and said monitoring MOSFET are formed on the same substrate as said plurality of MOSFETs.

3. The semiconductor integrated circuit apparatus according to claim 2, wherein said reference potential is a supply potential to the integrated circuit main body.

4. The semiconductor integrated circuit apparatus according to claim 2, wherein said substrate voltage regulating means outputs a voltage value obtained by providing, by way of limiting means, the upper and lower limits of the output voltage output based on the comparison result of said comparison means.

5. The semiconductor integrated circuit apparatus according to claim 4, wherein said monitoring MOSFET is a p-type monitoring MOSFET, the upper limit of the output voltage value of said substrate voltage regulating means is set to a voltage equal to or above the supply potential of said integrated circuit main body and within a range where the GIDL effect does not occur in said p-type monitoring MOSFET, and the lower limit of the output voltage value of said substrate voltage regulating means is set to a voltage below the supply potential of said integrated circuit main body and within a range where said p-type monitoring MOSFET does not show the bipolar characteristics.

6. The semiconductor integrated circuit apparatus according to claim 4, wherein said monitoring MOSFET is an n-type monitoring MOSFET, the upper limit of the output voltage value of said substrate voltage regulating means is set to a voltage equal to or above the ground potential of said integrated circuit main body and within a range where said n-type monitoring MOSFET does not show the bipolar characteristics, and the lower limit of the output voltage value of said substrate voltage regulating means is set to a voltage below the ground potential of said integrated circuit main body and within a range where the GIDL effect does not occur in said n-type monitoring MOSFET.

7. The semiconductor integrated circuit apparatus according to claim 4, wherein the output of said limiting means is connected to voltage supply means for supplying a source voltage to said integrated circuit main body, and
said source voltage is raised when a substrate voltage is an upper limit voltage or more and said source voltage is lowered when the substrate voltage is a lower limit voltage or less.

8. The semiconductor integrated circuit apparatus according to claim 2, wherein said constant current source has a leakage current canceling MOSFET substantially identical in transistor size to said monitoring MOSFET,
when said leakage current canceling MOSFET is an n-type MOSFET, a source-drain current provided when the gate and drain of the n-type MOSFET have substantially the same potential is added, and
when said leakage current canceling MOSFET is a p-type MOSFET, a source-drain current provided when the gate and drain of the p-type MOSFET have substantially the same potential is added.

9. The semiconductor integrated circuit apparatus according to claim 8, wherein a well region that provides the substrate of said leakage current canceling MOSFET is separated from a well region that provides the substrate of said monitoring MOSFET.

10. The semiconductor integrated circuit apparatus according to claim 2, further comprising substrate voltage regulating means for regulating a substrate potential so that the individual threshold values of the plurality of MOSFETs become uniform, and
a voltage is applied to the gate of said monitoring MOSFET as the voltage value is changed in accordance with temperature so as to provide a more gradual gradient than the temperature gradient of said threshold values formed when a voltage applied to said gate is set to be constant.

11. The semiconductor integrated circuit apparatus according to claim 2, further comprising:
frequency-voltage conversion means, wherein a signal originating from a clock supplied to the integrated circuit main body is inputted to said frequency-voltage conversion means,
the frequency of said signal is converted into a voltage by said frequency-voltage conversion means, and
said voltage is applied to the gate of a MOSFET constituting said monitor means.

12. The semiconductor integrated circuit apparatus according to claim 2, wherein said comparison means comprises: an operational amplifier to which the source potential of said monitoring MOSFET and the predetermined reference potential are input; and a push-pull circuit for outputting a voltage as an output voltage that is based on the comparison results of the source potential of said monitoring MOSFET and the predetermined reference potential in accordance with the output of said operational amplifier.

13. The semiconductor integrated circuit apparatus according to claim 2, wherein said comparison means comprises an operational transconductance amplifier (OTA).

14. The semiconductor integrated circuit apparatus according to claim 2, wherein said predetermined potential is a ground potential.

15. The semiconductor integrated circuit apparatus according to claim 14, wherein said predetermined reference potential is a supply potential to the integrated circuit main body.

16. The semiconductor integrated circuit apparatus according to claim 2, wherein said predetermined potential is a supply potential to the integrated circuit main body.

17. The semiconductor integrated circuit apparatus according to claim 16, wherein said predetermined reference potential is a ground potential.

* * * * *